(12) United States Patent
Ogawa et al.

(10) Patent No.: US 9,536,033 B2
(45) Date of Patent: Jan. 3, 2017

(54) BOARD DESIGN METHOD AND BOARD DESIGN DEVICE

(71) Applicant: NEC Corporation, Minato-ku, Tokyo (JP)

(72) Inventors: Masashi Ogawa, Tokyo (JP); Manabu Kusumoto, Tokyo (JP); Hisashi Ishida, Tokyo (JP); Ken Morishita, Tokyo (JP); Masashi Kawakami, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/429,814

(22) PCT Filed: Sep. 18, 2013

(86) PCT No.: PCT/JP2013/005500
§ 371 (c)(1),
(2) Date: Mar. 20, 2015

(87) PCT Pub. No.: WO2014/050023
PCT Pub. Date: Apr. 3, 2014

(65) Prior Publication Data
US 2015/0234972 A1 Aug. 20, 2015

(30) Foreign Application Priority Data

Sep. 27, 2012 (JP) ................................. 2012-214179

(51) Int. Cl.
*G06F 17/50* (2006.01)
*H05K 1/02* (2006.01)

(52) U.S. Cl.
CPC ......... *G06F 17/5077* (2013.01); *H05K 1/0216* (2013.01)

(58) Field of Classification Search
USPC ........................................................ 716/137
See application file for complete search history.

(56) References Cited

U.S. PATENT DOCUMENTS

2004/0073880 A1* 4/2004 Yoshida .............. G06F 17/5068
716/113

2008/0230258 A1* 9/2008 Shen .................... H05K 1/0218
174/251

(Continued)

FOREIGN PATENT DOCUMENTS

JP 07-302278 A 11/1995
JP 11-161690 A 6/1999

(Continued)

OTHER PUBLICATIONS

International Search Report for PCT Application No. PCT/JP2013/005500, mailed on Dec. 10, 2013.
Hwan-Woo Shim et al, "Model for Estimating Radiated Emissions From a Printed Circuit Board With Attached Cables Due to Voltage-Driven Sources," IEEE Transactions on Electromagnetic Compatibility, Nov. 2005 , p. 899-907, vol. 47, No. 4.

(Continued)

*Primary Examiner* — Mohammed Alam
(74) *Attorney, Agent, or Firm* — Sughrue Mion, PLLC

(57) ABSTRACT

Provided are an EMI characteristic derivation unit which derives an EMI characteristic radiated from a cable based on design information of a circuit board connected with the cable; a determination standard database which stores an EMI tolerance condition which is a tolerance condition for the EMI characteristic; an EMI condition determination unit which determines whether the EMI characteristic satisfies the EMI tolerance condition; an improvement effect database which stores a modification guideline to modify a configuration of the circuit board necessary to satisfy the EMI tolerance condition when the EMI characteristic does not satisfy the EMI tolerance condition and an improvement effect corresponding to the modification guideline; a restriction item database which stores a restriction item applied when the configuration of the board is modified; and a configuration modification unit which performs the configuration modification of the board in accordance with the modification guideline and the restriction item.

20 Claims, 59 Drawing Sheets

(56) References Cited

U.S. PATENT DOCUMENTS

| | | | |
|---|---|---|---|
| 2009/0213558 A1* | 8/2009 | Osaka | H05K 3/0005 |
| | | | 361/748 |
| 2010/0006987 A1* | 1/2010 | Murugan | H01L 23/552 |
| | | | 257/659 |
| 2010/0181101 A1* | 7/2010 | Han | H05K 1/0216 |
| | | | 174/260 |
| 2014/0181770 A1* | 6/2014 | Ogawa | G06F 17/5068 |
| | | | 716/112 |

FOREIGN PATENT DOCUMENTS

| | | |
|---|---|---|
| JP | 2001-318961 A | 11/2001 |
| JP | 2009-123132 A | 6/2009 |
| JP | 2009-199338 A | 9/2009 |
| JP | 2010-287740 A | 12/2010 |

OTHER PUBLICATIONS

Shaowei Deng et al, "Estimating Maximum Radiated Emissions From Printed Circuit Boards With an Attached Cable," IEEE Transactions on Electromagnetic Compatibility, Feb. 2008, p. 215-218, vol. 50, No. 1.

Hwan W et al, "Derivation of a Closed-Form Approximate Expression for the Self-Capacitance of a Printed Circuit Board Trace," IEEE Transactions on Electromagnetic Compatibility, Nov. 2005, p. 1004-1007,vol. 47, No. 4.

English Translation of write opinion for PCT Application No. PCT/JP2013/005500.

* cited by examiner

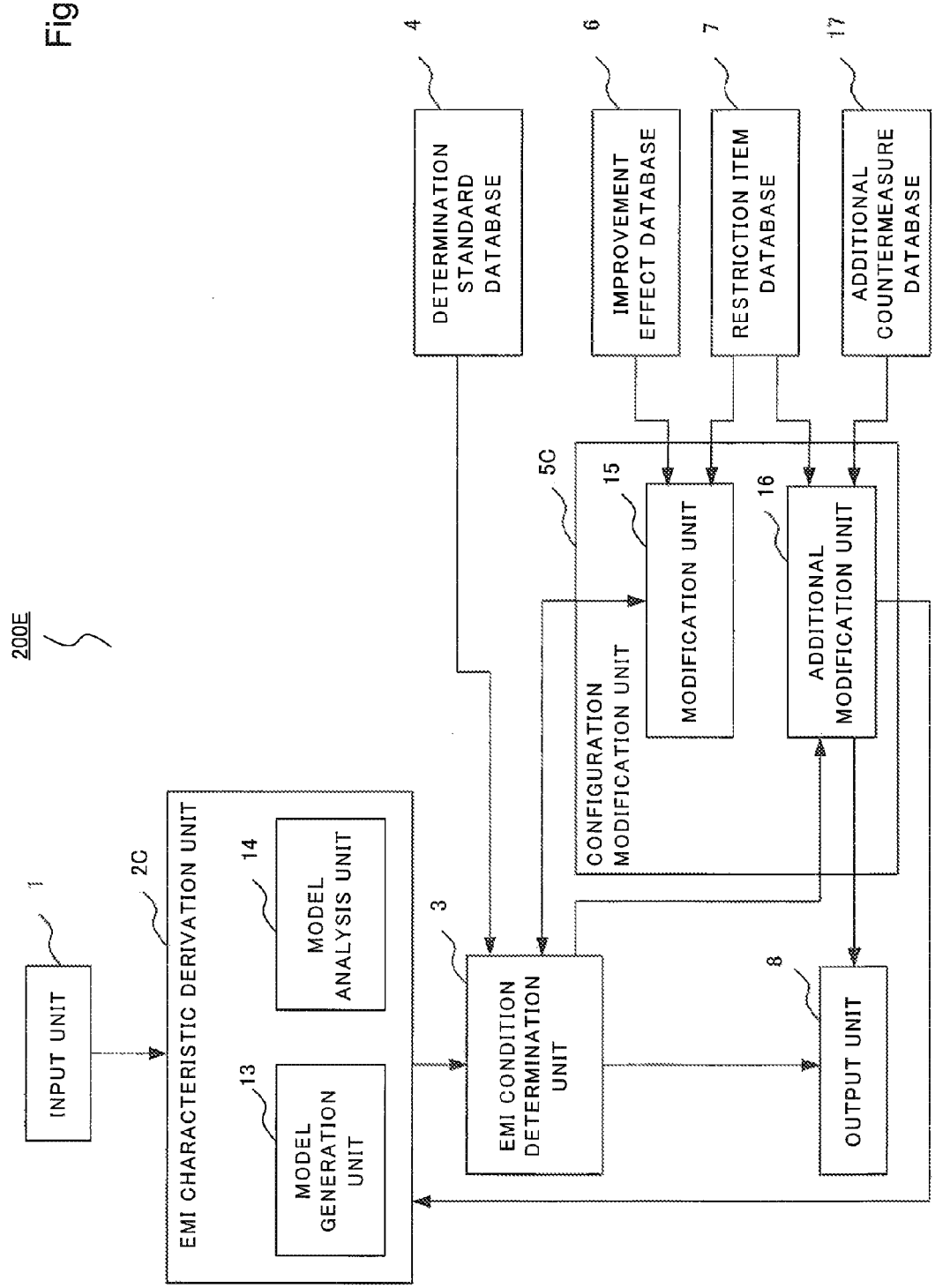

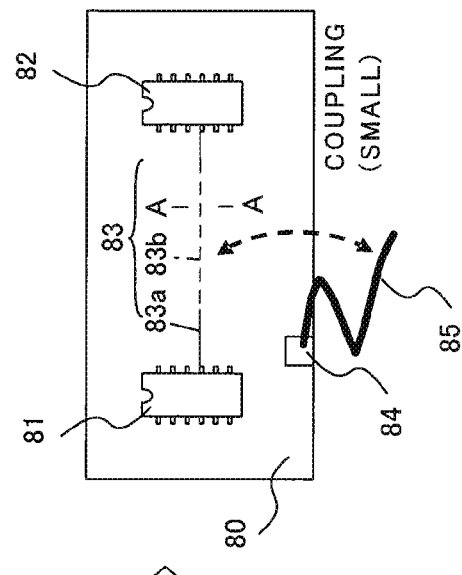
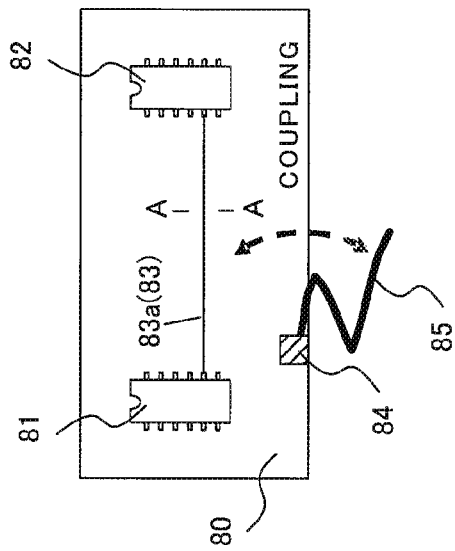
Fig.23A

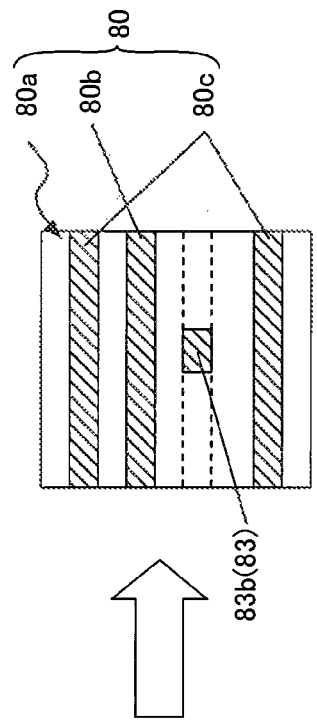
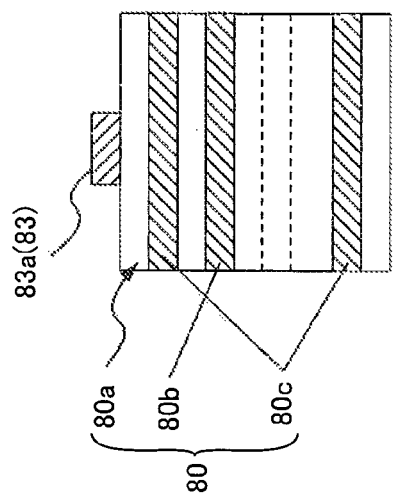
Fig. 23B

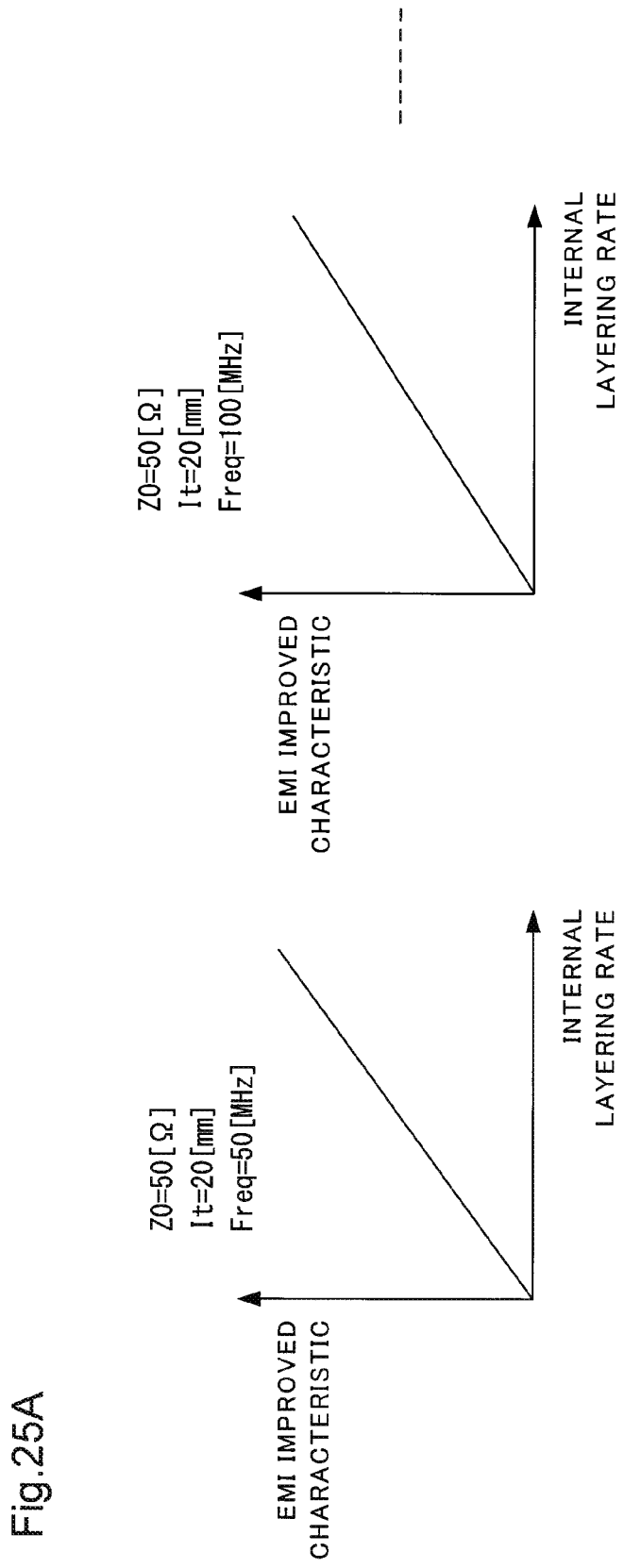

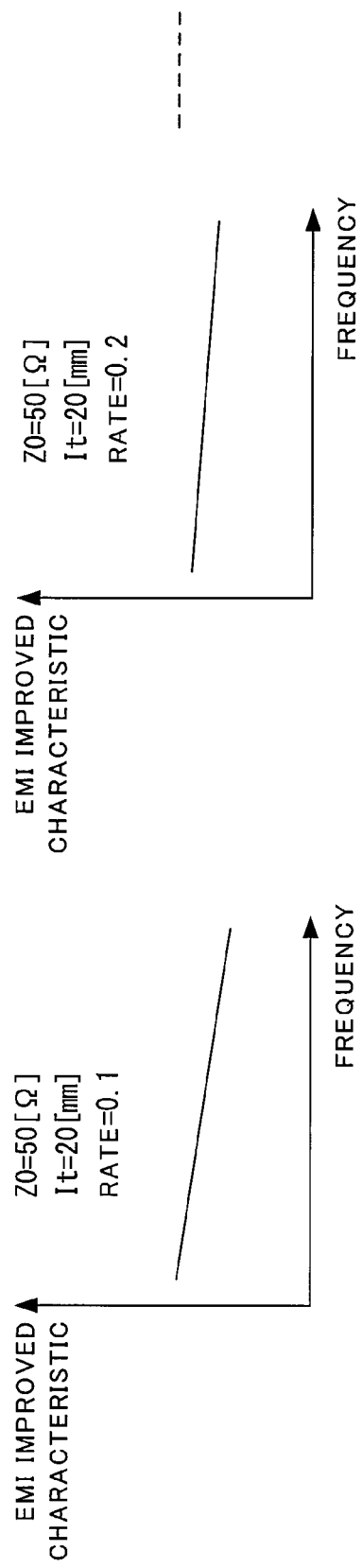

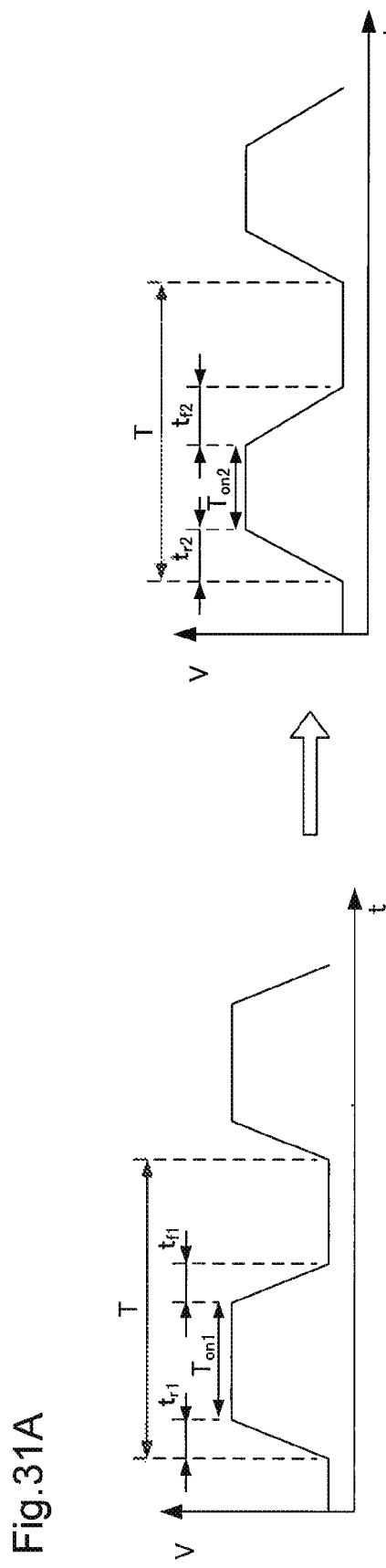

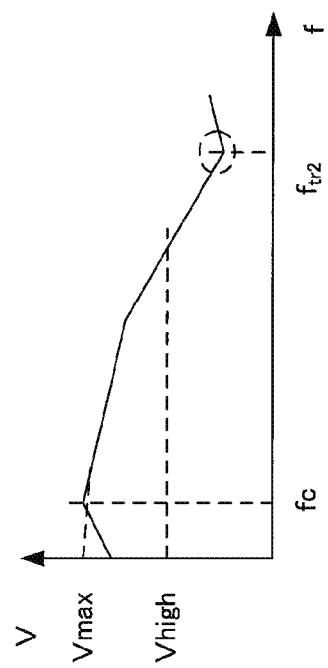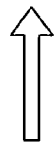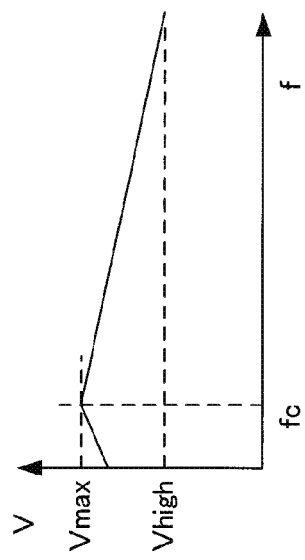

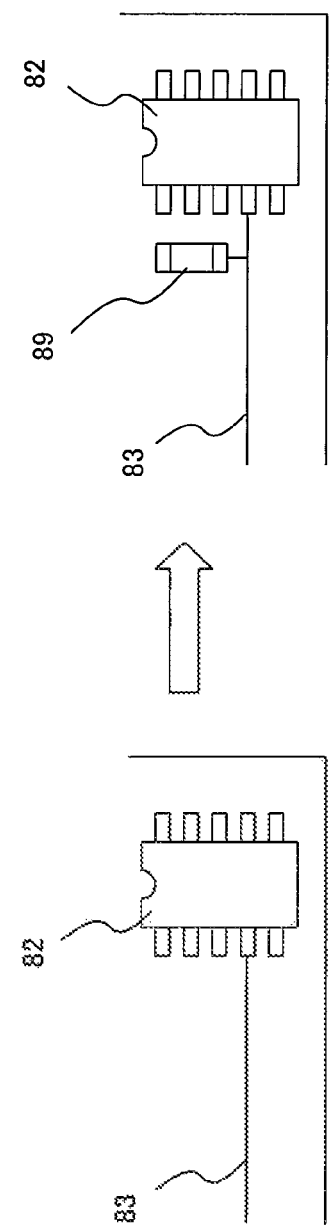

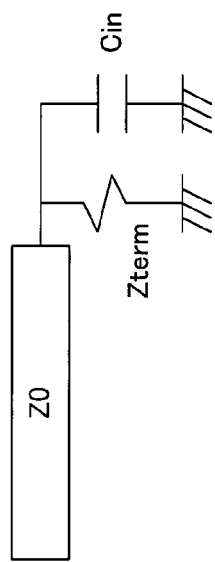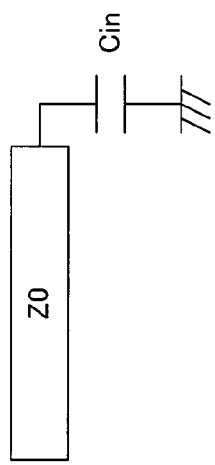
Fig.33B

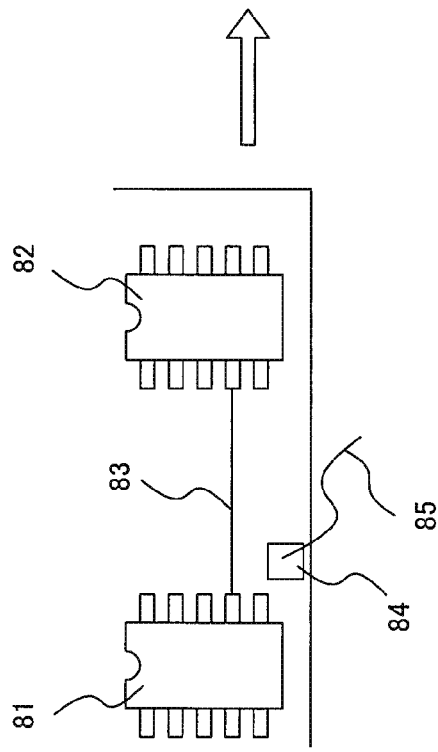
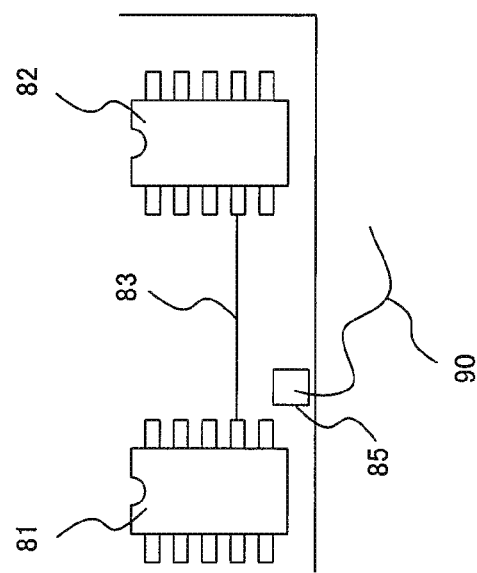
Fig.35A

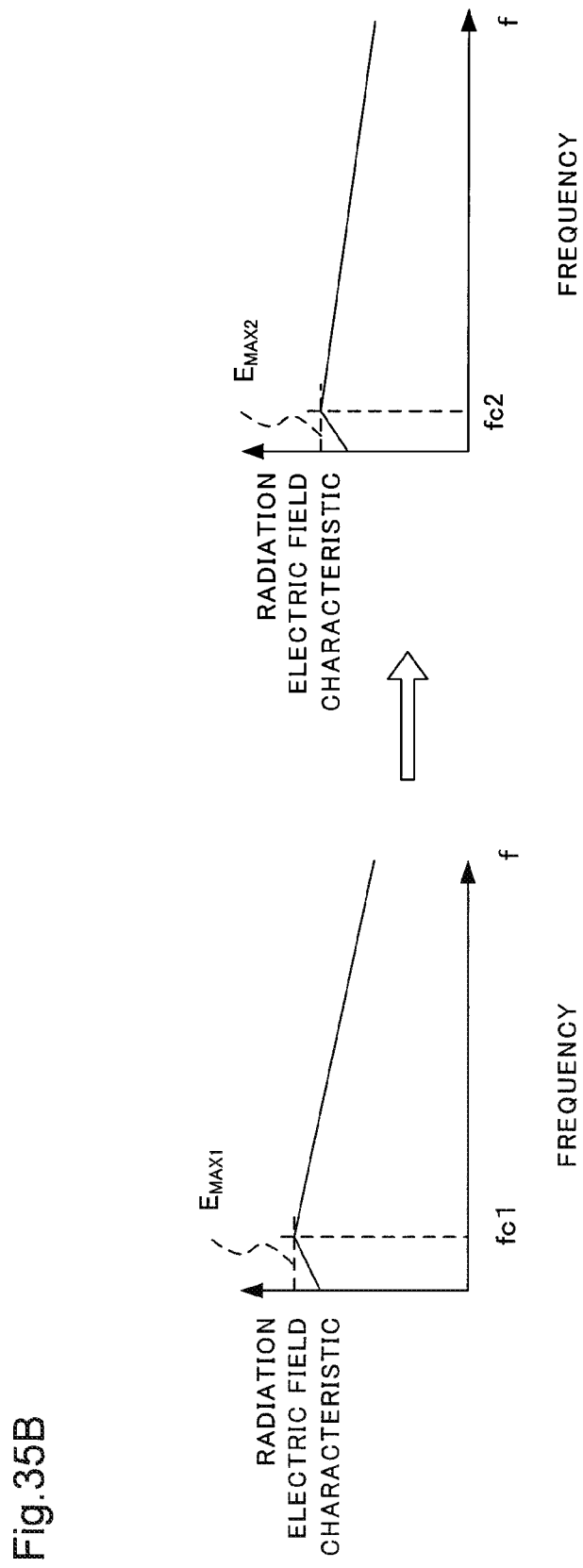

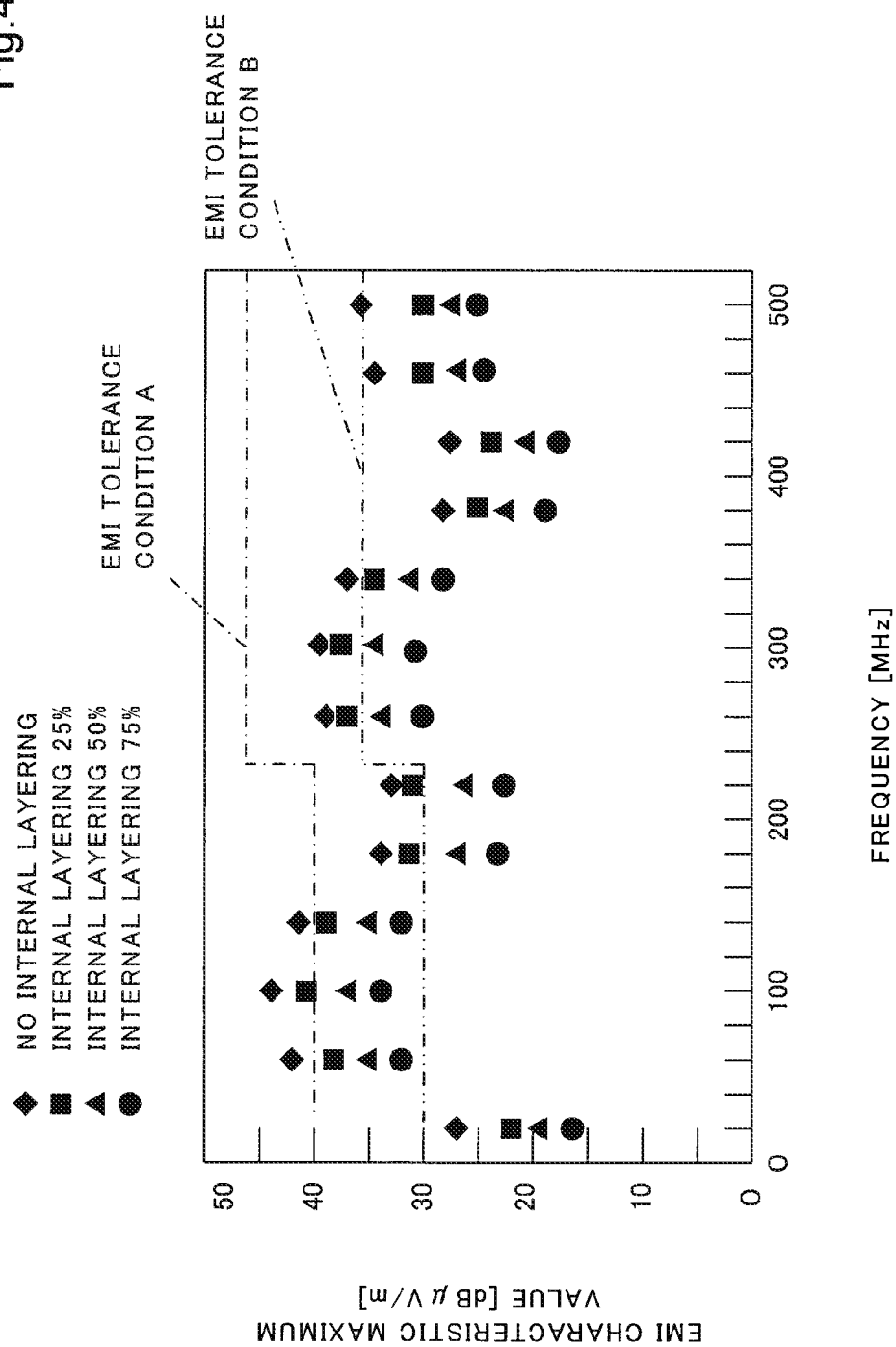

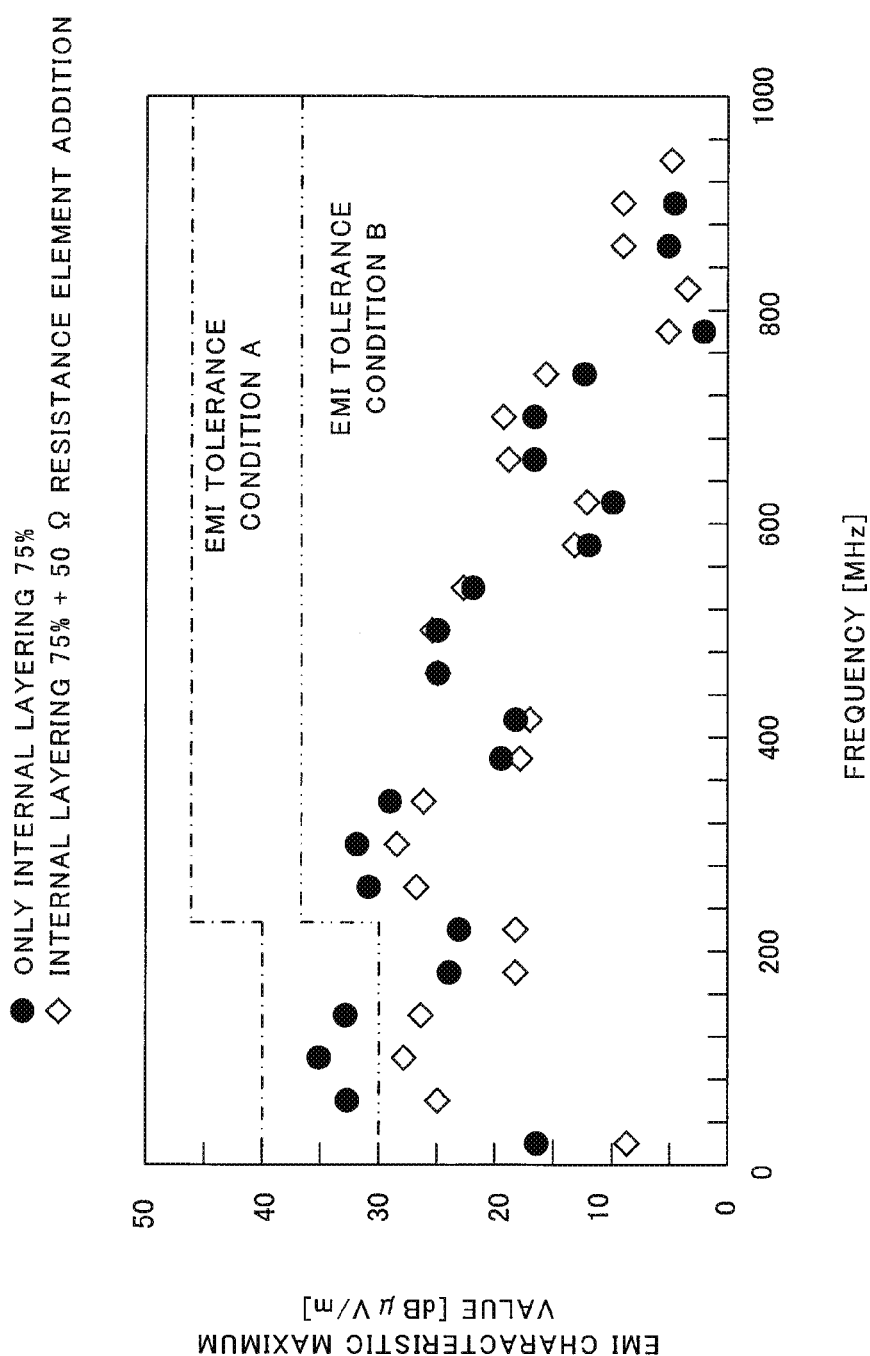

BOARD DESIGN METHOD AND BOARD DESIGN DEVICE

This application is a National Stage Entry of PCT/JP2013/005500 filed on Sep. 18, 2013, which claims priority from Japanese Patent Application 2012-214179 filed on Sep. 27, 2012, the contents of all of which are incorporated herein by reference, in their entirety.

TECHNICAL FIELD

The present invention relates to a board design method and a board design device.

BACKGROUND ART

In a circuit board (hereinafter, described also as a "PCB"), a cable and a semiconductor integrated circuit (hereinafter, described also as an "LSI") are mounted. It is desirable to design such a circuit board so as to have a low level of electromagnetic wave radiation (hereinafter, described also as "EMI" or "unnecessary electromagnetic wave radiation") radiated from the circuit board and operate stably. For such a desire, a circuit board is configured and a layout is designed so as to allow an EMI amount generated from the circuit board to be at a low level.

The main cause of EMI is electromagnetic coupling between current flowing through a wiring of a circuit board and a cable connected to the circuit board. Such electromagnetic coupling causes common-mode current to flow through the cable and as a result, the cable acts as an antenna, resulting in occurrence of unnecessary electromagnetic wave radiation. Therefore, when current flowing through the wiring increases and electromagnetic coupling increases due to an increase in circuit operation speed and the like, the radiation amount of unnecessary electromagnetic waves also increases.

To suppress unnecessary electromagnetic wave radiation, it is necessary to take countermeasures for a configuration such as a layer structure, a layout, and the like of a circuit board, a characteristic of current flowing through a wiring, a length and connection location of a cable, addition of a countermeasure component, and the like. However, it is difficult to modify a design and add a countermeasure component for EMI suppression after production of a circuit board, and even when such countermeasures are taken, design cost and the like increases to a large extent.

Therefore, it is important to estimate an electrical characteristic in a design stage of a circuit board and take a countermeasure for EMI suppression from the result, as necessary. As a method for evaluating an unnecessary electromagnetic wave radiation amount in the design stage of the circuit board, a method for analyzing an electrical characteristic based on information of a board configuration and a mounted component is cited.

As a method for analyzing an electrical characteristic, there are cited an electromagnetic field analysis method such as an FDTD (Finite Difference Time Domain) method, a moment (MOM) method, a finite element (FEM) method, and the like and a circuit analysis method such as SPICE (Simulation Program with Integrated Circuit Emphasis) and the like.

However, it is difficult for SPICE to directly evaluate common-mode current and therefore, a special circuit model for causing current considered as common-mode current to flow is necessary. Further, to create the special circuit model, those with knowledge about electrical circuits and electromagnetic waves need to execute special processing, but it is difficult for those without in-depth knowledge to execute such processing. Further, even when such a special model is created, there is a risk in which a sufficient guarantee in terms of analysis accuracy is unobtainable. Therefore, it is very difficult to estimate common-mode current using SPICE.

On the other hand, in the electromagnetic field analysis method, the entire system to be a target is modeled and therefore, it is possible to calculate electromagnetic wave radiation based on common-mode current flowing through a cable. However, when the entire circuit board including a cable is modeled and a radiation electromagnetic field is calculated, enormous calculation cost is necessary. In general, there is a trade-off relation between calculation cost and analysis accuracy and therefore, when calculation cost is simply decreased, analysis accuracy is decreased, resulting in an insufficient guarantee for an analysis result.

From such a reason, there is needed a method in which to predict an unnecessary electromagnetic wave radiation amount in a design stage of a circuit board, a characteristic where common-mode current flowing through a cable is included can be predicted speedily with necessary analysis accuracy.

In addition, this method needs to be usable by those without in-depth knowledge about electrical circuits and electromagnetic waves.

As a technique for improving unnecessary electromagnetic wave radiation from a cable, various proposals have been made. For example, in Patent Literature 1, to speedily obtain a design guideline for suppressing EMI from a cable, an electronic device, a wiring, and a ground plane are converted into a model for electromagnetic field analysis from layout information of a circuit board and then a distribution of an electric field intensity generated in the vicinity of the ground plane associated with the operation of the electronic device is calculated. A portion where this electric field intensity is weak is connected with a cable and thereby, EMI from the cable is suppressed.

Further, Patent Literature 2 has proposed an electromagnetic field intensity calculation device including a model creation unit which creates a model of electrical circuit equipment for electromagnetic field intensity calculation by setting input data. There are provided a navigation file which stores a procedure for inputting external dimensions of the electrical circuit equipment and inputting an analysis frequency for analyzing the electrical circuit equipment via meshing and a display unit which sequentially displays the procedure stored in the navigation file; and in accordance with the procedure displayed on the display unit, a user sets input data conversationally.

Further, Patent Literature 3 has made a proposal for obtaining optimum analysis input data independent of the skill level of an input data creator, with respect to the electromagnetic field intensity dealt with in Patent Literature 2.

CITATION LIST

Patent Literature

Patent Literature 1: Japanese Laid-open Patent Publication No. 2001-318961
Patent Literature 2: Japanese Laid-open Patent Publication No. 11-161690

Patent Literature 3: Japanese Laid-open Patent Publication No. 7-302278

SUMMARY OF INVENTION

Technical Problem

However, the technique according to Patent Literature 1 is effective to obtain a guideline for a qualitative design modification for a cable connection location on a circuit board, but it is difficult to quantitatively calculate a specific radiation amount of unnecessary electromagnetic wave radiation. Therefore, while in the initial stage of designing the circuit board, a cable can be designed to be connected to a location where unnecessary electromagnetic wave radiation is considered small, there has been noted a problem in which it is difficult to determine whether this configuration can satisfy a regulation limit. This means that it is difficult to determine whether to take a countermeasure for suppressing unnecessary electromagnetic wave radiation.

Further, if the technique according to Patent Literature 2 and the technique according to Patent Literature 3 were combined, even those without in-depth knowledge about electrical circuits and electromagnetic waves could certainly calculate EMI quantitatively by creating a model for electromagnetic field analysis from a configuration of a circuit board.

However, there exists no determination standard whether to take a countermeasure based on the determined quantitative value and therefore, a problem in which no reflection can be performed for the design of the circuit board is produced.

Further, it is possible that a device includes a specific design modification method for a circuit board and a countermeasure component, but when a specific quantitative value of EMI is calculated, there is no guideline for how an improvement is made using a method effective in an EMI countermeasure therefor in what manner. Therefore, it is difficult that those without in-depth knowledge about electrical circuits and electromagnetic waves design a circuit board having been subjected to a countermeasure for low EMI from a design stage of the circuit board using this method.

Therefore, a main object of the present invention is to provide a board design method and a board design device for enabling even those without in-depth knowledge about electrical circuits and electromagnetic waves to speedily and accurately design a configuration having a low level of unnecessary electromagnetic wave radiation in a design stage of a circuit board connected with a cable and mounted with an LSI.

Solution to Problem

To solve the above problems, an invention relating to a board design device used for designing a circuit board includes: an EMI characteristic derivation unit which derives an EMI characteristic radiated from a cable based on design information of the circuit board connected with the cable; a determination standard database which stores an EMI tolerance condition which is a tolerance condition for the EMI characteristic; an EMI condition determination unit which determines whether the EMI characteristic satisfies the EMI tolerance condition; an improvement effect database which stores a modification guideline to modify a configuration of the circuit board necessary to satisfy the EMI tolerance condition when the EMI characteristic does not satisfy the EMI tolerance condition and an improvement effect corresponding to the modification guideline; a restriction item database which stores a restriction item applied when the configuration modification of the board is performed; and a configuration modification unit which performs the configuration modification of the board in accordance with the modification guideline and the restriction item.

Further, an invention relating to a board design method used for designing a circuit board includes: an EMI characteristic derivation procedure for deriving an EMI characteristic radiated from a cable based on design information of the circuit board connected with the cable; an EMI condition determination procedure for determining whether the EMI characteristic satisfies an EMI tolerance condition by acquiring the EMI tolerance condition which is a tolerance condition for the EMI characteristic from a determination standard database; and a configuration modification procedure for modifying a configuration of the board in accordance with a modification guideline and a restriction item by acquiring the modification guideline to modify the configuration of the circuit board necessary to satisfy the EMI tolerance condition from an improvement effect database when the EMI characteristic does not satisfy the EMI tolerance condition and an improvement effect corresponding to the modification guideline and by acquiring the restriction item applied when the configuration of the circuit board is modified from a restriction item database.

Advantageous Effects of Invention

According to the present invention, an unnecessary electromagnetic wave radiation amount is quantitatively evaluated and a configuration modification is performed so as to satisfy a tolerance value and therefore, even those without in-depth knowledge about electrical circuits and electromagnetic waves can design speedily and accurately a circuit board having a low level of unnecessary electromagnetic radiation.

BRIEF DESCRIPTION OF DRAWINGS

FIG. 20 is a block diagram of a board design device having another configuration according to the fourth exemplary embodiment;

FIG. 23A is a top view of a board illustrating a modified example of an internal layering rate of a wiring;

FIG. 23B is an A-A sectional view of FIG. 23A illustrating a modified example of an internal layering rate of a wiring;

FIG. 25A is a chart where the data illustrated in FIG. 24A is graphed, exemplarily illustrating the improvement effects using a graph format;

FIG. 25B is a chart where the data illustrated in FIG. 24B is graphed, exemplarily illustrating the improvement effects using a graph format;

FIG. 31A is a chart exemplarily illustrating a signal voltage of a pulse signal defined by a cycle T, a rise time, and the like, illustrating a signal waveform when changing the rise time of the signal voltage by signal characteristic modification processing;

FIG. 31B is a chart exemplarily illustrating a behavior of the signal voltage of FIG. 31A toward frequency, illustrating a signal waveform when changing the rise time of the signal voltage by the signal characteristic modification processing;

FIG. 33A is a partial top view of a board, illustrating a specific example of countermeasure component addition processing;

FIG. 33B illustrates an equivalent circuit model, illustrating a specific example of the countermeasure component addition processing;

FIG. 35A is a partial top view of a board in which a cable length is modified, illustrating a specific example of the cable structure modification processing;

FIG. 35B is a chart illustrating a radiation electric field characteristic with respect to frequency, illustrating a specific example of the cable structure modification processing;

FIG. 46 is a chart illustrating maximum values of an EMI characteristic prior to wiring internal layering;

FIG. 48 is a chart illustrating maximum values of an EMI characteristic after wiring internal layering.

DESCRIPTION OF EMBODIMENTS

Unnecessary electromagnetic wave radiation is considered as a main cause of EMI, and may be exemplified as the case of being generated by a voltage variation between a power supply and GND of a board, the case of being generated from an element such as an LSI and the like during operation, the case of being directly generated from current flowing through a wiring connected to an LSI or the like, and the case of being generated via electrical coupling between a cable connected to a board and a wiring on the board. It should be supplementarily noted in advance that in the following description, unnecessary electromagnetic wave radiation generated between a cable and a wiring will be described as an example without limitation to such radiation.

First Exemplary Embodiment

Figure 1:
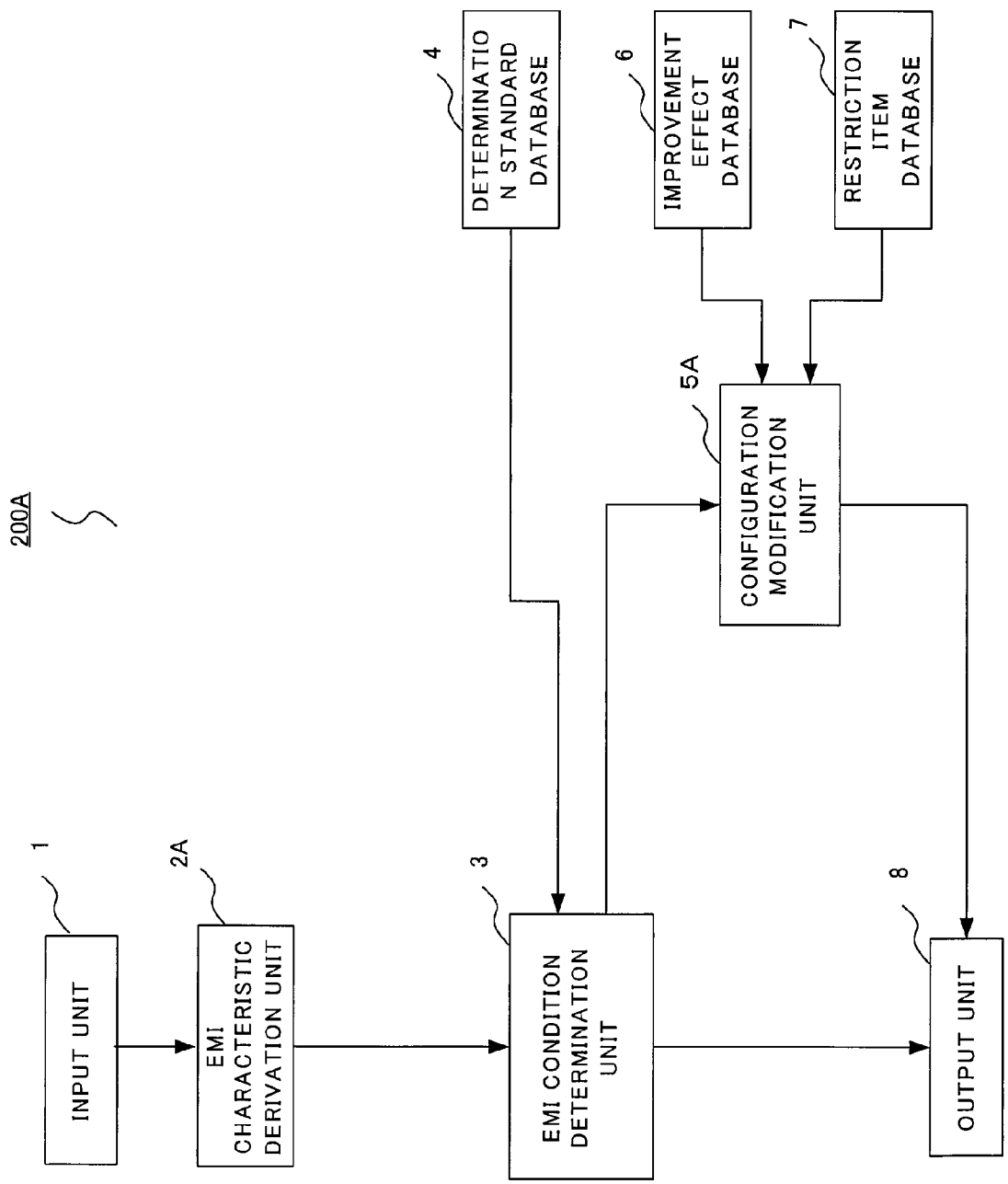
FIG. 1 is a block diagram of a board design device according to a first exemplary embodiment of the present invention.

A first exemplary embodiment of the present invention will be described. FIG. 1 is a block diagram of a board design device 200A according to the first exemplary embodiment of the present invention.

The board design device 200A includes an input unit 1, an EMI characteristic derivation unit 2A, an EMI condition determination unit 3, a configuration modification unit 5A, and an output unit 8, as well as a determination standard database 4, an improvement effect database 6, and a restriction item database 7.

Configuration information of a board (circuit board) connected with a cable and design information including information of mounted components including an LSI are input from the input unit 1.

The EMI characteristic derivation unit 2A derives an EMI characteristic generated from the board based on the input design information. The design information input via the input unit 1 is described as basic design information and an EMI characteristic derived based on this basic design information is described as a basic EMI characteristic to be discriminated from modified design information, a modified EMI characteristic, additionally modified design information, and an additionally modified EMI characteristic to be described later. These are collectively described as design information and an EMI characteristic.

The EMI condition determination unit 3 determines whether the board is designed so as to have a low EMI characteristic or satisfy a predetermined condition, based on a basic EMI characteristic.

Specifically, the EMI condition determination unit 3 extracts an EMI tolerance condition from the determination standard database 4. This EMI tolerance condition indicates a tolerance range for the basic EMI characteristic. The EMI condition determination unit 3 compares the basic EMI characteristic and the EMI tolerance condition and then determines whether the EMI characteristic satisfies the EMI tolerance condition.

The EMI tolerance condition stored in the determination standard database 4 may be a condition indicating a tolerance limit value or the like of the basic EMI characteristic. For example, a frequency characteristic of EMI determined by standards may be exemplified. When a plurality of EMI tolerance conditions are previously stored in the determination standard database 4, an EMI tolerance condition according to the basic EMI characteristic is acquired.

When the basic EMI characteristic is determined not to satisfy the EMI tolerance condition, the configuration modification unit 5A performs a configuration modification of the board (board configuration modification) to improve the basic EMI characteristic.

The board configuration modification is performed by acquiring a modification guideline and an improvement effect from the improvement effect database 6 and acquiring a restriction item from the restriction item database 7.

The modification guideline represents a guideline when modifying a board configuration when the EMI characteristic does not satisfy the EMI tolerance condition. Further, the improvement effect represents an improvement effect for the EMI characteristic when modifying the board configuration based on the modification guideline. Further, the restriction item represents a restriction item when modifying the board configuration.

The configuration modification of the board is performed in accordance with the modification guideline under the restriction item. Of course, when an EMI characteristic of the board subjected to a configuration modification does not satisfy the EMI tolerance condition even by adding an improvement effect expectable by the configuration modification at that time, a configuration modification in accordance with another modification guideline is performed. In other words, the EMI condition determination unit 3 selects a modification guideline to satisfy the EMI tolerance condition by taking into account an improvement effect for the basic EMI characteristic to perform a board configuration modification.

Thereafter, the configuration modification unit 5A outputs a modification result of the board configuration to the output unit 8. As output information at that time, the basic design information, the basic EMI characteristic, modified design information, a modified EMI characteristic, and the EMI tolerance condition may be exemplified. The modified design information may be differential information indicating a modified portion for the basic design information.

Figure 2:
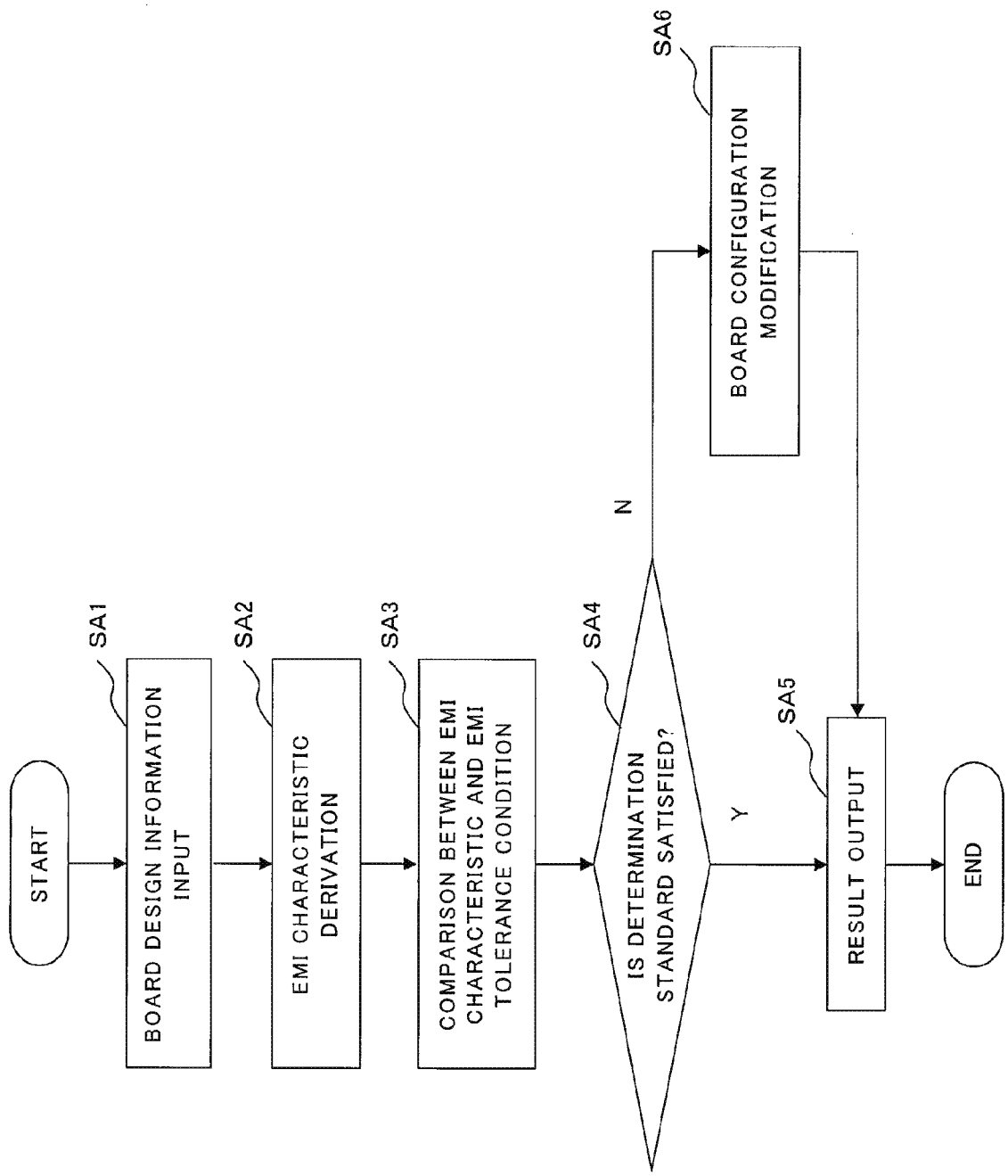
FIG. 2 is a flowchart illustrating a configuration modification procedure according to the present exemplary embodiment.

Next, a configuration modification procedure of the board design device 200A will be described. FIG. 2 is a flowchart illustrating a configuration modification procedure according to the present exemplary embodiment.

Figure 3:
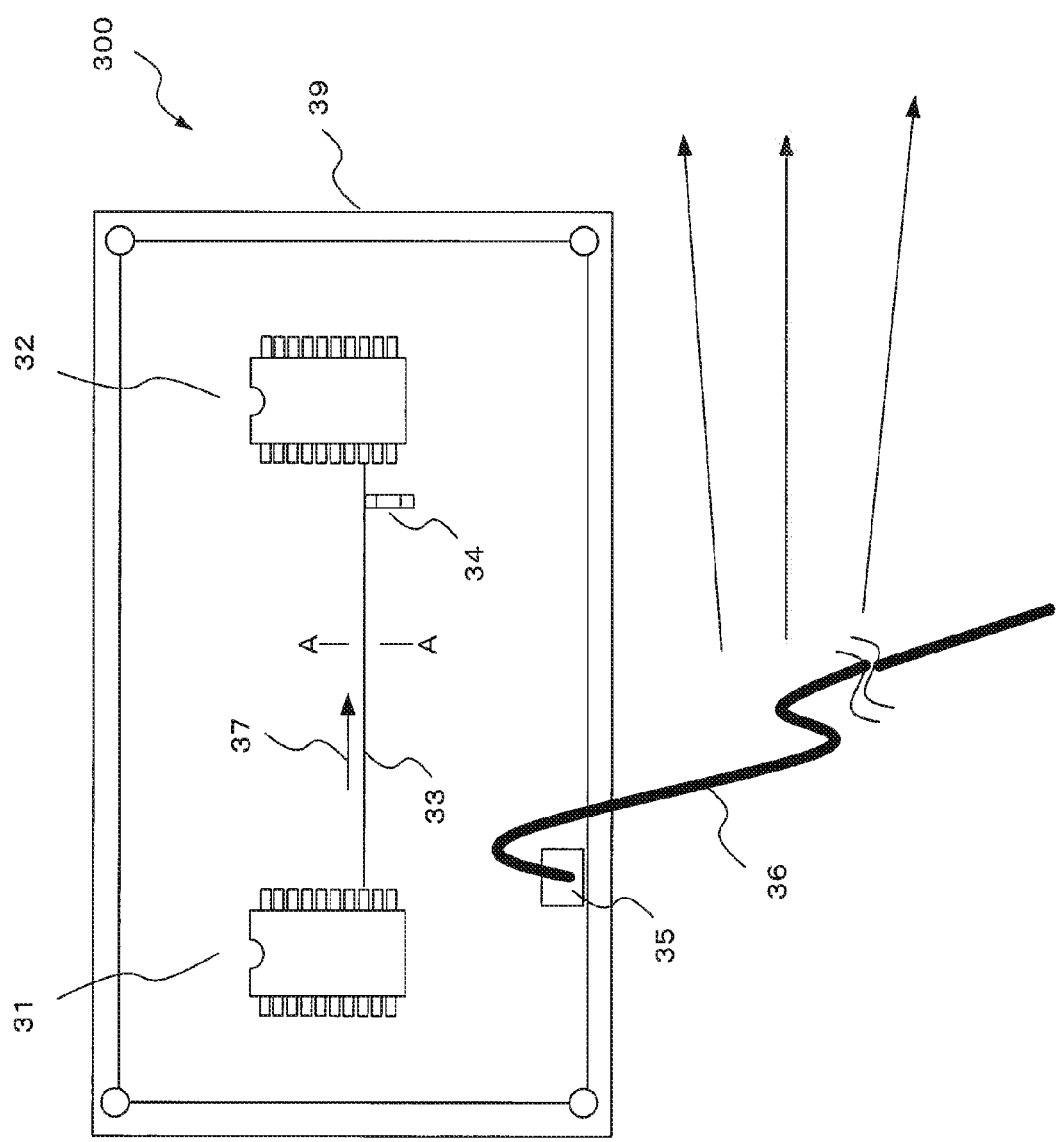
FIG. 3 is a top view of a board applied to describe the configuration modification procedure.
Figure 4:
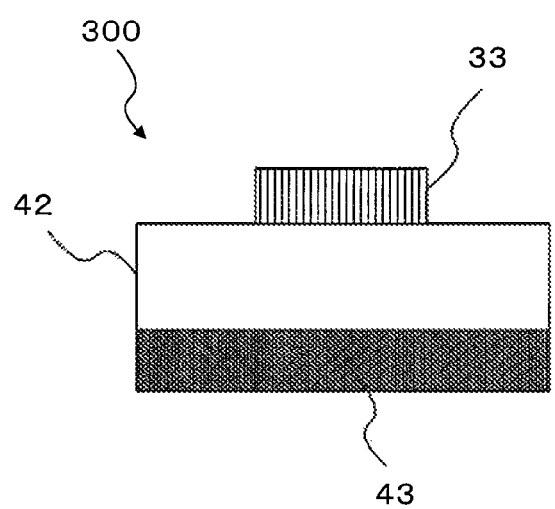
FIG. 4 is an A-A sectional view of the board in FIG. 3.

Further, when the configuration modification procedure is described, an example of the board illustrated in FIG. 3 and FIG. 4 is referred to. FIG. 3 is a top view of a board 300 and FIG. 4 is an A-A sectional view in FIG. 3. The board 300 includes a substrate 39, and the substrate 39 is mounted with a transmission side LSI 31, a reception side LSI 32, a mounted component 34 such as a resistor, a capacitor, and the like, and a connector 35. Further, the connector 35 is connected with a cable 36.

The substrate 39 is a multi-layer substrate including a dielectric layer 42 and an internal conductive layer 43 such as GND, a power supply, and the like as illustrated in FIG. 4, and on an upper face (surface) of the substrate 39, a wiring 33 which connects, for example, the transmission side LSI 31 and the reception side LSI 32 is formed. When current 37 flows through the wiring 33, the wiring 33 and the cable 36 are electrically coupled and then the cable 36 acts as an antenna. As a result, EMI is radiated from the cable 36.

Step SA1: (Basic Design Information Input Processing)

Initially, basic design information is input from the input unit 1. Regarding this input of the basic design information, an input operation may be performed by a user or electronic data such as circuit CAD and the like may be input.

Step SA2: (EMI Derivation Processing)

The EMI characteristic derivation unit 2A derives a basic EMI characteristic from the basic design information.

Step SA3: (Comparison Processing)

The basic EMI characteristic is transmitted to the EMI condition determination unit 3. The EMI condition determination unit 3 acquires an EMI tolerance condition from the determination standard database 4 and compares the basic EMI characteristic and the EMI tolerance condition.

Step SA4: (Determination Processing)

Then, on the basis of a result of the comparison between the basic EMI characteristic and the EMI tolerance condition, the EMI condition determination unit 3 determines whether the basic EMI characteristic satisfies the EMI tolerance condition.

Step SA5: (Result Output Processing)

When the basic EMI characteristic is determined to satisfy the EMI tolerance condition in step SA4, the basic design information, the basic EMI characteristic, and the EMI tolerance condition are output to the output unit 8.

Step SA6: (Board Configuration Modification Processing)

On the other hand, when the basic EMI characteristic is determined not to satisfy the EMI tolerance condition, the basic design information, the basic EMI characteristic, and the EMI tolerance condition are output to the configuration modification unit 5A. The configuration modification unit 5A acquires a modification guideline and an improvement effect from the improvement effect database 6 and acquires a restriction item from the restriction item database 7.

Then, the configuration of the board is modified so as to obtain the improvement effect in accordance with the modification guideline under the restriction item. Modified design information and a modified EMI characteristic obtained by this modification of the board configuration are output to the output unit 8, together with the basic design information, the basic EMI characteristic, and the EMI tolerance condition.

The above makes it possible to quantitatively acquire a design state and a design margin from the basic design information, the modified design information, the EMI characteristic, the modified EMI characteristic, the EMI tolerance condition, and the like and therefore, a design modification is easily performed and also design with high reliability is made possible.

Second Exemplary Embodiment

Figure 5:
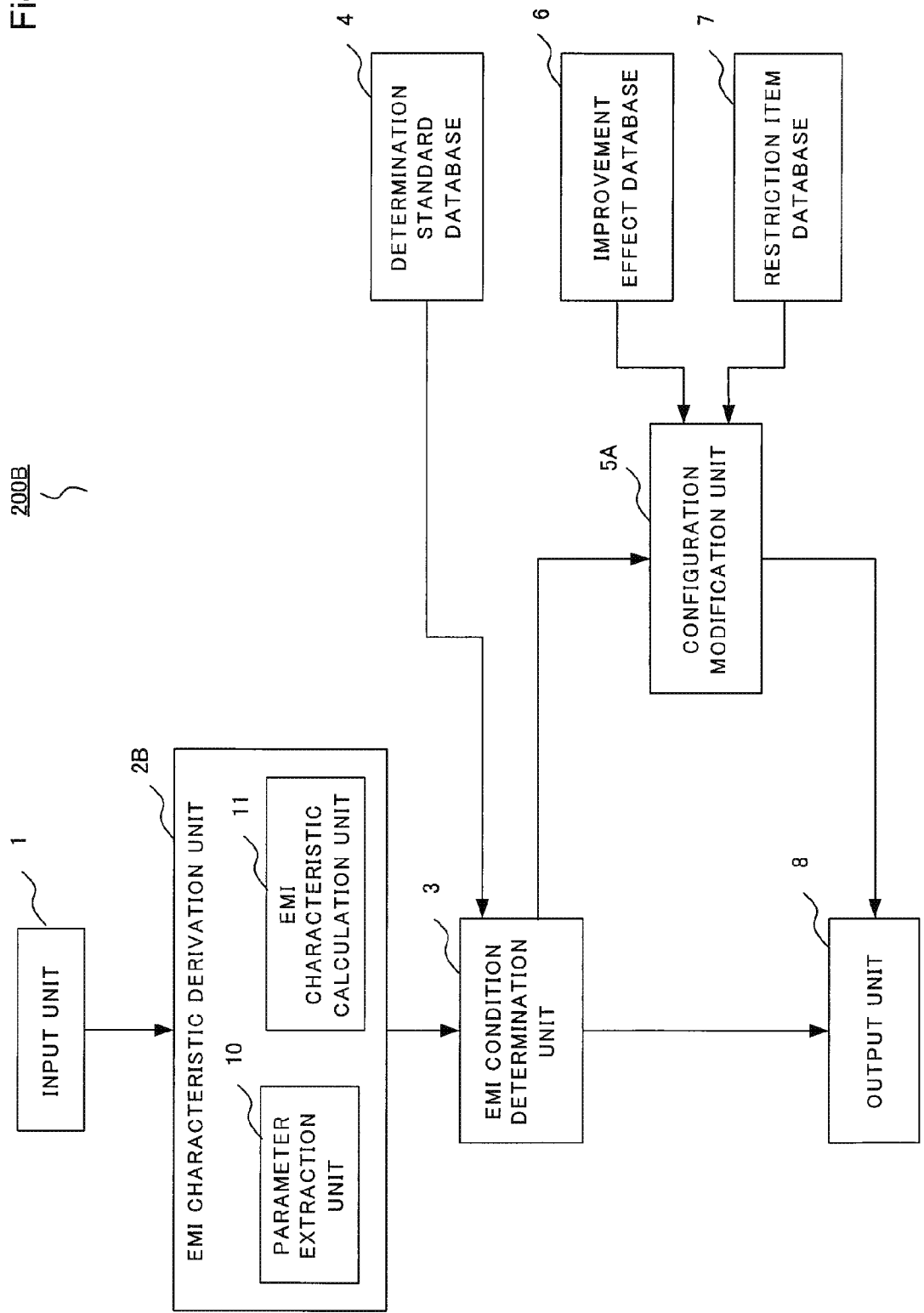
FIG. 5 is a block diagram of a board design device according to a second exemplary embodiment of the present invention.

Next, a second exemplary embodiment of the present invention will be described. Description of the same configuration as in the first exemplary embodiment will be omitted using the same reference sign, as appropriate. FIG. 5 is a block diagram of a board design device 200B according to the second exemplary embodiment of the present invention.

The present exemplary embodiment differs in a respect in which the EMI characteristic derivation unit 2A in the first exemplary embodiment was changed to an EMI characteristic derivation unit 2B. The EMI characteristic derivation unit 2B includes a parameter extraction unit 10 and an EMI characteristic calculation unit 11, and derives a basic EMI characteristic from basic design information by simple analytical calculation.

Therefore, the parameter extraction unit 10 extracts only information necessary to derive a basic EMI characteristic from basic design information. As information extracted here, an external size of a board, a layer structure, a size of a wiring, a characteristic of current flowing through the wiring, an input impedance of the wiring, a termination condition of the wiring, connection location information of a cable, and a length of the cable may be exemplified.

Then, the EMI characteristic calculation unit 11 derives a basic EMI characteristic using parameters extracted by the parameter extraction unit 10.

As a method for deriving a basic EMI characteristic in the EMI characteristic derivation unit 2B, methods described, for example, in Non-Patent Literature 1 to Non-Patent Literature 3 (hereinafter, referred to as a closed-form maximum radiation estimation method) are applicable. However, it should be supplementarily noted in advance that the present invention is not limited to the closed-form maximum radiation estimation method.

<Non-Patent Literature 1>

"Model for Estimating Radiated EMIssions From a Printed Circuit Board With Attached Cables Due to Voltage-Driven Sources," IEEE TRANSACTIONS ON ELECTROMAGNETIC COMPATIBILITY, Vol. 47, No. 4, NOVEMBER 2005, Hwan-Woo Shim and Todd H. Hubing <Non-Patent Literature 2>

"Estimating Maximum Radiated EMIssions From Printed Circuit Boards With an Attached Cable," IEEE TRANSACTIONS ON ELECTROMAGNETIC COMPATIBILITY, Vol. 50, No. 1, FEBRUARY 2008, Shaowei Deng, Todd Hubing, and Daryl Beetner <Non-Patent Literature 3>

"Derivation of a Closed-Form Approximate Expression for the Self-Capacitance of a Printed Circuit Board Trace," IEEE TRANSACTIONS ON ELECTROMAGNETIC COMPATIBILITY, Vol. 47, No. 4, NOVEMBER 2005, Hwan W and Todd H, Hubing In this closed-form maximum radiation estimation method, when calculating a basic EMI characteristic, modelling of a board is performed as illustrated in FIG. 6. FIG. 6A is a view illustrating an analysis model of a cable for a ground potential of a board 102; FIG. 6B is a view illustrating a configuration of the board 102; FIG. 6C is a view illustrating a relation between a voltage and a capacitance in a wiring 112, a cable 111, and a board 110; and FIG. 6D is a view illustrating a relation between a common-mode voltage and a capacitance in the wiring 112 and the cable 111.

Figure 6A:
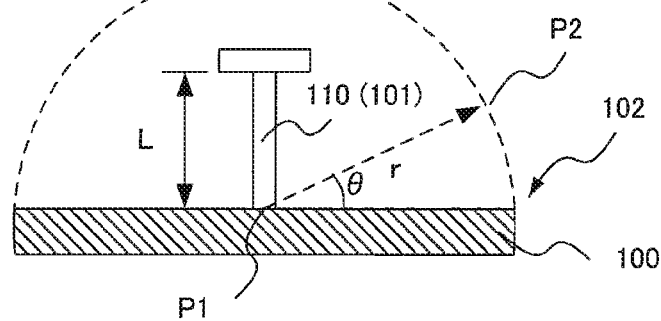
FIG. 6A is a view illustrating an analysis model of a cable for a ground potential of a board applied to describe modelling of the board.

In the analysis model illustrated in FIG. 6A, the board 102 is connected with the cable 111 having a length L, and one end of the cable 111 is grounded. Then, EMI from the cable 111 will be considered. This model is conceivable to be replaced with a model in which it is assumed that a monopole antenna having a length L is connected to the ground 100 and this monopole antenna is supplied with power. Therefore, in the following description, the cable 111 is descried as a monopole antenna 101, as appropriate.

An EMI amount at a point P2 having a distance r and an angle $\theta$ from a grounding point P1 is designated as $|E_\theta|$ and common-mode current flowing through the monopole antenna 101 is designated as $I_0$. Then, the EMI amount is given as the following equation.

$$|E_\theta| = 60 \times \frac{I_0}{r} \times \left| \frac{\cos(kL\cos\theta) - \cos(kL)}{\sin\theta} \right| \quad (1)$$
$$= 60 \times \frac{I_0}{r} \times \Gamma(\theta, kL)$$

The function $\Gamma(\theta, kL)$ is represented as follows, $$\Gamma(\theta, kL) = \left| \frac{\cos(kL\cos\theta) - \cos(kL)}{\sin\theta} \right| \quad (2)$$

wherein k represents a wave number and has the following relation with an assumed wavelength $\lambda$.

$$k = 2\pi/\lambda \quad (3)$$

Further, a frequency f and the wavelength $\lambda$ have the following relation.

$$\lambda = 300/(f \times 10^{-6}) \quad (4)$$

From Equation 2, when an antenna length L is 1 [m], a maximum value of an EMI characteristic in a low frequency (f≤500 MHz) is represented as $\Gamma_{max}(\theta, k) = 2.76$.

On the other hand, the common-mode current $I_0$ flowing through the monopole antenna 101 has the following relation with a supply voltage V and an input resistance $R_{in}$ of the monopole antenna 101.

$$I_O = V/R_{in} \quad (5)$$

When the antenna length L is equivalent to a frequency equal to $\lambda/4$, EMI has a maximum value.

The input resistance $R_{in}$ at that time has a minimum value $R_{min} = 37[\Omega]$.

From the above, when the monopole antenna 101 is supplied with a voltage of a common-mode voltage $V_{CM}$ and at that time, a maximum value of $|E_\theta|$ is designated as $|E|_{max}$, from Equation 1, Equation 2, and Equation 5, $|E|_{max}$ is given as the following equation.

$$|E|_{max} = \frac{60}{r} \times \frac{Vcm}{Rmin} \times \Gamma_{max}(\theta, k) \quad (6)$$

$$= \frac{60}{r} \times \frac{Vcm}{37} \times 2.76$$

$$= 4.48 \times \frac{Vcm}{r}$$

Equation 6 is an equation indicating a maximum value of EMI from the monopole antenna 101 having a length of 1 [m].

A maximum value $|E|$ of EMI when connecting a cable having a length $L_{cable}$ to a board having an effective length $L_{board}$ (the board effective length generally indicates a diagonal length of a board plane) is determined as the following equation by multiplying correction coefficients according to a cable length and a board size, $$|E| = |E|_{max} \times k_{rc} \times k_{bs} \quad (7)$$

$$= 4.48 \times \frac{V_{cm}}{r} \times k_{rc} \times k_{bs}$$

wherein krc represents a coefficient indicating an influence of a cable length exerted to a radiation amount and has the following relation with a wavelength $\lambda$ to be analyzed and the cable length $L_{cable}$.

$$k_{rc} = \begin{cases} \sin(2\pi L_{cable}/\lambda) & L_{cable} \leq \lambda/4 \\ 1.0 & L_{cable} > \lambda/4 \end{cases} \quad (8)$$

Further, kbs is a coefficient indicating an influence of a size of a board plane exerted to a radiation amount and has the following relation with the effective length $L_{board}$ of the board and the wavelength $\lambda$ to be analyzed.

$$k_{bs} = \begin{cases} \sin(2\pi L_{board}/\lambda) & L_{board} \leq \lambda/4 \\ 1.0 & L_{board} > \lambda/4 \end{cases} \quad (9)$$

Figure 6B:
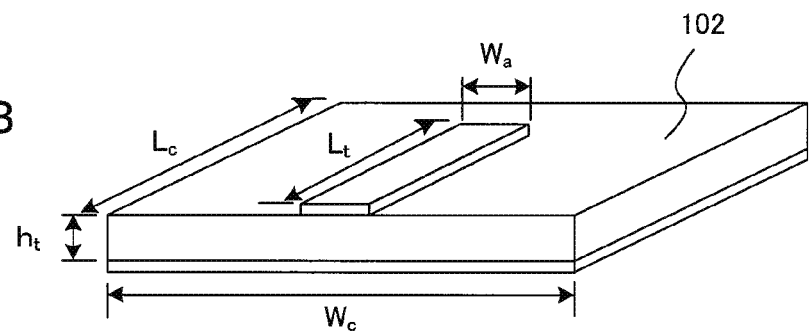
FIG. 6B is a view illustrating a configuration of a board applied to describe modelling of the board.
Figure 6C:
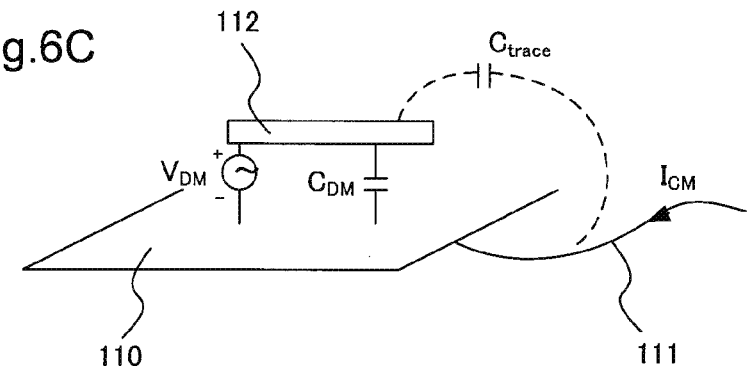
FIG. 6C is a view illustrating an equivalent circuit of a wiring applied to describe modelling of the board.
Figure 6D:
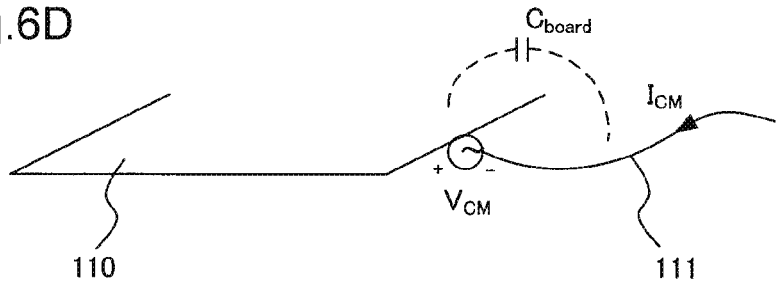
FIG. 6D is a view illustrating an equivalent circuit of a cable and a board applied to describe modelling of the board.

On the other hand, as illustrated in FIG. 6C and FIG. 6D, a common-mode voltage $V_{CM}$ generated between a board 110 and a cable 111 is converted by a differential-mode voltage $V_{DM}$ applied to a wiring 112 formed in the board 110 and represented as follows using a parasitic capacitance $C_{trace}$ of the wiring 112 and a parasitic capacitance $C_{board}$ of the board 110, $$V_{CM} = \frac{C_{trace}}{C_{board}} V_{DM} \quad (10)$$

wherein $C_{board}$ is represented as the following equation using a planar area $S_{BA}$ of the board 110.

$$C_{board} = 8\varepsilon_0 \sqrt{\frac{S_{BA}}{\pi}} \quad (11)$$

$C_{trace}$ may be derived using an analysis engine for an electrostatic field but is definable from a shape of the wiring 112 using the following closed-form approximation.

In this case, as illustrated in FIG. 6B, when a distance from a return path of the wiring 112 is designated as $h_t$, a wiring length is designated as $L_t$, a length of the long side of the board 110 is designated as $L_c$, and a length of the short side is designated as $W_c$, $C_{trace}$ can be given as the following equation using each parameter, $$C_{trace} = \frac{6.189}{\pi} \times \frac{h_t}{W_c} \times \frac{C_{DM} L_t}{\ln[1 + 3.845(L_c/W_c)]} \quad (12)$$

wherein $C_{DM}$ represents a capacitance of a wiring having a return plane which is infinitely wide, and when a width of the wiring is designated as $W_a$, $C_{DM}$ is represented by the following equation, $$C_{DM} = 2\pi\varepsilon_0 \left\{ \ln\left[ \frac{Fh_t}{W_a} + \sqrt{1 + \left(\frac{2h_t}{W_a}\right)^2} \right] \right\}^{-1} \quad (13)$$

wherein F is represented by the following equation.

$$F = 6 + (2\pi - 6)\exp\left\{ -\left(30.666 \times \frac{h_t}{W_a}\right)^{0.7528} \right\} \quad (14)$$

The above makes it possible to calculate a maximum value of the EMI characteristic.

A basic EMI characteristic is calculated via parameter extraction processing in this manner, and then a determination is performed whether this basic EMI characteristic satisfies an EMI tolerance condition. When no satisfaction is obtained, a board configuration is modified by the configuration modification unit 5A.

Figure 7:
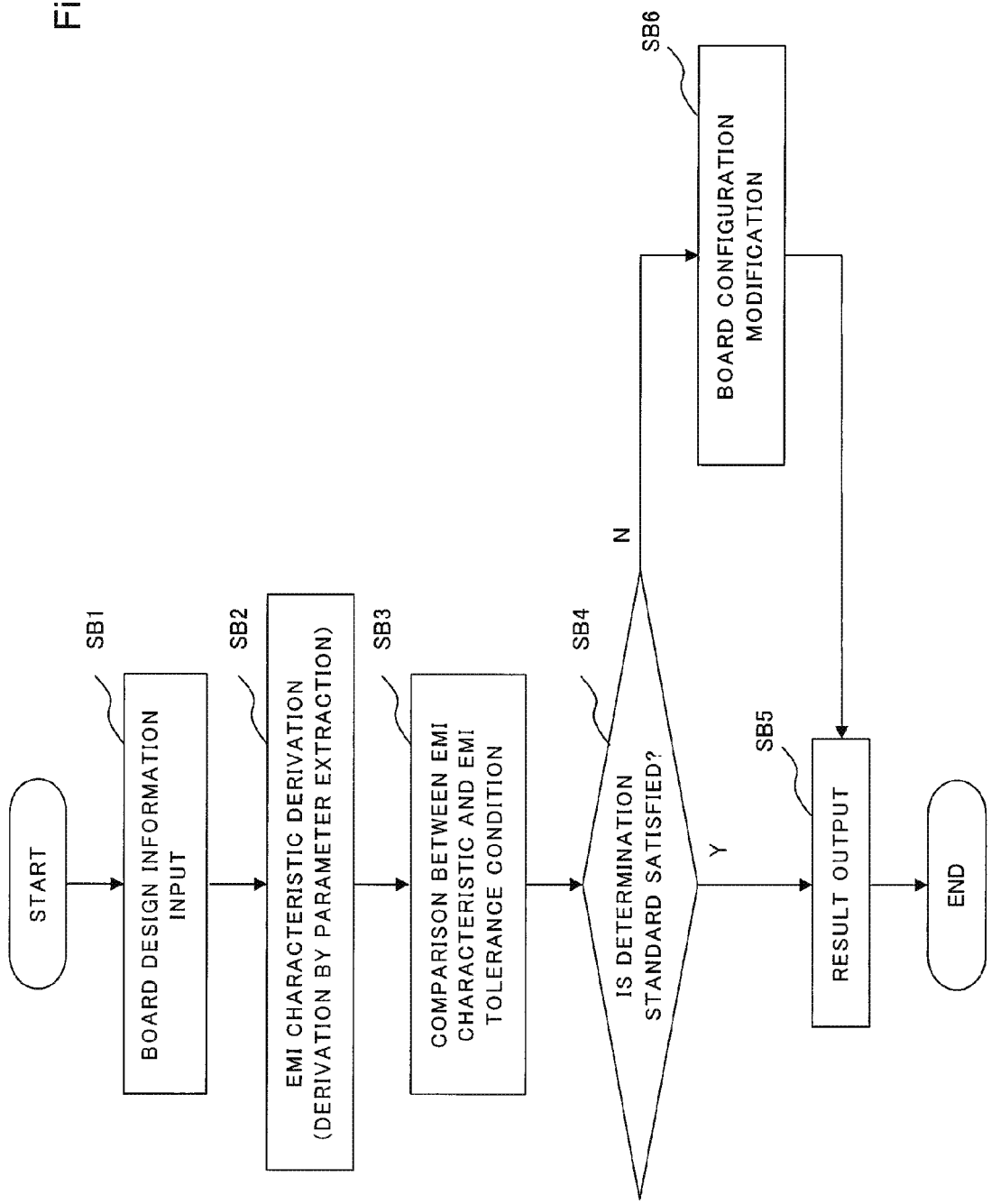
FIG. 7 is a flowchart illustrating a processing procedure of a board design device.

FIG. 7 is a flowchart illustrating a processing procedure of the board design device 200B. The processing procedure is substantially the same as the processing procedure illustrated in FIG. 2, but specific processing of step SB2 is different.

In other words, step SB1 and step SB3 to step SB5 are the same as step SA1 and step SA3 to step SA5, respectively. Hereinafter, description of the same processing will be omitted as appropriate. In step SB2, a basic EMI characteristic is derived by calculation.

Step SB1: (Basic Design Information Input Processing) Basic design information of a board is input from the input unit 1.

Step SB2: (EMI Characteristic Derivation Processing)

Figure 8:
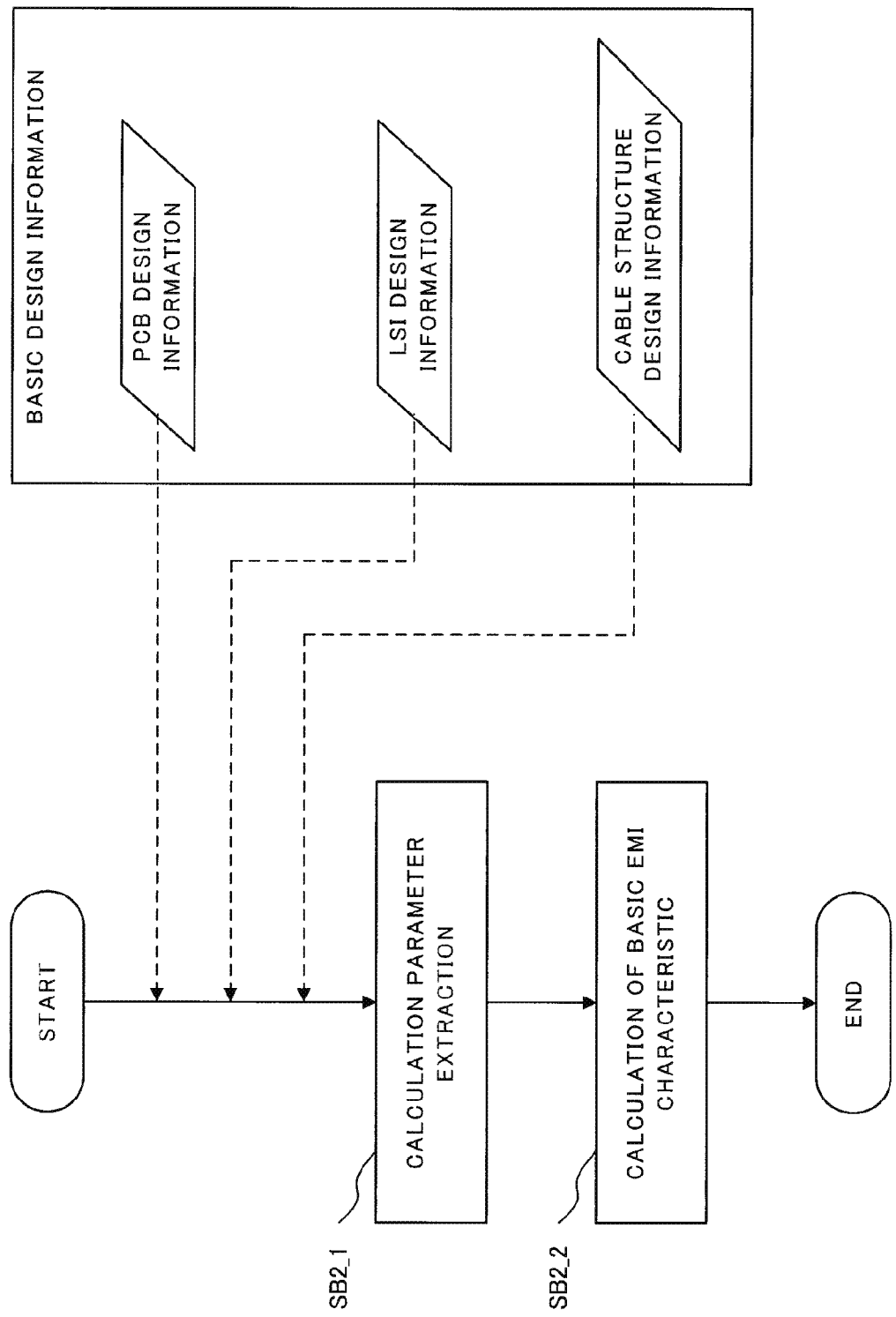
FIG. 8 is a flowchart illustrating a procedure for deriving basic EMI characteristic by calculation.

The EMI characteristic derivation unit 2B executes parameter extraction processing and calculation processing and derives a basic EMI characteristic. FIG. 8 is a flowchart illustrating a procedure for deriving this basic EMI characteristic by calculation.

Step SB2_1: (Parameter Extraction Processing)

Figure 9:
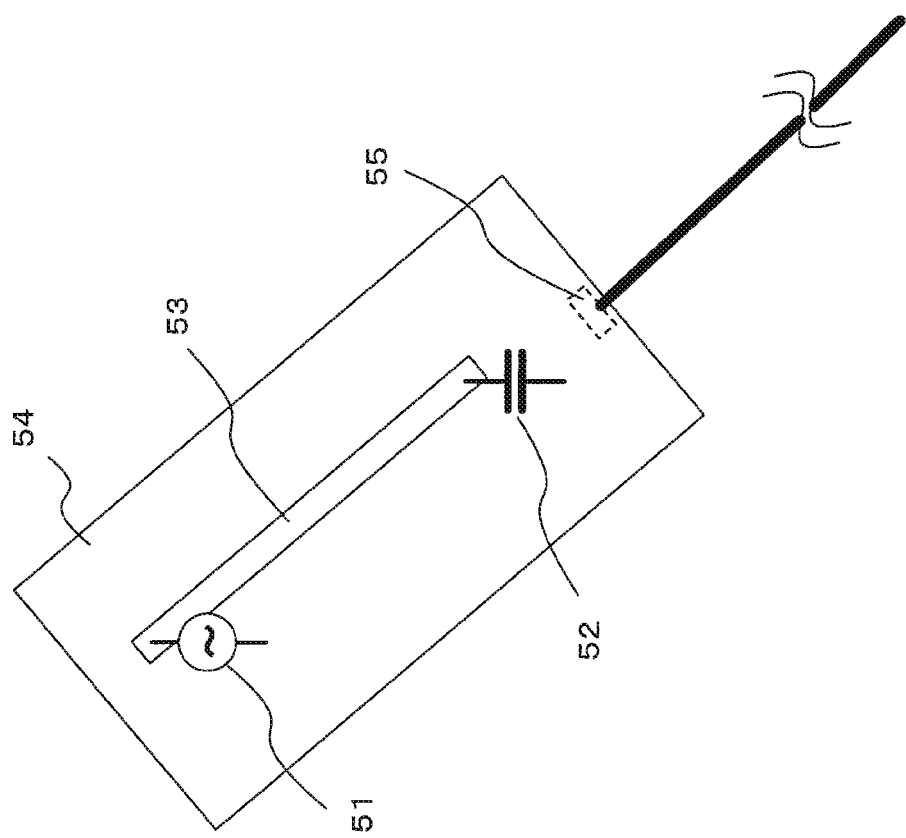
FIG. 9 is a view exemplarily illustrating an equivalent circuit of a board.

Initially, the parameter extraction unit 10 extracts parameters used to calculate the basic EMI characteristic from the basic design information. FIG. 9 is a view illustrating an equivalent circuit of the board 300 illustrated in FIG. 3 and FIG. 4. In this case, the parameter extraction unit 10 extracts a transmission side parameter 51, a reception side parameter 52, a wiring parameter 53, a cable connection parameter 55, a board parameter 54, and the like from the basic design information.

The transmission side parameter 51 includes a transmission voltage characteristic or a transmission current characteristic from the transmission side LSI 31 and a transmission side impedance. The reception side parameter 52 includes a termination condition of a wiring according to the reception side LSI 32 and the mounted component 34 and a reception side impedance. The wiring parameter 53 is information such as a location, length, and width of the wiring 33 where the current 37 flows, a distance to GND, and the like. The cable connection parameter 55 is information such as a length of the cable 36, a location of the connector 35, or the presence or absence of a component to be connected to the cable 36, and the like. The board parameter 54 is information on a horizontal plane size of the board.

Step SB2_2: (Calculation Processing)

Then, the EMI characteristic calculation unit 11 applies the extracted parameters to the respective equations in the closed-form maximum radiation estimation method to calculate a basic EMI characteristic and the like.

Step SB3 to Step SB6:

Description will be continued by returning to FIG. 7. After calculation of the basic EMI characteristic, the same processing as step SA3 to step SA6 illustrated in FIG. 2 compares the basic EMI characteristic and an EMI tolerance condition and determines whether the basic EMI characteristic satisfies the EMI tolerance condition. When the basic EMI characteristic does not satisfy the EMI tolerance condition, the configuration modification unit 5A modifies the board configuration and creates modified design information and a modified EMI characteristic. Thereafter, the basic design information, the basic EMI characteristic, the modified design information, the modified EMI characteristic, and the EMI tolerance condition are output to the output unit 8.

As described above, from the basic design information, the basic EMI characteristic can be acquired by calculation. The basic EMI characteristic and the modified EMI characteristic can be quantitatively acquired. Therefore, a current board problem can be quantitatively grasped and therefore, a board with high quality can be easily designed.

Third Exemplary Embodiment

Figure 10:
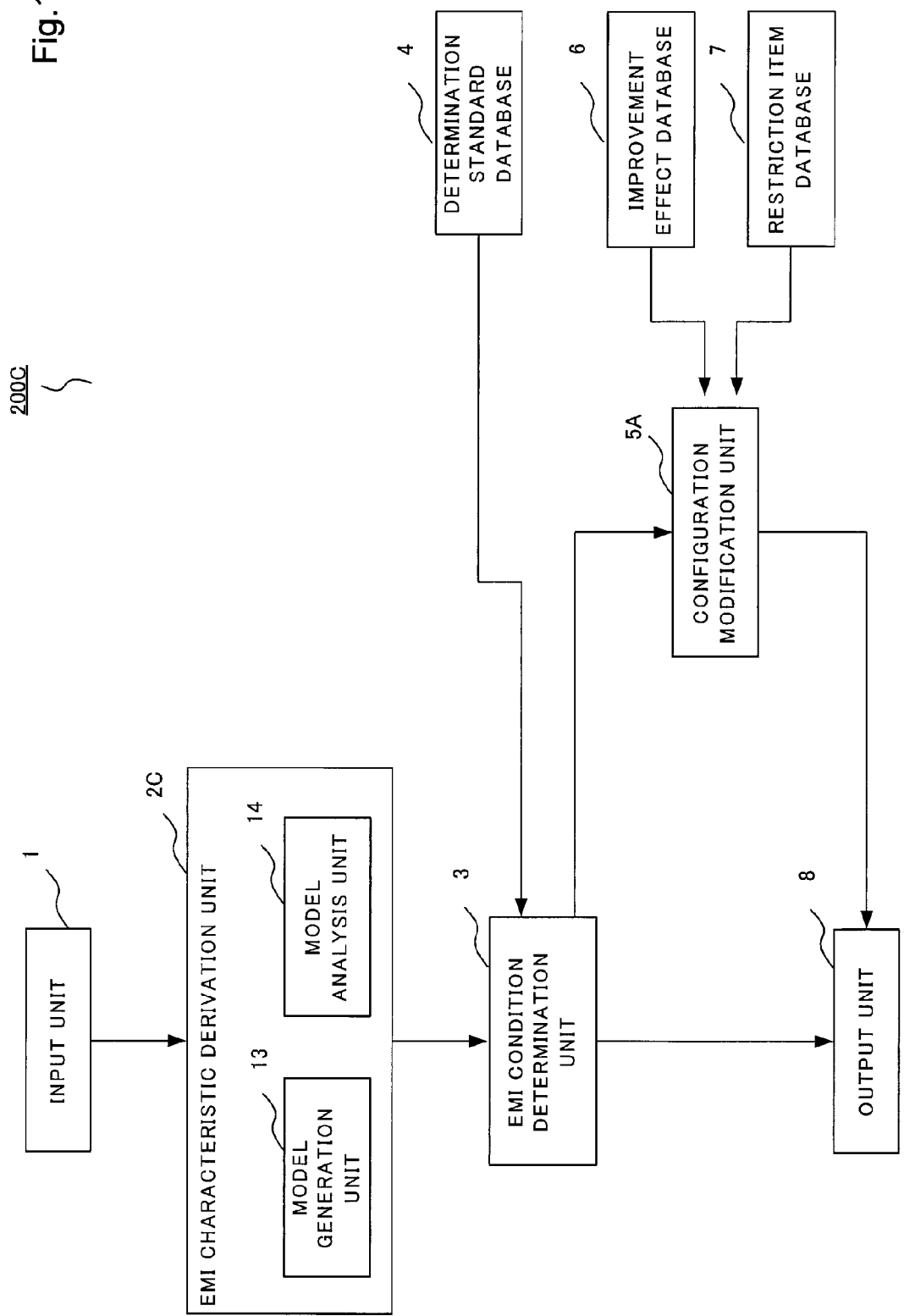
FIG. 10 is a block diagram of a board design device according to a third exemplary embodiment of the present invention.

Next, a third exemplary embodiment of the present invention will be described. Description of the same configuration as in the respective exemplary embodiments will be omitted using the same reference sign, as appropriate. FIG. 10 is a block diagram of a board design device 200C according to the third exemplary embodiment of the present invention.

The present invention differs in a respect in which the EMI characteristic derivation unit 2A in the first exemplary embodiment was changed to an EMI characteristic derivation unit 2C. The EMI characteristic derivation unit 2C includes a model generation unit 13 and a model analysis unit 14. The model generation unit 13 simply creates a model from basic design information and then the model analysis unit 14 analyzes the created model to derive a basic EMI characteristic.

As the analysis model, there can be exemplified a model for electromagnetic field analysis in which information such as an external shape and a layer structure of a board, connection of a component or a cable, and the like is reproducible and a noise source including an operation signal or the like of an LSI is added.

Further, the model analysis unit 14 spatially mesh-divides the analysis model generated by the model generation unit 13 according to a characteristic of a tool and analysis accuracy. Then, using an electromagnetic field analysis method such as an FDTD method, a moment method, a finite element method, and the like, model analysis is performed to determine a basic EMI characteristic. Therefore, unnecessary electromagnetic wave radiation generated from a cable can be directly determined in an analytical manner.

In general, a time necessary for model analysis is increased with enhancement of analysis accuracy. Therefore, it is preferable to set analysis accuracy corresponding to a design stage of a board to achieve analysis time reduction and calculation cost suppression. As a condition for substantially specifying such analysis accuracy, a division number of a model can be exemplified. Therefore, the model analysis unit 14 preferably stores a function to adjust a division number corresponding to the design stage of the board or a guideline for setting thereof.

Figure 11:
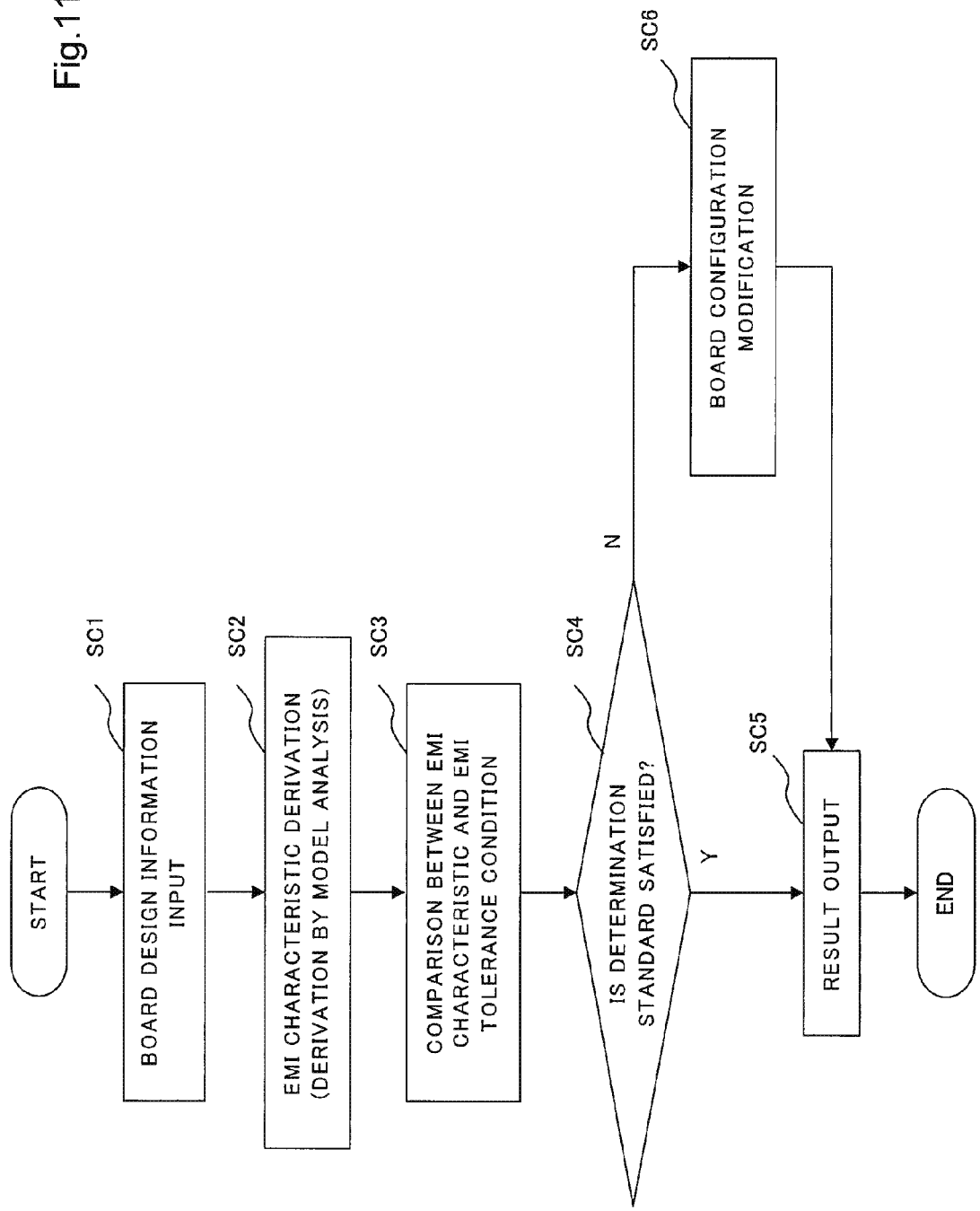
FIG. 11 is a flowchart illustrating a processing procedure of a board design device.

FIG. 11 is a flowchart illustrating a processing procedure of the board design device 200C. The processing is substantially the same as in the processing procedure illustrated in FIG. 2 but specific processing in step SC2 differs. In other words, step SC1 and step SC3 to step SC6 are the same as step SA1 and step SA3 to step SA6, respectively. Hereinafter, description of the same processing will be omitted as appropriate.

Figure 12:
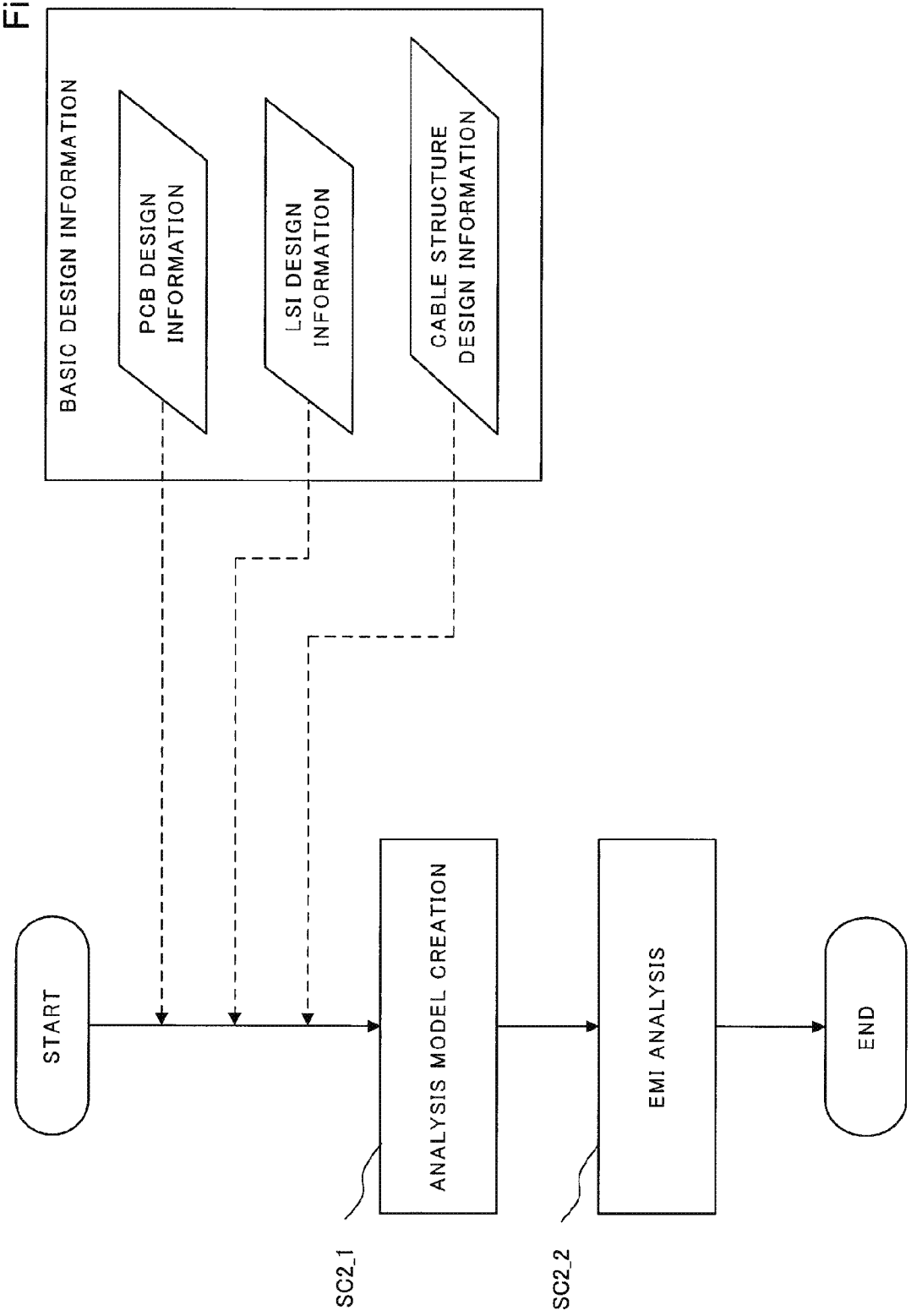
FIG. 12 is a flowchart illustrating a derivation procedure of a basic EMI characteristic by model analysis.

In step SC2, a basic EMI characteristic is derived by model analysis. FIG. 12 is a flowchart illustrating a derivation procedure of a basic EMI characteristic by this model analysis. In the following description, description will be made on a case as an example in which as an analysis target, the board 300 illustrated in FIG. 3 and FIG. 4 is used and as an analysis method, an FDTD method is used.

Step SC1: (Basic Design Information Input Processing)

In FIG. 11, basic design information is input to the input unit 1.

Step SC2: (Basic EMI Characteristic Derivation Processing)

As illustrated in FIG. 12, the EMI characteristic derivation unit 2C creates an analysis model based on the basic design information (analysis model creation processing), analyzes this analysis model (model analysis processing), and derives a basic EMI characteristic.

Step SC2_1: (Analysis Model Creation Processing)

Figure 13:
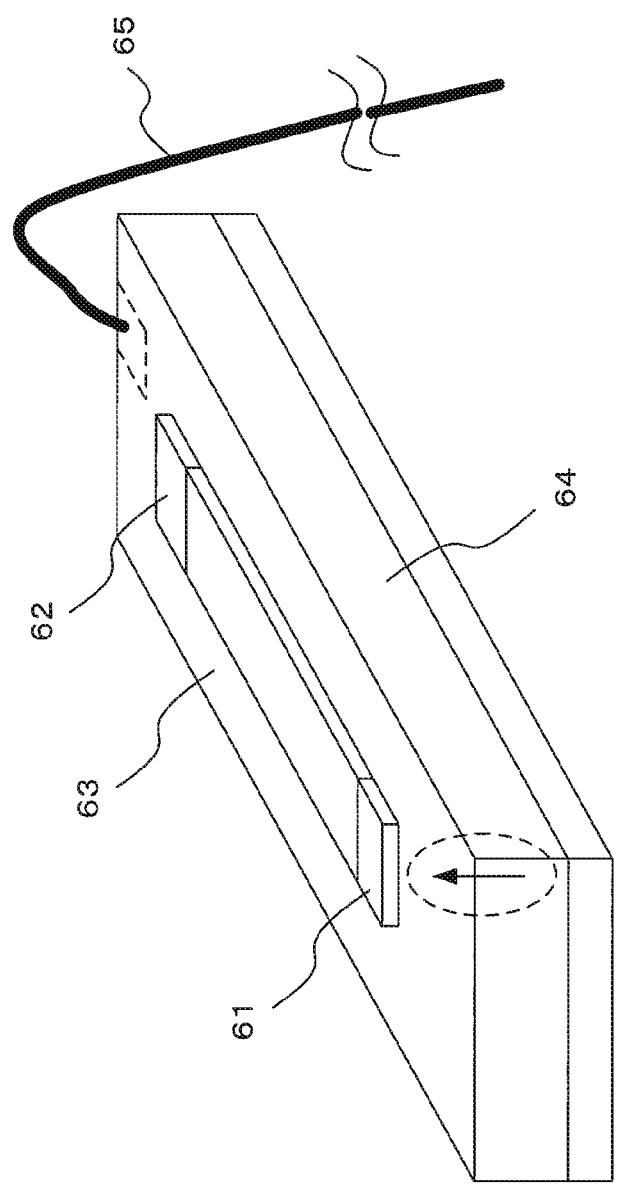
FIG. 13 illustrates an example of a three-dimensional analysis model of a board created from basic design information.

In other words, the model generation unit 13 creates an analysis model necessary to perform electromagnetic field analysis from the basic design information. This analysis model is a three-dimensional analysis model formed by extracting a transmission side parameter 61, a reception side parameter 62, a wiring parameter 63, a cable connection parameter 65, a board parameter 64, and the like as illustrated in FIG. 13 from the basic design information of the board illustrated in FIG. 3 and FIG. 4.

The transmission side parameter 61 is created by extracting a transmission signal source suitable for three-dimensional analysis for allowing current from the transmission side LSI 31 to flow and portions necessary for the analysis from a configuration and a characteristic of the transmission side LSI 31. The reception side parameter 62 is created by extracting only portions necessary for the analysis from configurations and characteristics of the reception side LSI 32 and the mounted component 34. The wiring parameter 63 is three-dimensional configuration information of the wiring 33. The cable connection parameter 65 is created via extraction from a configuration of the cable 36, a location of the connector 35 connected with the cable 36, and a configuration and a characteristic of a connected component. The board parameter 64 is three-dimensional configuration information of the board.

Step SC2_2: (Model Analysis Processing)

The model analysis unit 14 divides the created analysis model. This division is performed based on a guideline (previously set in the model analysis unit 14) for adjustment of the number of meshes to an appropriate size and the like. Then, the mesh-divided analysis model is subjected to electromagnetic field analysis using a mechanism of the FDTD method to derive a basic EMI characteristic.

Steps SC3 to SC6:

Description will be continued by returning to FIG. 11. The EMI condition determination unit 3 determines whether the basic EMI characteristic satisfies an EMI tolerance condition. When no satisfaction is obtained, a board configuration is modified by the configuration modification unit 5A, and modified design information and a modified EMI characteristic are derived.

As described above, when an analysis model is created from basic design information and this analysis model is analyzed, the basic EMI characteristic can be acquired. It becomes possible to quantitatively find a design margin based on the basic EMI characteristic and the modified EMI characteristic. Therefore, a current board problem can be quantitatively grasped and therefore, a board with high quality can be designed.

Fourth Exemplary Embodiment

Figure 14:
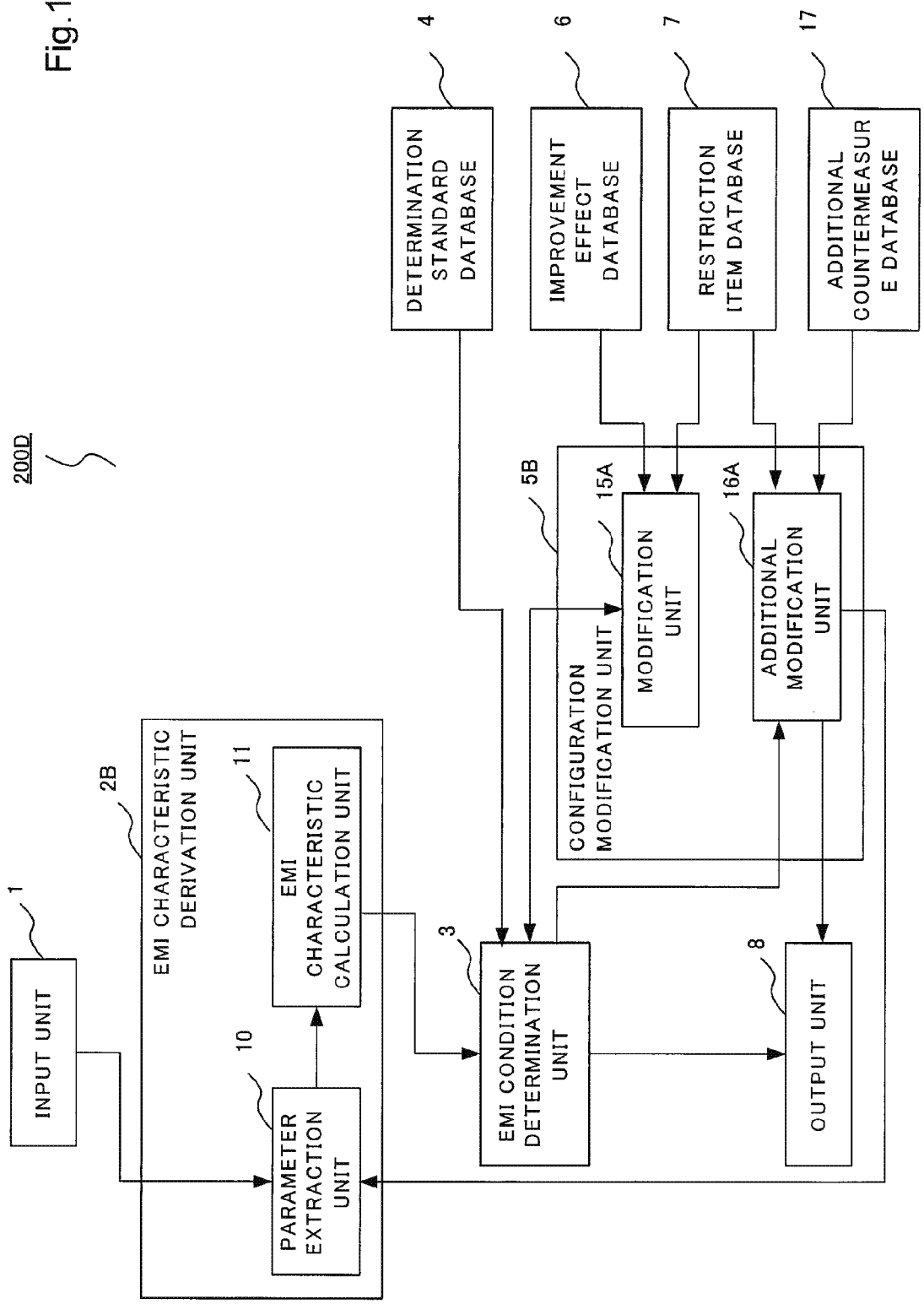
FIG. 14 is a block diagram of a board design device according to a fourth exemplary embodiment of the present invention.

Next, a fourth exemplary embodiment of the present invention will be described. Description of the same configuration as in the respective exemplary embodiments will be omitted using the same reference sign, as appropriate. FIG. 14 is a block diagram of a board design device 200D according to the fourth exemplary embodiment of the present invention.

The present exemplary embodiment employs a configuration in which instead of the configuration modification unit 5A in the system configuration of the second exemplary embodiment illustrated in FIG. 5, a configuration modification unit 5B is used and further, an additional countermeasure database 17 is added. This configuration modification unit 5B includes a modification unit 15A and an additional modification unit 16A.

When the EMI condition determination unit 3 determines that a basic EMI characteristic does not satisfy an EMI tolerance condition, the modification unit 15A modifies the board configuration in accordance with a modification guideline, an improvement effect, and a restriction item.

Then, the EMI characteristic of the board subjected to the configuration modification is derived as a modified EMI characteristic. The modified EMI characteristic is returned to the EMI condition determination unit 3. At that time, modified design information indicating the modified content is output to the EMI condition determination unit 3, together with the modified EMI characteristic. The modified design information is assumed to be board design information after configuration modification or a difference between the board design information after configuration modification and the basic design information.

The EMI condition determination unit 3 determines whether the modified EMI characteristic satisfies the EMI tolerance condition and outputs the modified EMI characteristic, the modified design information, the basic design information, the basic EMI characteristic, and the EMI tolerance condition to the additional modification unit 16A when determining that no satisfaction is obtained.

The additional modification unit 16A acquires, from the additional countermeasure database 17, an additional modification guideline regarding a configuration modification to be additionally performed and an improvement effect (additional improvement effect) to be expected when configuring a board in accordance with the additional modification guideline. Further, a restriction item is acquired from the restriction item database 7. Then, an additional modification of the board configuration is performed under the restriction item. The additionally modified board configuration is output to the EMI characteristic derivation unit 2B as additionally modified design information.

The EMI characteristic derivation unit 2B derives an EMI characteristic based on the additionally modified design information and outputs the derived characteristic to the EMI characteristic derivation unit 2B as an additionally modified EMI characteristic.

Figure 15:
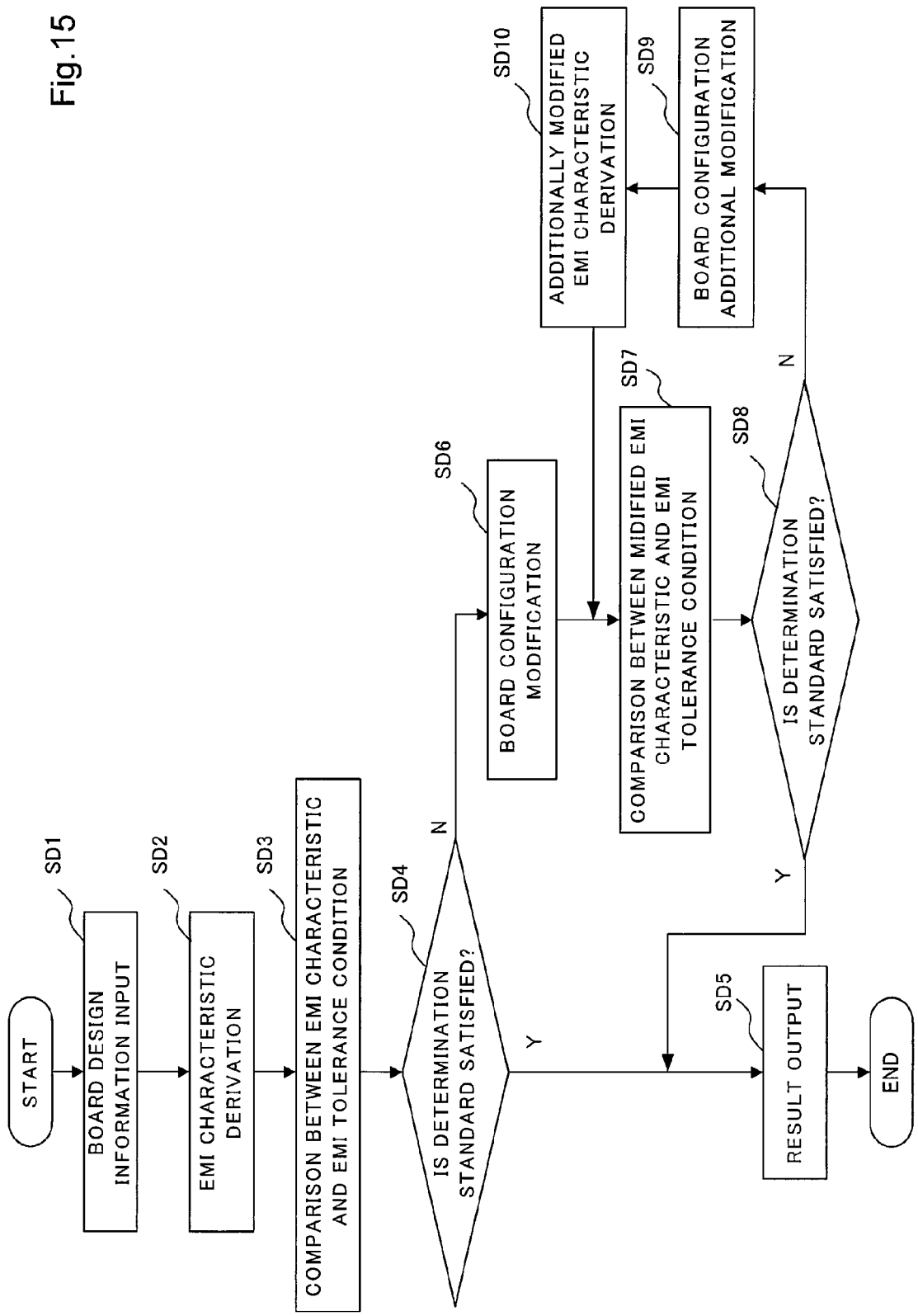
FIG. 15 is a flowchart illustrating a processing procedure of a board design device.

FIG. 15 is a flowchart illustrating a processing procedure of the board design device 200D. The processing procedure illustrated in FIG. 15 is substantially the same as the processing procedure illustrated in FIG. 7 but differs in a respect in which step SB6 in FIG. 7 was changed to a configuration corresponding to step SD6 to step SD10. In other words, the processing of step SD1 to step SD5 are the same as in step SB1 to step SB5, respectively. Hereinafter, description of the same processing will be omitted as appropriate.

Steps SD1 to SD5:

On the basis of basic design information, a basic EMI characteristic is derived and a determination whether an EMI tolerance condition is satisfied is performed. Then, when the basic EMI characteristic satisfies the EMI condition, the board design information, the basic EMI characteristic, and the EMI tolerance condition are output to the output unit 8.

Step SD6:

On the other hand, when the basic EMI characteristic does not satisfy the EMI tolerance condition, the EMI condition determination unit 3 outputs the board design information, the basic EMI characteristic, the EMI tolerance condition, and the like to the modification unit 15A. The modification unit 15A acquires a modification guideline and an improvement effect from the improvement effect database and modifies a board configuration.

Figure 16:
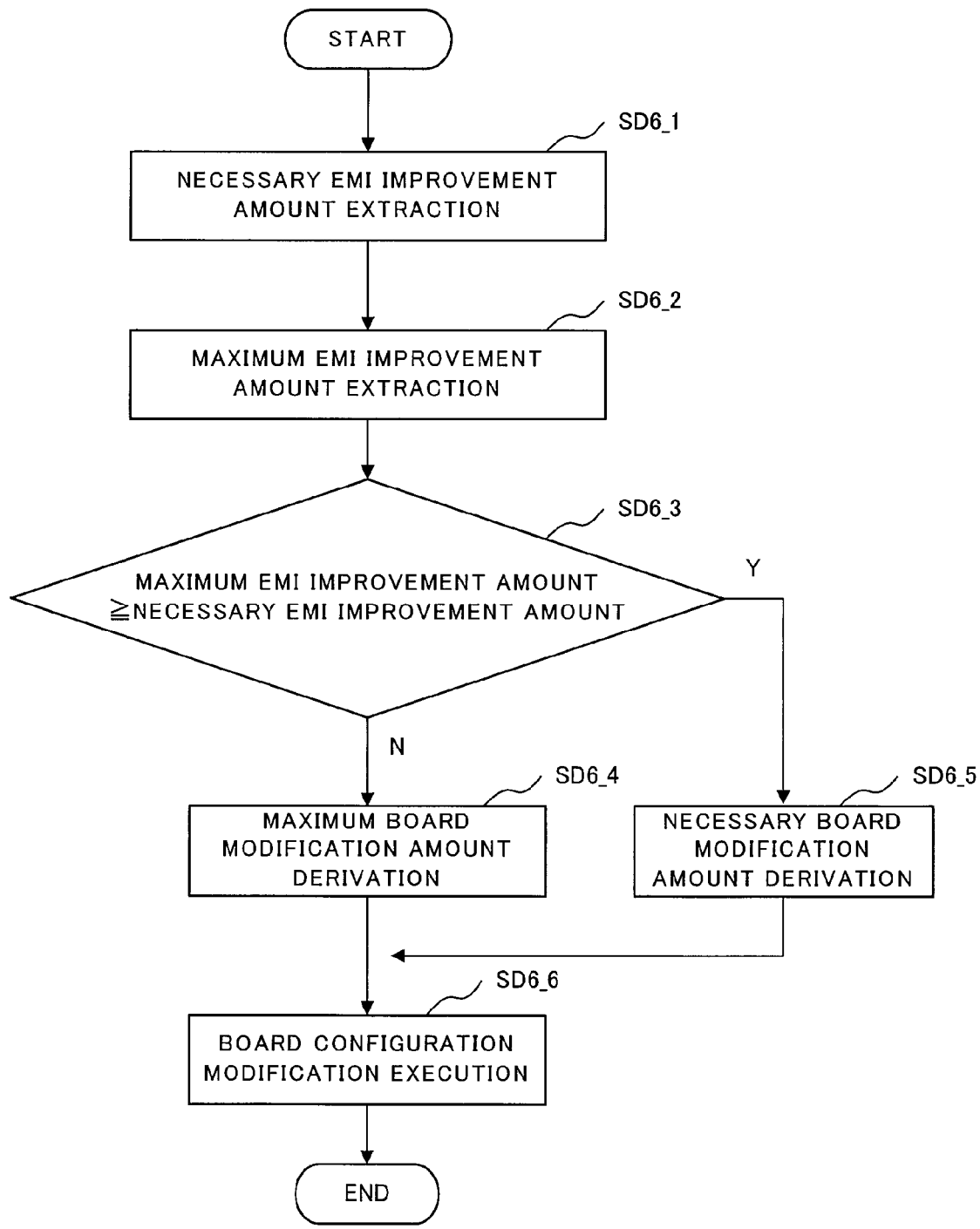
FIG. 16 is a flowchart illustrating a processing procedure in a modification unit.

FIG. 16 is a flowchart illustrating a processing procedure in the modification unit 15A.

Step SD6_1: (Necessary EMI Improvement Amount Extraction Processing)

Initially, the modification unit 15A compares the basic EMI characteristic and the EMI tolerance condition and derives a necessary EMI improvement amount from the result. This necessary EMI improvement amount indicates a degree of improvement necessary for the basic EMI characteristic to satisfy the EMI tolerance condition.

A basic EMI characteristic is derived, for example, for each frequency and therefore, when the EMI tolerance condition indicates an upper limit of the basic EMI characteristic of each frequency, the necessary EMI improvement amount may be a difference between the EMI tolerance condition and the basic EMI characteristic in each frequency. At that time, the basic EMI characteristic and a characteristic under the EMI tolerance condition need to have the same format (need to have the same dimension) and therefore, the EMI tolerance condition is preferably set in the same format as the basic EMI characteristic.

Step SD6_2: (Maximum EMI Improvement Amount Extraction Processing)

Then, the modification unit 15A extracts a maximum EMI improvement amount in accordance with a modification guideline and an improvement effect previously stored in the improvement effect database 6 and a restriction item stored in the restriction item database 7. This maximum EMI improvement amount refers to a maximum improvement amount of an EMI characteristic when modifying a configuration in a range allowed by the restriction item.

Step SD6_3: (EMI Improvement Amount Comparison Processing)

Then, the modification unit 15A determines by comparison whether the maximum EMI improvement amount is at least the necessary EMI improvement amount. At that time, when the maximum EMI improvement amount is at most the necessary EMI improvement amount (the maximum EMI improvement amount<the necessary EMI improvement amount), the processing moves to step SD6_4, but when the maximum EMI improvement amount is at least the necessary EMI improvement amount (the maximum EMI improvement amount≥the necessary EMI improvement amount), the processing moves to step SD6_5.

Step SD6_4: (Maximum Board Modification Amount Derivation Processing)

When the maximum EMI improvement amount is smaller than the necessary EMI improvement amount (the maximum EMI improvement amount≤the necessary EMI improvement amount), the modification unit 15A derives a configuration modification amount (a maximum board modification amount) to improve the basic EMI characteristic by the maximum EMI improvement amount. The maximum board modification amount refers to a modification amount of a board configuration in which on the basis of a modification guideline and a restriction item stored in the improvement effect database 6 and the restriction item database 7, a configuration modification is performed in a range allowed by the restriction item.

Step SD6_5: (Necessary Board Modification Amount Derivation Processing)

On the other hand, when the maximum EMI improvement amount is at least the necessary EMI improvement amount (the maximum EMI improvement amount≥the necessary EMI improvement amount), the modification unit 15A derives a configuration modification amount (a necessary board modification amount) to make an improvement by the necessary EMI improvement amount. This processing can be acquired in such a manner that an improvement amount of a basic EMI characteristic at each frequency and a necessary board modification amount when partially modifying a board configuration are correlated and previously stored in the improvement effect database 6.

Step SD6_6: (Board Configuration Modification Execution Processing)

Thereafter, the modification unit 15A modifies the basic design information in accordance with the necessary board modification amount or the maximum board modification amount and outputs the modified information to the EMI condition determination unit 3 as modified board design information.

From the above processing, the modified design information is obtained and also the maximum EMI improvement amount or the necessary EMI improvement amount is obtained as an EMI improvement effect associated with the configuration modification. In other words, a modified EMI characteristic is obtained.

Steps SD7 and SD8: (EMI Tolerance Condition Determination)

Description will be continued by returning to FIG. 15. When the modification unit 15A outputs the modified design information and the modified EMI characteristic to the EMI condition determination unit 3, the EMI condition determination unit 3 determines whether the modified EMI characteristic satisfies the EMI tolerance condition. In this determination, when the modified EMI characteristic satisfies the EMI tolerance condition, the modified design information, the modified EMI characteristic, the basic design information, the basic EMI characteristic, and the EMI tolerance condition are output to the output unit 8. However, when the modified EMI characteristic does not satisfy the EMI tolerance condition, the EMI condition determination unit 3 outputs these pieces of information to the additional modification unit 16A.

Step SD9:

When receiving the modified design information, the modified EMI characteristic, and the like from the EMI condition determination unit 3, the additional modification unit 16A acquires a restriction item from the restriction item database 7 and also acquires an additional modification guideline and an additional improvement effect from the additional countermeasure database 17. Then, the additional modification unit 16A performs an additional modification of the board configuration based on the additional modification guideline and the additional improvement effect under the restriction item. Board design information acquired by this additional modification (additionally modified design information) is output to the EMI characteristic derivation unit 2B.

Figure 17:
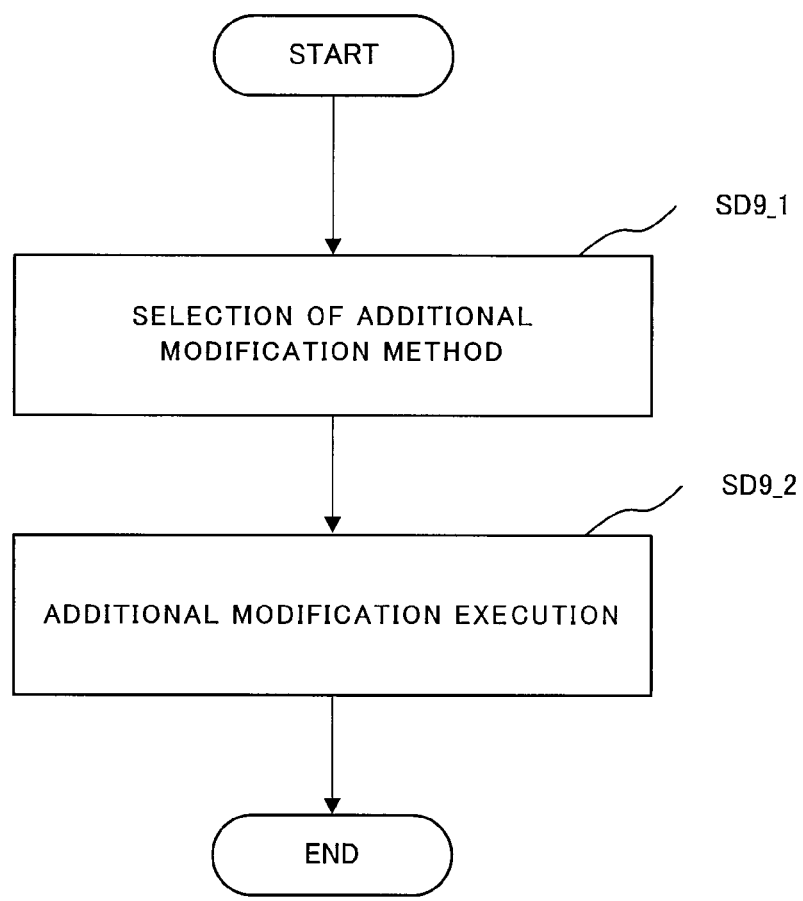
FIG. 17 is a flowchart illustrating a processing procedure in an additional modification unit.

FIG. 17 is a flowchart illustrating a processing procedure in the additional modification unit 16A.

Step SD9_1: (Additional Modification Processing Selection Processing)

The additional modification unit 16A acquires an additional modification guideline and an additional improvement effect from the additional countermeasure database 17 and also acquires a restriction item from the restriction item database 7. Then, under the restriction item, the additional modification guideline and the additional improvement effect to additionally modify the board configuration are selected.

At that time, a modification method indicated by the additional modification guideline is a method different from the configuration modification method performed in the modification unit 15A. The reason is that since the board configuration has been already modified to improve the basic EMI characteristic in the modification unit 15A, an additional improvement can be made without allowing this modification processing to be unnecessary.

Step SD9_2: (Board Configuration Additional Modification Execution Processing)

Then, the additional modification unit 16A performs an additional modification of the board configuration based on the additional modification guideline and the additional improvement effect selected under the restriction item.

Step SD10: (Additionally Modified EMI Characteristic Calculation Processing)

Description will be continued by returning to FIG. 15. When receiving additionally modified design information from the additional modification unit 16A, the EMI characteristic derivation unit 2B derives an EMI characteristic based on the additionally modified design information. This EMI characteristic is described as an additionally modified EMI characteristic. The additionally modified EMI characteristic is output to the EMI condition determination unit 3. The EMI condition determination unit 3 determines whether the additionally modified EMI characteristic satisfies the EMI tolerance condition. Therefore, step SD7 to Step SD10 are repeated until the additionally modified EMI characteristic satisfies the EMI tolerance condition, and when satisfying the EMI tolerance condition, the processing moves to step SD5 to end.

Figure 18:
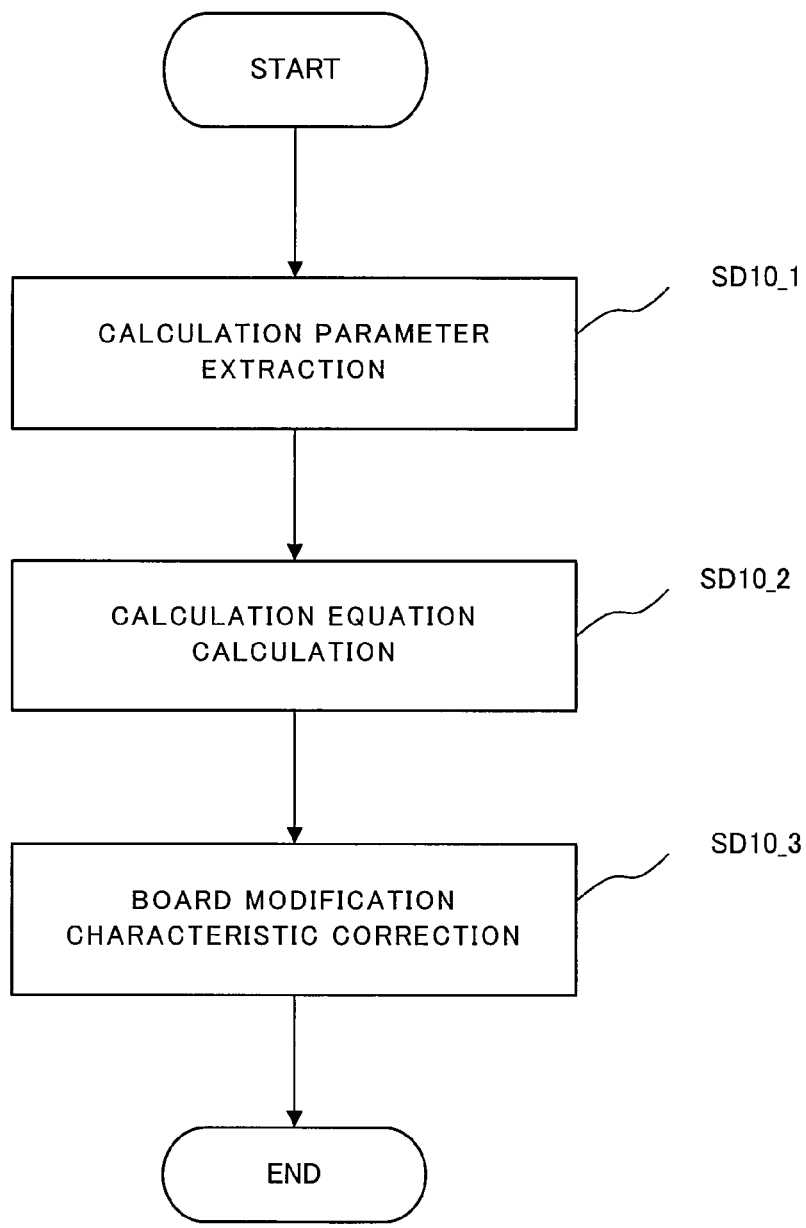
FIG. 18 is a flowchart illustrating a derivation procedure for an additionally modified EMI characteristic.

FIG. 18 is a flowchart illustrating a derivation procedure for an additionally modified EMI characteristic.

Step SD10_1: (Calculation Parameter Extraction Processing)

The parameter extraction unit 10 extracts calculation parameters necessary to calculate an EMI characteristic based on the additionally modified design information from the additional modification unit 16A.

Step SD10_2: (Calculation Equation Calculation Processing)

Then, the EMI characteristic calculation unit 11 derives the EMI characteristic using the extracted calculation parameters. At that time, the EMI characteristic calculation unit 11 derives a maximum value characteristic of unnecessary electromagnetic wave radiation by applying a closed-form maximum radiation estimation method.

Step SD10_3: (Board Modification Characteristic Correction Processing)

The EMI characteristic calculation unit 11 corrects the EMI characteristic using the maximum EMI improvement amount and outputs the corrected EMI characteristic as an additionally modified EMI characteristic. When, for example, the EMI characteristic is a characteristic corresponding to each frequency, a value obtained by subtracting the maximum EMI improvement amount from an EMI characteristic at each frequency is derived as the additional modified EMI characteristic.

Figure 19A:
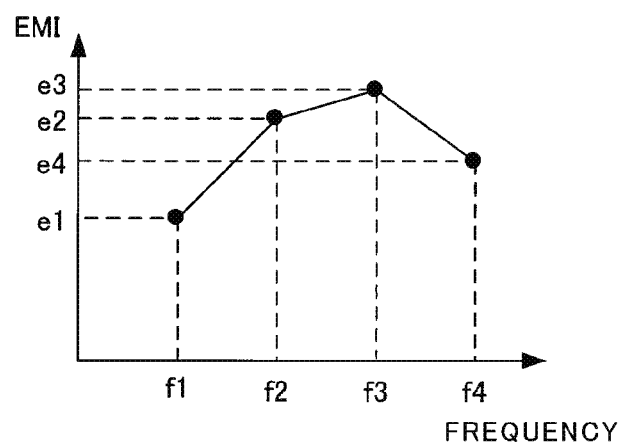
FIG. 19A is a chart illustrating an EMI characteristic calculated by an EMI characteristic calculation unit.
Figure 19B:
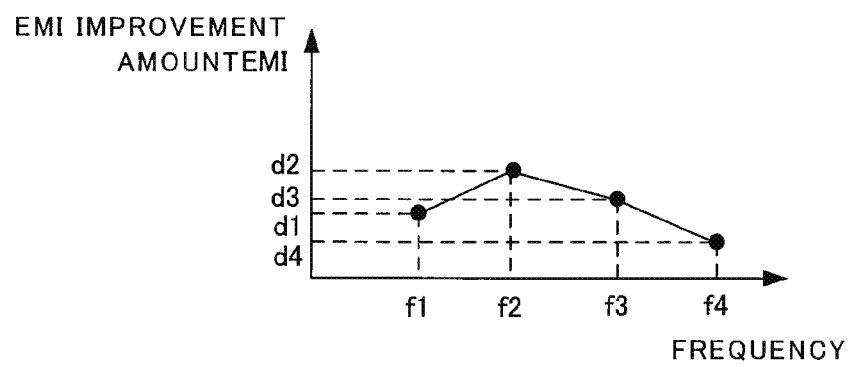
FIG. 19B is a chart illustrating an EMI improvement amount.
Figure 19C:
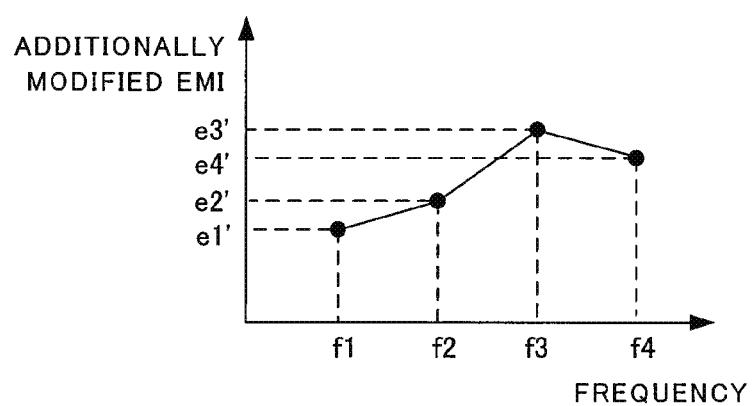
FIG. 19C is a chart illustrating an additionally modified EMI characteristic.

A specific example will be described with reference to FIG. 19. FIG. 19 is a chart exemplarily illustrating an EMI characteristic, an EMI characteristic improvement amount, and an additionally modified EMI characteristic. FIG. 19A illustrates an EMI characteristic calculated by the EMI characteristic calculation unit 11 in step SD10_3; FIG. 19B illustrates an EMI improvement amount derived by the modification unit 15A in step SD6_2; and FIG. 19C illustrates an additionally modified EMI characteristic obtained by improving the EMI characteristic of FIG. 19A based on the improvement amount of the EMI characteristic of FIG. 19B.

Therefore, additionally modified EMI characteristics at frequencies f1, f2, f3, and f4 are e1'=e1−d1, e2'=e2−d2, e3'=e3−d3, and e4'=e4−d4, respectively.

This additionally modified EMI characteristic is an EMI characteristic obtained based on the additionally modified design information from the additional modification unit 16A of FIG. 14 and an EMI characteristic of the board reflected with the configuration modifications performed by the modification unit 15A and the additional modification unit 16A.

Frequency dependency of an EMI characteristic and an improvement amount thereof has been here presented as an example, but information to be applied is not limited thereto as long as the EMI characteristic and the improvement amount are calculable.

Figure 21:
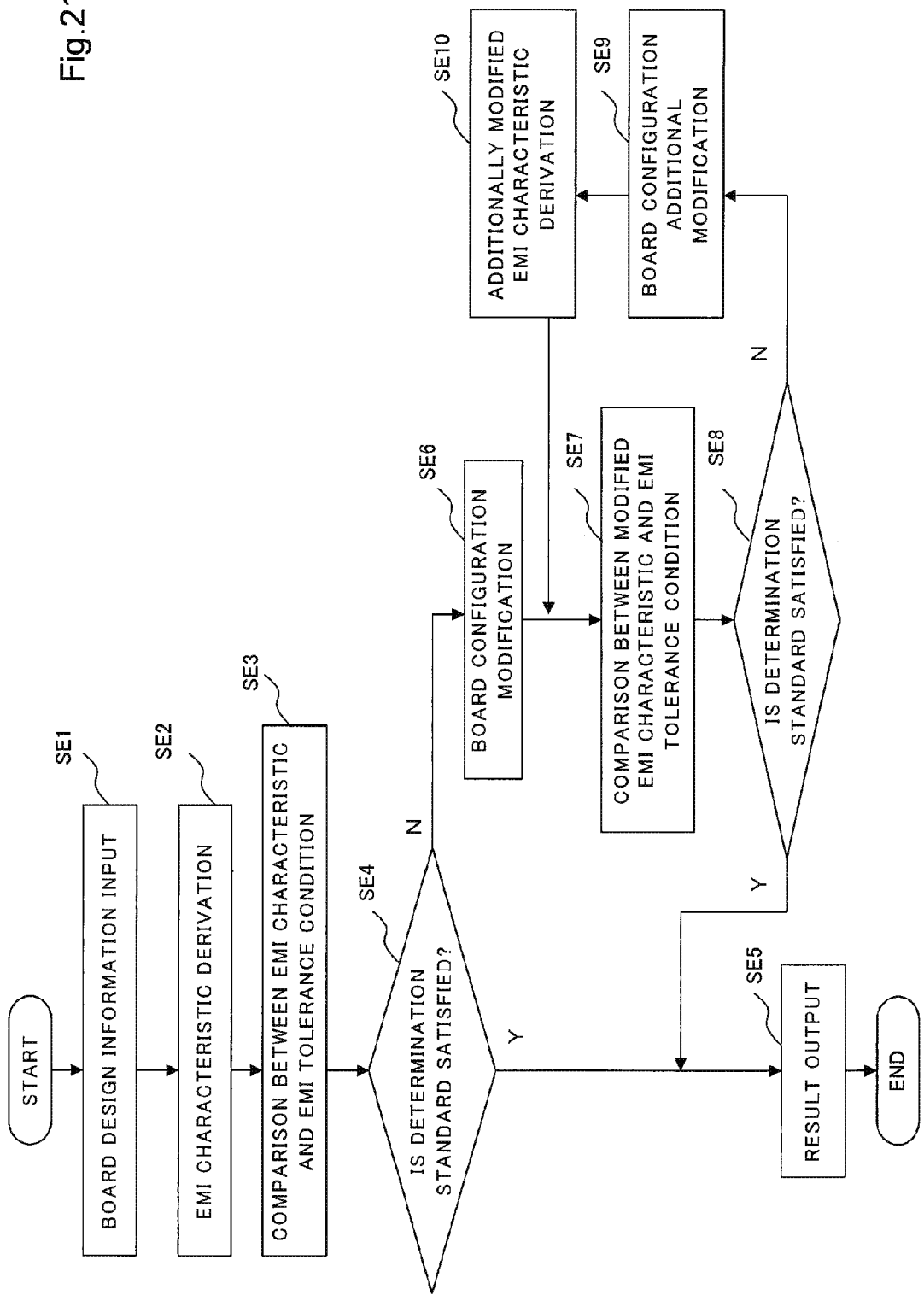
FIG. 21 is a flowchart illustrating a processing procedure of the board design device illustrated in FIG. 20.

The present exemplary embodiment is not limited to the above configuration. For example, a board design device 200E as illustrated in FIG. 20 is employable. FIG. 21 is a flowchart illustrating a processing procedure in the board design device 200E. The board design device 200E has a configuration in which the EMI characteristic derivation unit 2B of the board design device 200D illustrated in FIG. 14 was changed to the EMI characteristic derivation unit 2C of the board design device 200C illustrated in FIG. 10 in the third exemplary embodiment. The EMI characteristic derivation unit 2C has been described in the board design device 200D in the third exemplary embodiment. Therefore, a processing procedure is the same as the procedure previously described. In other words, processing of step SE1 to step SE5 are the same as those of step SC1 to step SC5 illustrated in FIG. 11, respectively, and processing of step SE6 to step SE10 are the same as those of step SD6 to step SD10 illustrated in FIG. 15, respectively.

As described above, since the configuration modification unit is divided into a modification unit and an additional modification unit and also these units are operated with algorisms independent of each other, priority and different processing methods are applicable to processing contents of the modification unit and the additional modification unit. Therefore, a configuration modification with a high degree of freedom can be performed. In other words, a board can be efficiently designed.

Further, even when a content of an additionally modified configuration is not directly reflectable in design information, selection of a processing method in additional board modification processing makes it possible to derive an additionally modified EMI characteristic.

Therefore, the board configuration is modified efficiently, appropriately, and inexpensively.

Fifth Exemplary Embodiment

Next, a fifth exemplary embodiment of the present invention will be described. Description of the same configuration as in the respective exemplary embodiments will be omitted using the same reference sign, as appropriate.

Figure 22:
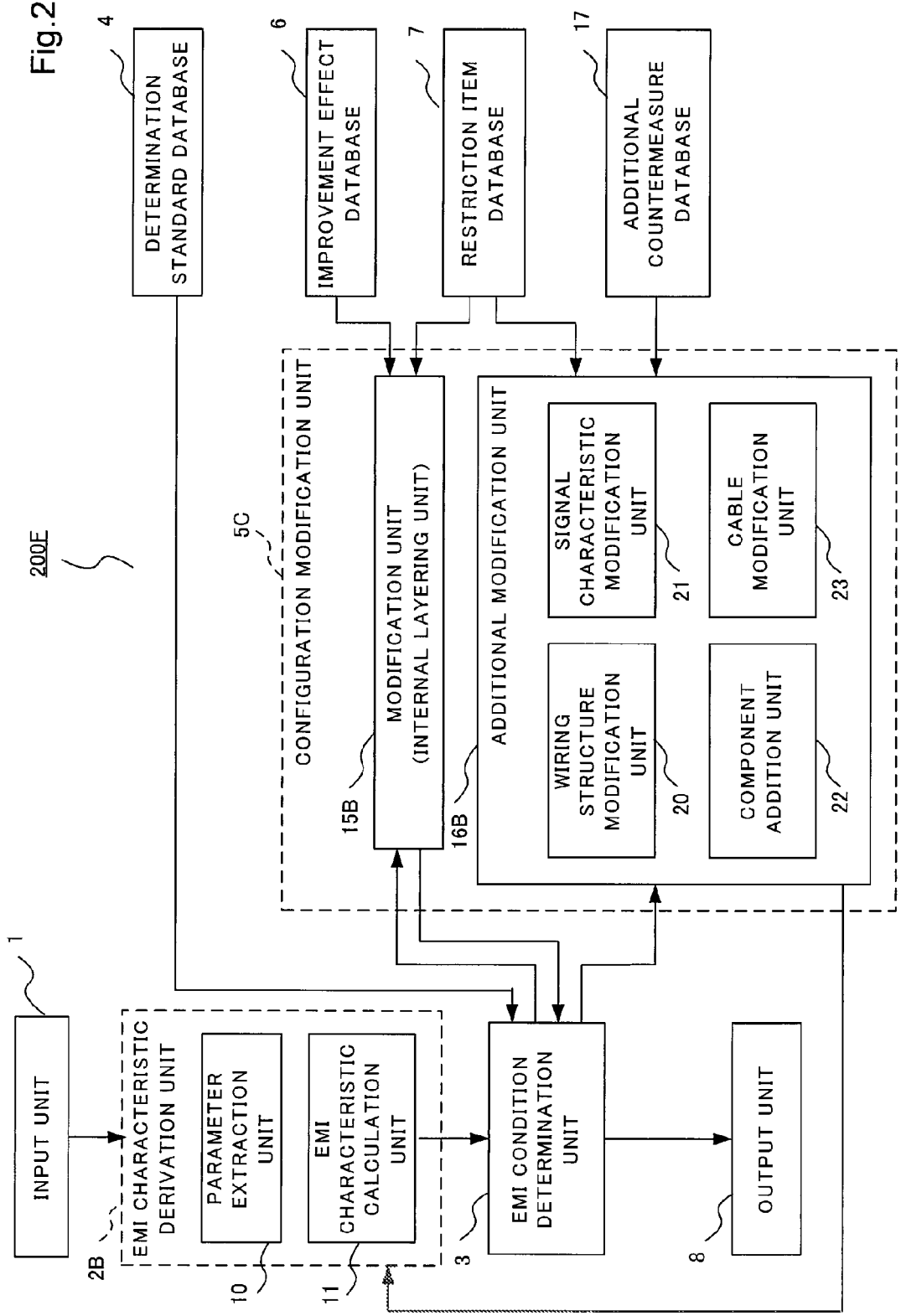
FIG. 22 is a block diagram of a board design device according to a fifth exemplary embodiment of the present invention.

FIG. 22 is a block diagram of a board design device 200F according to the fifth exemplary embodiment.

The board design device 200F according to the present exemplary embodiment differs in a respect in which the configuration modification unit 5B in the board design device 200D according to the fourth exemplary embodiment was changed to the configuration modification unit 5C. The configuration modification unit 5C includes a modification unit 15B and an additional modification unit 16B. Further, the additional modification unit 16B includes a wiring structure modification unit 20, a signal characteristic modification unit 21, a component addition unit 22, and a cable modification unit 23.

The modification unit 15B modifies an internal layering rate of a wiring in a board. Due to this meaning, in FIG. 22, the modification unit is read as an internal layering unit. The modification of the internal layering rate includes cases where internal layering is newly performed and internal layering is partially performed.

In such a configuration, when the EMI condition determination unit 3 determines that a basic EMI characteristic does not satisfy an EMI tolerance condition, the modification unit 15B acquires a modification guideline regarding internal layering of a wiring from the improvement effect database 6 and an improvement effect of the EMI characteristic expectable when performing internal layering in accordance with this modification guideline. Further, the modification unit 15B acquires a restriction item regarding internal layering of the wiring from the restriction item database 7.

Thereafter, the modification unit 15B determines whether a configuration modification according to the modification guideline is tolerated by the restriction item, and when tolerated, modifies an internal layering rate of the wiring in accordance with the modification guideline. Design information according to this modification is designated as modified design information. The modification unit 15B calculates a modified EMI characteristic based on this modified design information. The modified design information and the modified EMI characteristic are output to the EMI condition determination unit 3.

The EMI condition determination unit 3 determines whether the modified EMI characteristic satisfies the EMI tolerance condition. When the modified EMI characteristic is determined not to satisfy the EMI tolerance condition, the basic design information, the basic EMI characteristic, the modified design information, the modified EMI characteristic, and the EMI tolerance condition are output to the additional modification unit 16B.

The additional modification unit 16B includes the wiring structure modification unit 20, the signal characteristic modification unit 21, the component addition unit 22, and the cable modification unit 23 as described above. The wiring structure modification unit 20 executes modification processing regarding a wiring structure such as a thickness and the like of a wiring. The signal characteristic modification unit 21 executes modification processing regarding an electrical characteristic such as an impedance and the like of the wiring. The component addition unit 22 performs a modification regarding component addition such as an addition of a termination resistor and the like. The cable modification unit 23 executes modification processing regarding a peripheral component for cable length and the like. The cable is here exemplified as an antenna of EMI but may be an AC line or the like.

When receiving the basic design information, the basic EMI characteristic, the modified design information, the modified EMI characteristic, and the EMI tolerance condition from the EMI condition determination unit 3, the additional modification unit 16B acquires an additional modification guideline and an additional improvement effect from the additional countermeasure database 17 and also acquires a restriction item corresponding to a content of the additional modification guideline from the restriction item database 7.

The additional modification unit 16B performs an additional modification for the board configuration based on these pieces of information and creates additionally modified design information. This additionally modified design information is output to the EMI characteristic derivation unit 2B.

Then, the EMI characteristic derivation unit 2B calculates an added EMI characteristic in accordance with the procedure described in the fourth exemplary embodiment.

In this manner, only when an EMI characteristic of a board subjected to a configuration modification by the modification unit 15B does not satisfy an EMI tolerance condition, the additional modification unit 16B newly performs an additional modification for a board configuration. Therefore, a configuration modification of the board is efficiently performed so as to satisfy the EMI tolerance condition.

Next, a modified example of an internal layering rate of a wiring in the modification unit 15B will be described. FIG. 23 is a view illustrating a modified example of an internal layering rate of a wiring; FIG. 23A is a top view of a board; and FIG. 23B is an A-A sectional view in FIG. 23A. On the left side of FIG. 23A and FIG. 23B each, a board prior to internal layering is illustrated, and on the right side thereof, the board after internal layering is illustrated.

In the board, a substrate 80 is mounted with a transmission side device 81 and a reception side device 82, and these are connected by a wiring 83. Further, the substrate 80 is mounted with a connector 84, and the connector 84 is connected with a cable 85. The substrate 80 is a multi-layer substrate including a plurality of dielectric layers 80a, a power supply wiring layer 80b, and a GND wiring layer 80c. It is assumed that the wiring 83 includes a surface layer wiring 83a formed on a top face of the substrate 80 and an interlayer wiring 83b formed in an internal layer of the substrate 80. However, in this description, it is assumed that prior to modification of an internal layering rate of a wiring, only the surface layer wiring 83a is present and after modification of the internal layering rate, a part of the surface layer wiring 83a is changed to the interlayer wiring 83b.

In such a configuration, the cable 85 acts as an antenna due to signal current flowing through the wiring 83 and unnecessary electromagnetic wave radiation is generated. At that time, when a part of the surface layer wiring 83a is changed to the interlayer wiring 83b, coupling between the interlayer wiring 83b and the cable 85 is blocked, although partially, by a power supply wiring of the power supply wiring layer 80b and a GND wiring of the GND wiring layer 80c, and this effect reduces an unnecessary electromagnetic wave radiation amount.

To perform internal layering of the wiring 83 in such a manner, of course, information of a relocation destination is necessary. When there is no vacant space in the relocation destination, a countermeasure such as increasing the number of layers of the substrate 80 and the like is needed. However, an increase in the total number causes an increase in member cost. Further, even when there is no need for increasing the number of layers, a sufficient effect may not be obtained from internal layering with a possibility of performing internal layering for only a small portion of a wiring (only a short length thereof). Such conditions are restriction items in wiring internal layering.

Figure 24A:
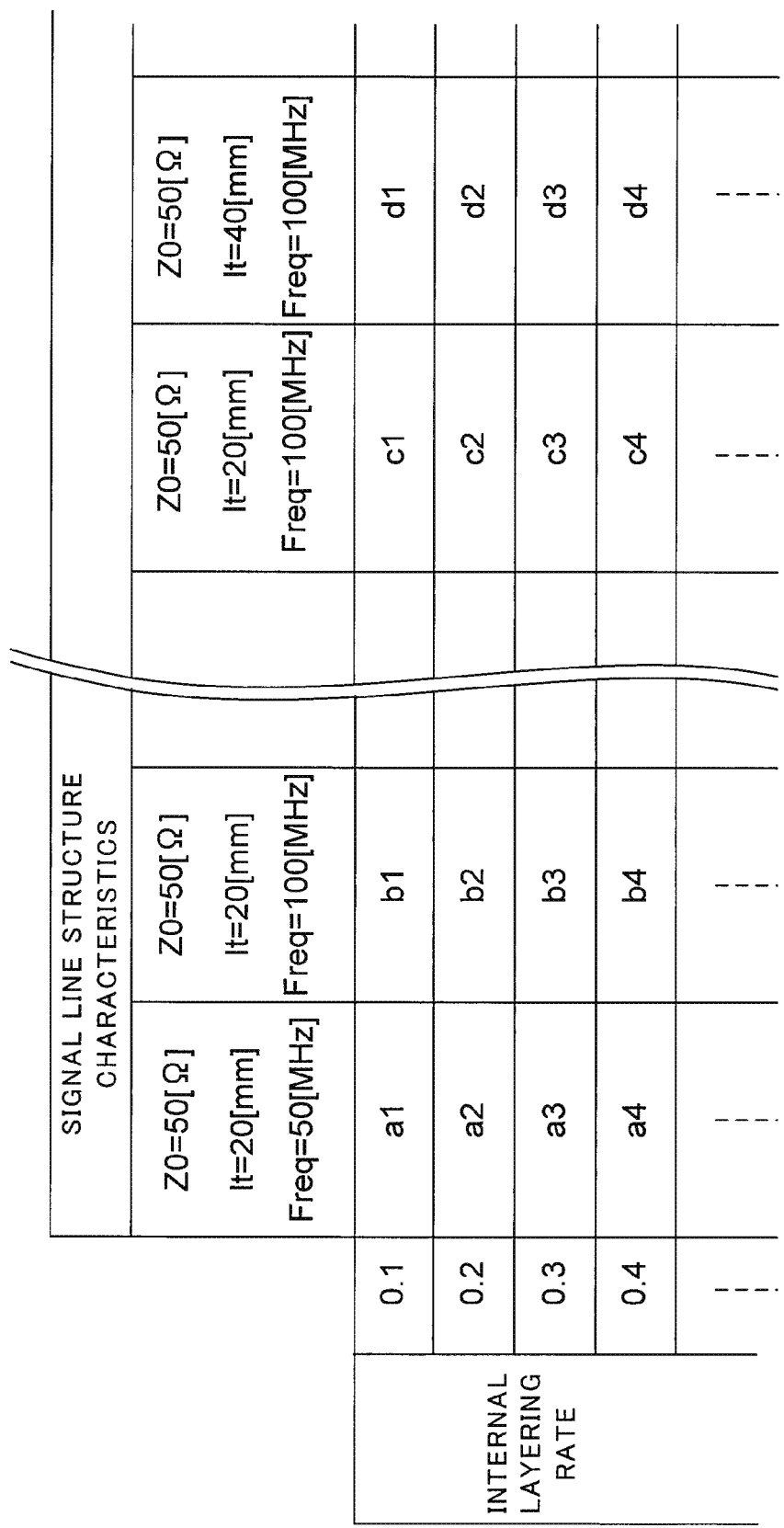
FIG. 24A is a chart illustrating improvement effects when changing an internal layering rate with respect to signal line structure characteristics such as impedance, length, and the like of a wiring, exemplarily illustrating the improvement effects using a table format.
Figure 24B:
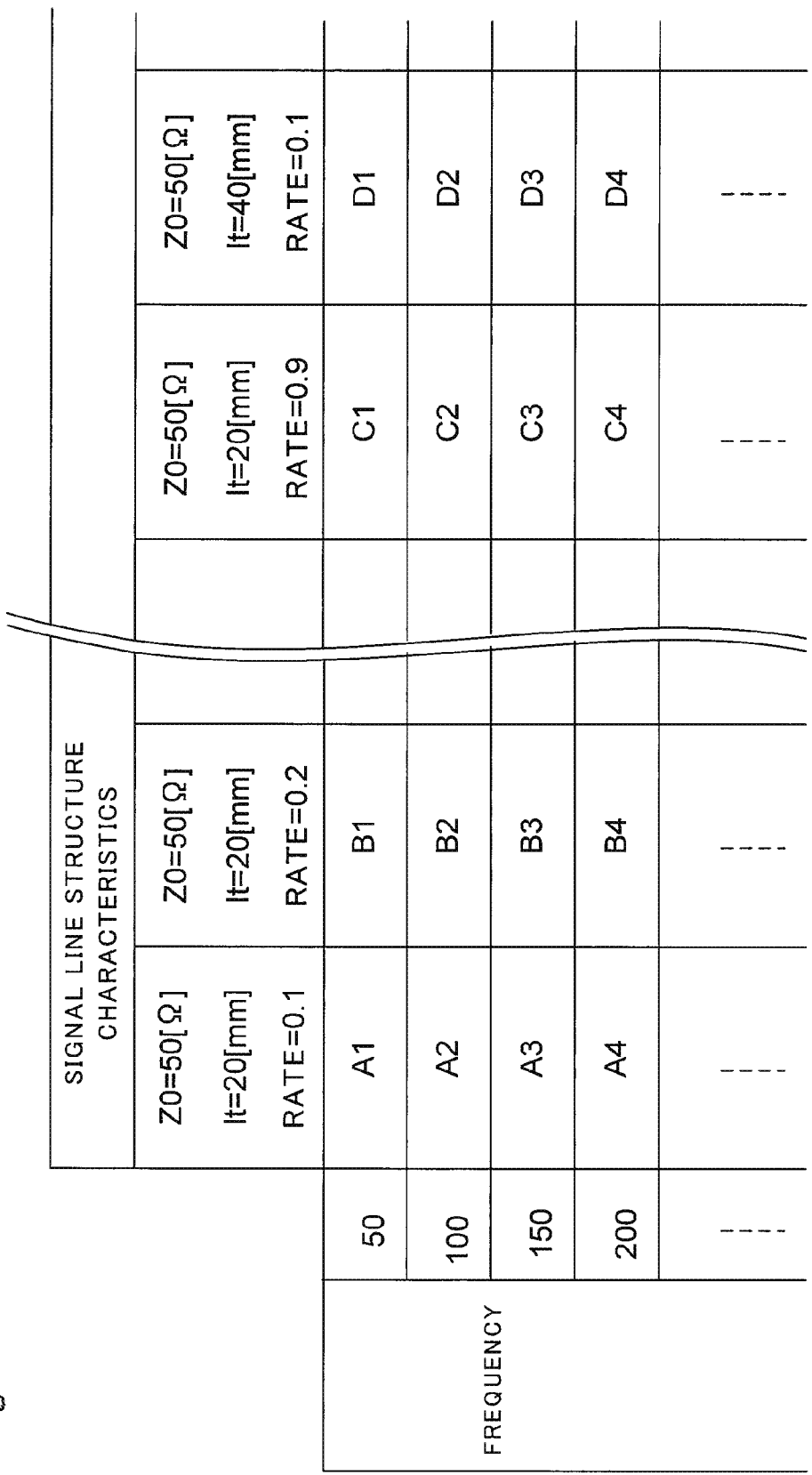
FIG. 24B is a chart illustrating improvement effects when changing a frequency with respect to signal line structure characteristics, exemplarily illustrating the improvement effects using a table format.

An improvement effect may be represented, for example, as data of a table format as illustrated in FIG. 24 or data of a graph format as illustrated in FIG. 25. FIG. 24A is a chart illustrating, in a table format, EMI improved characteristics (a1 . . . , b1 . . . , and the like) when changing an internal layering rate with respect to signal line structure characteristics including an impedance (Z0) and a length (It) of the wiring 83 and a frequency (Freq) of a signal flowing through the wiring 83. Further, FIG. 24B is a chart illustrating, in a table format, EMI improved characteristics (A1 . . . , B1 . . . , and the like) when changing a frequency with respect to signal line structure characteristics.

On the other hand, FIG. 25A is a chart where the data illustrated in FIG. 24A is graphed, and FIG. 25B is a chart where the data illustrated in FIG. 24B is graphed.

As is understood from FIG. 24 and FIG. 25, an improvement effect produced by internal layering of the wiring 83 differs depending on the internal layering rate, the frequency, and the signal line characteristics. Therefore, a modification guideline and an improvement effect are preferably stored by being associated with corresponding conditions.

In FIG. 24 and FIG. 25, an improvement effect is expressed as data but may be converted to a function to be stored in the improvement effect database 6.

Figure 26:
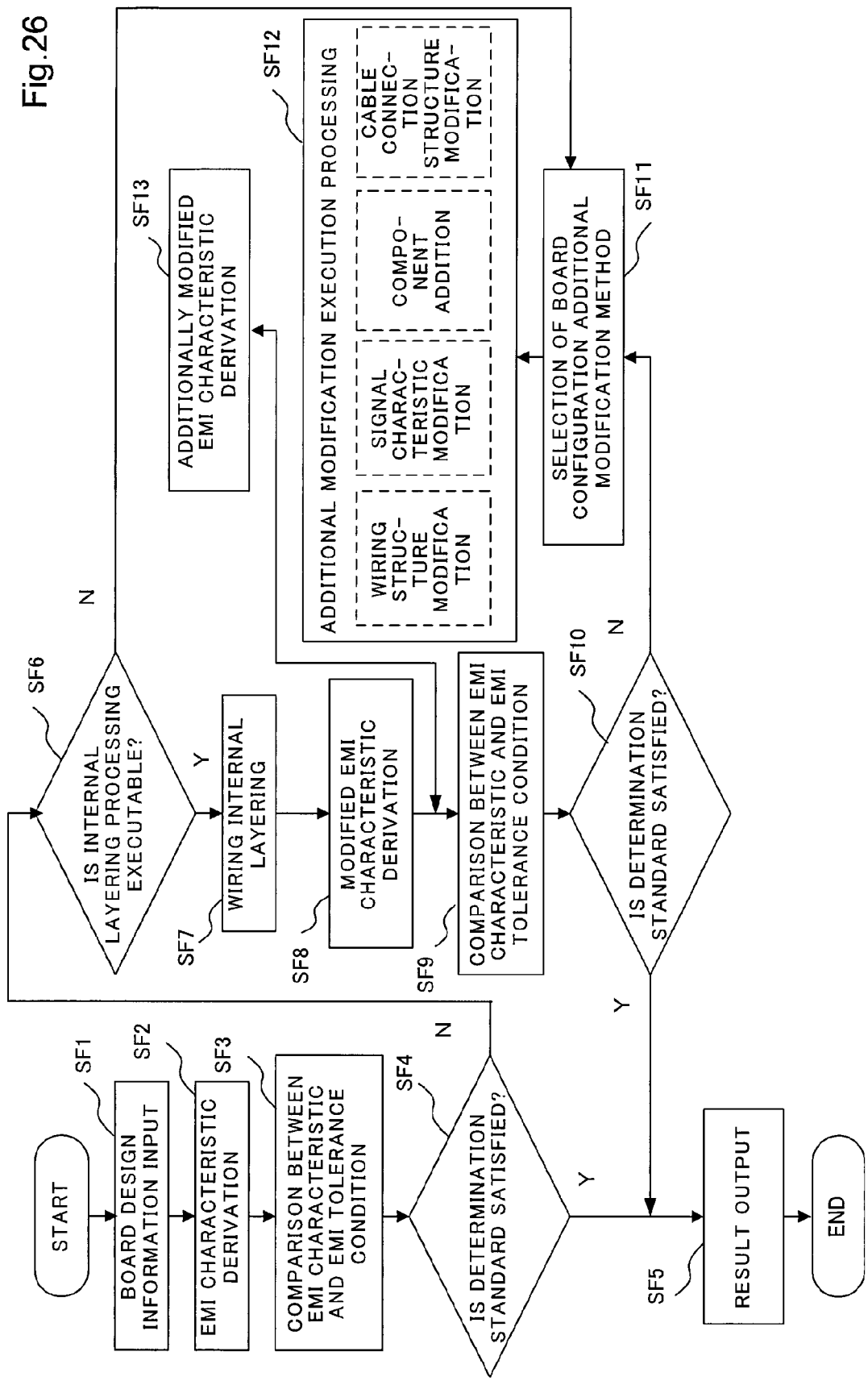
FIG. 26 is a flowchart illustrating a processing procedure of a board design device.

Next, such processing of the board design device 200F will be described with reference to the flowchart illustrated in FIG. 26. A processing procedure is substantially the same as the procedure illustrated in FIG. 15 but differs in step SF6 to step SF16. In other words, step SF1 to step SF5 correspond to step SD1 to step SD5, respectively. Therefore, in the following description, step SF6 and steps after this step will be described in detail.

Step SF6: (Wiring Internal Layering Determination Processing)

When the EMI condition determination unit 3 determines that the basic EMI characteristic does not satisfy the EMI tolerance condition, the basic design information, the basic EMI characteristic, and the EMI tolerance condition are output to the modification unit (internal layering unit) 15B. The modification unit 15B acquires a modification guideline and an improvement effect from the improvement effect database 6 and acquires a restriction item corresponding to the modification guideline from the restriction item database 7.

Then, the modification unit 15B determines, from the acquired modification guideline and restriction item, whether internal layering processing of a wiring can be performed (whether an internal layering rate can be increased).

A case is considered, for example, in which increasing the number of layers of the board makes it possible to increase an internal layering rate of a wiring. The modification unit 15B determines whether increasing the number of layers of the board is restricted by the restriction item. From a reason in which increasing the number of layers of the board causes an increase in component cost and others, when the restriction item restricts such a configuration modification, the modification unit 15B determines that internal layering processing of the wiring is difficult to execute. As a determination result at that time, information indicating that "there is no increase in the internal layering rate" is derived together. Hereinafter, this state is calculated as 0 when an increase rate of the internal layering rate is determined.

Step SF7: (Wiring Internal Layering Processing) On the other hand, when internal layering processing of the wiring is not restricted (is tolerated) by the restriction item (e.g., up to a maximum of 90% or the like for internal layering of a wiring), the modification unit 15B executes internal layering processing of the wiring.

Figure 27:
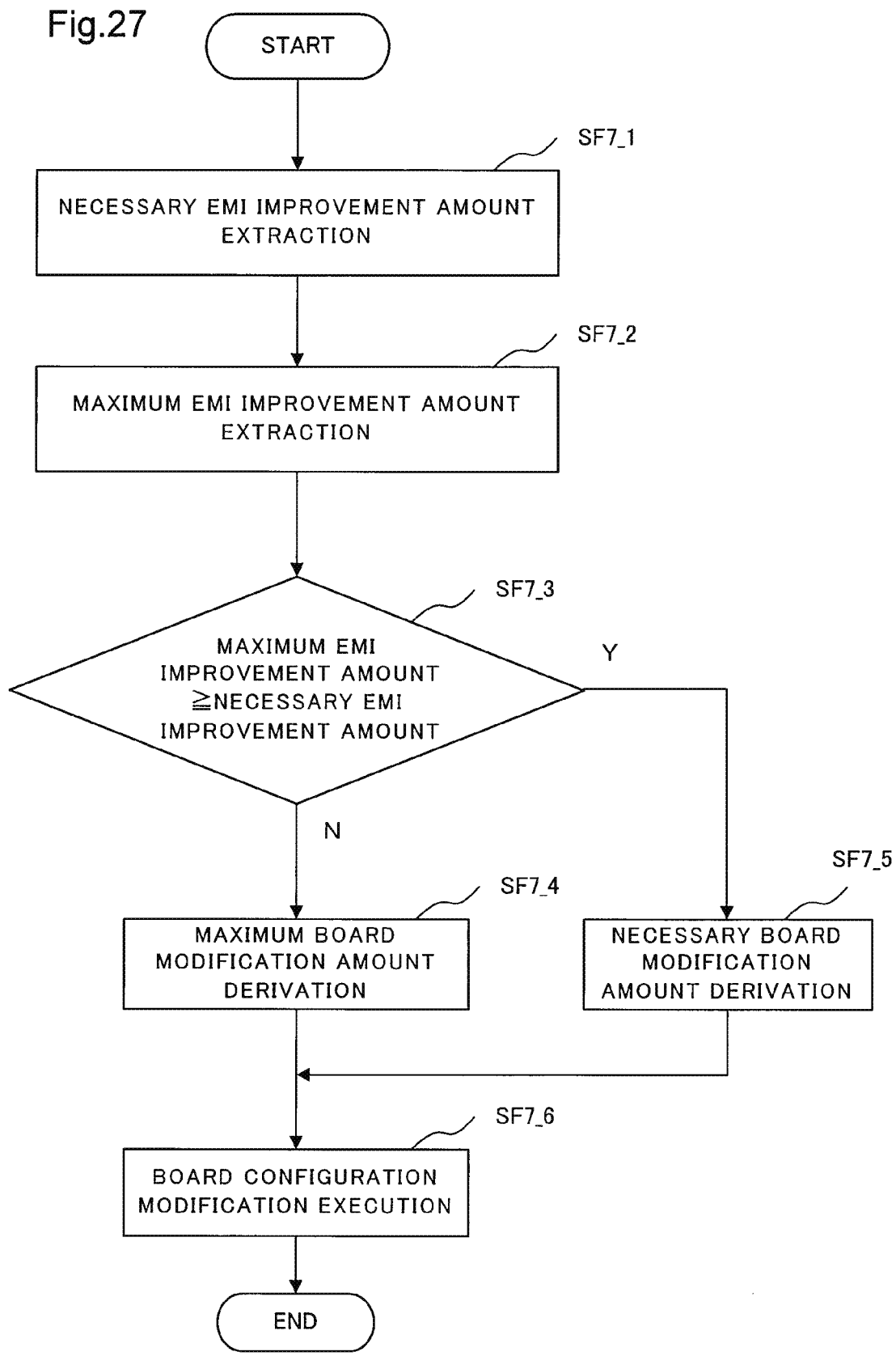
FIG. 27 is a flowchart illustrating an internal layering processing procedure.

FIG. 27 is a flowchart illustrating this internal layering processing procedure and is basically the same as the board configuration modification processing illustrated in FIG. 16.

Step SF7_1: (Necessary EMI Improvement Amount Extraction Processing)

Initially, the modification unit 15B compares a basic EMI characteristic and an EMI tolerance condition and derives a necessary EMI improvement amount. This necessary EMI improvement amount is an EMI improvement amount indicating what kind of modification for the EMI characteristic allows the EMI tolerance condition to be satisfied.

When, for example, the derived basic EMI characteristic is an EMI characteristic value for each frequency and the EMI tolerance condition indicates an upper limit of the EMI characteristic value for each frequency, the necessary EMI improvement amount is derivable by subtracting, from an upper limit value of an EMI tolerance condition in each frequency, a value of a basic EMI characteristic in the corresponding frequency.

Step SF7_2: (Maximum EMI Improvement Amount Extraction Processing)

Then, the modification unit 15B extracts a maximum EMI improvement amount in accordance with the modification guideline, the improvement effect, and the restriction item. This maximum EMI improvement amount is a maximum improvement amount of an EMI characteristic obtained by wiring internal layering processing in a range allowed by the restriction item.

Step SF7_3: (EMI Improvement Amount Comparison Processing)

Then, the modification unit 15B determines by comparison whether the maximum EMI improvement amount is larger than the necessary EMI improvement amount. At that time, when the maximum EMI improvement amount is smaller than the necessary EMI improvement amount (the maximum EMI improvement amount21 the necessary EMI improvement amount), the processing moves to step SF7_4, but when the maximum EMI improvement amount is at least the necessary EMI improvement amount (the maximum EMI improvement amount≥the necessary EMI improvement amount), the processing moves to step SF7_5.

Step SF7_4: (Maximum Board Modification Amount Derivation Processing)

When the maximum EMI improvement amount is smaller than the necessary EMI improvement amount (the maximum EMI improvement amount<the necessary EMI improvement amount), the modification unit 15B derives a maximum board modification amount. This maximum board modification amount is a modification amount indicating a configuration modification performed to improve the basic EMI characteristic by the maximum EMI improvement amount and is a maximum amount of an internal layering rate of a wiring when performing a modification as far as a restriction item allows, based on a modification guideline and the restriction item stored in the improvement effect database 6 and the restriction item database 7, respectively.

Step SF7_5: (Necessary Board Modification Amount Derivation Processing)

The modification unit 15B derives a necessary board modification amount which is an internal layering rate necessary to improve the basic EMI characteristic by the necessary EMI improvement amount. This processing automatically performs a derivation of the necessary board modification amount by storing data indicating a correlation among improvement amounts of EMI characteristics at respective frequencies when modifying a part of a board configuration in the improvement effect database 6.

Step SF7_6: (Board Configuration Modification Execution Processing)

Then, the modification unit 15B performs internal layering processing of the wiring in accordance with an internal layering rate derived by the necessary board modification amount derivation processing or the maximum board modification amount derivation processing and designates this result as modified design information.

Step SF8: (Modified EMI Characteristic Derivation Processing)

Description will be continued by returning to FIG. 27. The wiring internal layering processing completes the board configuration modification processing and therefore, the modification unit 15B derives a modified EMI characteristic based on the modified design information. Then, the modified design information and the modified EMI characteristic are output to the EMI condition determination unit 3.

Steps SF9 and SF10: (EMI Tolerance Condition Determination)

The EMI condition determination unit 3 compares the received modified EMI characteristic and the EMI tolerance condition and determines whether the modified EMI characteristic satisfies the EMI tolerance condition. As a result of this determination, when the modified EMI characteristic satisfies the EMI tolerance condition, the processing moves to step SF5, but when no satisfaction is obtained, the processing moves to step SF11. In other words, the basic design information, the basic EMI characteristic, the EMI tolerance condition, the modified design information, and the modified EMI characteristic are output to the additional modification unit 16B.

Step SF11: (Additional Modification Method Selection Processing)

When receiving the basic design information and the others from the EMI condition determination unit 3, the additional modification unit 16B selects a content (method) for additionally modifying the board configuration. As this selected content, wiring structure modification processing, signal characteristic modification processing, countermeasure component addition processing, and cable structure modification processing can be exemplified. In selection of the method, an automatic selection is performed correspondingly to a content of an additional modification guideline. Of course, a user can indicate the method.

Step SF12: (Additional Modification Execution Processing)

The additional modification unit 16B additionally modifies the board in accordance with the selected additional modification method. The wiring structure modification processing, the signal characteristic modification processing, the countermeasure component addition processing, and the cable structure modification processing will be specifically described.

[Wiring Structure Modification Processing]

Figure 28:
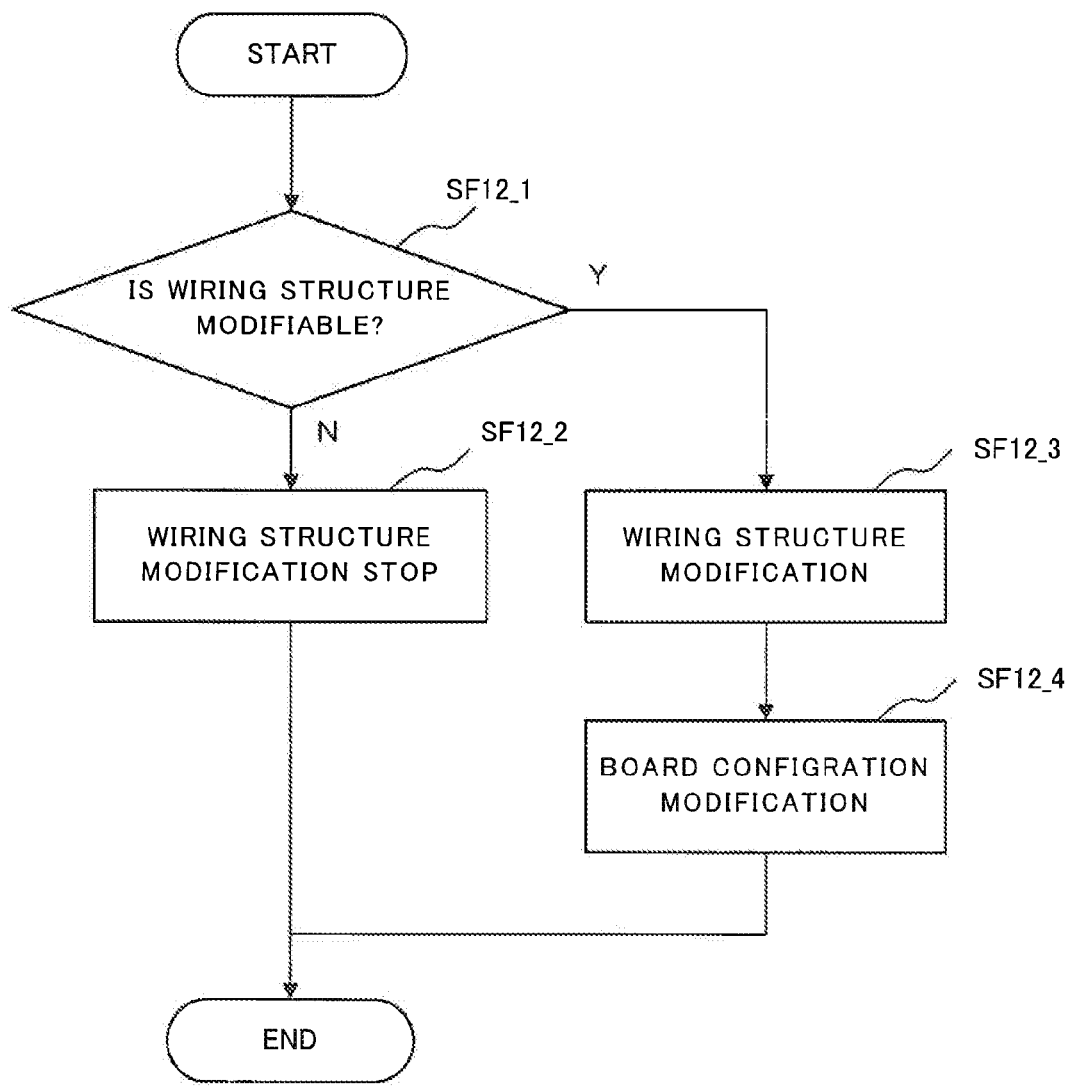
FIG. 28 is a flowchart illustrating a specific processing procedure of wiring structure modification processing.

Initially, the wiring structure modification processing is described. FIG. 28 is a flowchart illustrating a specific processing procedure of the wiring structure modification processing. This processing is executed in the wiring structure modification unit 20.

Step SF12_1: (Wiring Structure Modification Yes/No Processing)

The wiring structure modification unit 20 determines whether a configuration modification of the wiring is possible in accordance with the additional modification guideline and the restriction item. Then, when the configuration modification of the wiring is determined to be impossible, the processing moves to step SF12_2, but when the modification of the wiring configuration is determined to be possible, the processing moves to step SF12_3.

Step SF12_2: (Wiring Structure Modification Stop Processing)

When the configuration modification of the wiring is determined to be impossible, no additional modification is performed and therefore, an EMI characteristic need not be newly derived. Therefore, the additional modification unit 16B outputs the basic design information, the basic EMI characteristic, the EMI tolerance condition, the modified design information, and the modified EMI characteristic received from the EMI condition determination unit 3 to the output unit 8 and then the processing ends. At that time, a fact in which no additional configuration modification has been performed may be notified.

Steps SF12_3 and SF12_4: (Wiring Configuration Modification Processing)

Figure 29A:
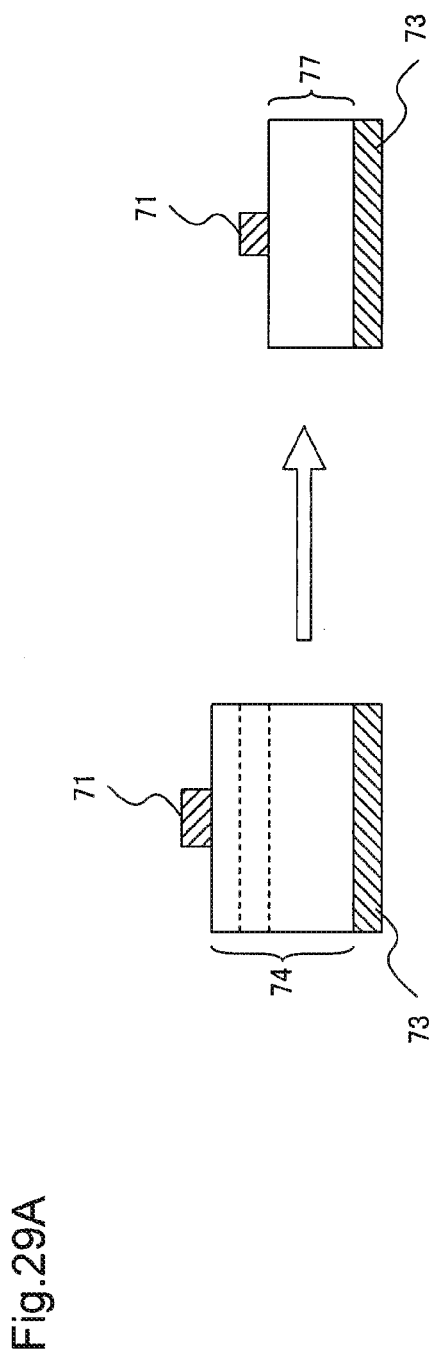
FIG. 29A is a sectional view of a board, illustrating a specific example of the wiring structure modification processing.
Figure 29B:
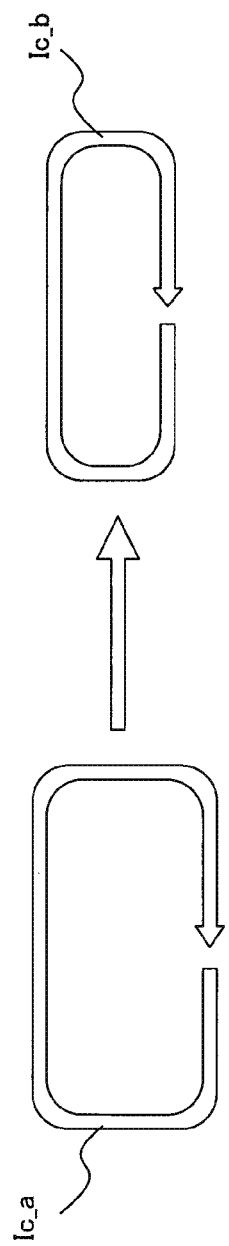
FIG. 29B is a view schematically illustrating common-mode current flowing circularly through a wiring and a GND wiring, illustrating a specific example of the wiring structure modification processing.

On the other hand, when the configuration modification of the wiring is determined to be possible, the configuration modification of the wiring is performed in accordance with the modification guideline. Then, the configuration modification of the wiring is reflected in the board configuration and then the processing ends. FIG. 29 is a view illustrating a specific example of the wiring structure modification processing; FIG. 29A is a sectional view of a board; and FIG. 29B is a view schematically illustrating common-mode currents Ic_a and Ic_b flowing circularly through a wiring 71 and a GND wiring 73. At that time, on the left side of FIG. 29, a configuration prior to wiring structure modification processing is illustrated, and on the right side thereof, a configuration after wiring structure modification processing is illustrated.

In the following description, a case where a thickness of a dielectric layer 74 is modified is exemplified. In other words, as illustrated in FIG. 29A, the common-mode current Ic_a which forms a loop as illustrated in the left figure of FIG. 29B flows between the wiring 71 and the GND wiring 73 of the GND layer. A thickness of the dielectric layer 74 is decreased to allow the loop to be small. This reduces the common-mode current Ic_b (refer to the right figure of FIG. 29B).

As a result of the wiring structure modification processing, the dielectric layer 74 is modified to a dielectric layer 77 having small thickness and a distance between the wiring 76 and the GND wiring 73 is decreased. At that time, a width of the wiring 71 is narrowed (adjusted) so that the impedance Z0 of the wiring is not changed.

In the wiring structure modification processing previously described with reference to FIG. 29, to reduce common-mode current, a distance between the wiring and the GND wiring was decreased. With such a structure modification, an impedance of the wiring is changed and therefore, an adjustment for reducing the wiring width or the like was performed so that this impedance had the same value.

The wiring width at that time may be adjusted to be at most 0.1 mm. However, when for the restriction item, an item in which, for example, "the wiring width is not allowed to be at most 0.1 mm" is specified, wiring structure modification processing for allowing the wiring width to be at most 0.1 mm is not performable. In other words, a signal characteristic modification becomes impossible. Therefore, the signal characteristic modification unit 21 determines whether a signal characteristic is modifiable in accordance with the additional modification guideline.

[Signal Characteristic Modification Processing]

Figure 30:
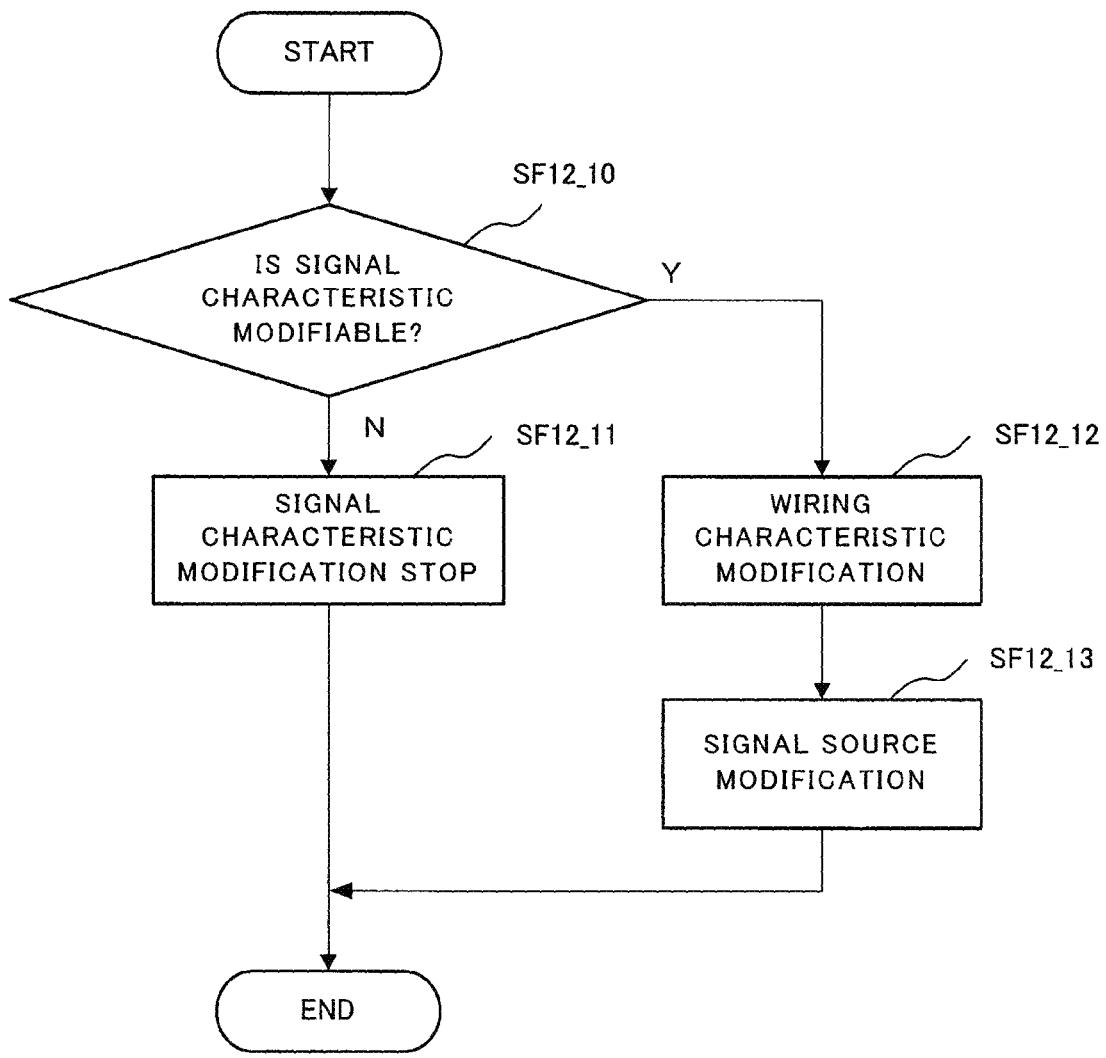
FIG. 30 is a flowchart illustrating a specific procedure of signal characteristic modification processing.

Next, signal characteristic modification processing will be described. This signal characteristic modification processing is executed by the signal characteristic modification unit 21. FIG. 30 is a flowchart illustrating a specific procedure of the signal characteristic modification processing.

Step SF12_10: (Signal Characteristic Modification Yes/No Determination Processing)

The signal characteristic modification unit 21 determines whether a signal characteristic is modifiable in accordance with an additional modification guideline base on the additional modification guideline and the restriction item. When the signal characteristic is determined not to be modifiable, the processing moves to step SF12_11, but when the signal characteristic is determined to be modifiable, the processing moves to step SF12_12.

Step SF12_11: (Wiring Characteristic Modification Stop Processing)

When a content of the additional modification falls under the restriction item, the additional modification unit 16B outputs the basic design information, the basic EMI characteristic, the EMI tolerance condition, the modified design information, and the modified EMI received as characteristics from the EMI condition determination unit 3 to the output unit 8. At that time, a fact in which no additional structure modification has been performed may be notified.

Steps SF12_12 and SF12_13: (Wiring Characteristic Modification Processing)

On the other hand, when the content of the additional modification does not fall under the restriction item, the additional modification unit 16B executes wiring characteristic modification processing. Further, with this wiring characteristic modification processing, the signal source is modified.

FIG. 31 is a chart illustrating a signal waveform when changing a rise time of a signal voltage by signal characteristic modification processing. FIG. 31A is a chart exemplarily illustrating a signal voltage V of a pulse signal as defined by a cycle T, a rise time $t_{r1}$, a fall time $t_{f1}$, and an ON time $T_{ON1}$. Further, FIG. 31B is a chart exemplarily illustrating a behavior of the signal voltage V of FIG. 31A toward a frequency f. In FIG. 31A and FIG. 31B each, the chart of the left side illustrates a characteristic prior to modification of a wiring characteristic and the chart of the right side illustrates a characteristic after modification. When as illustrated in FIG. 31A, the rise time $t_{r1}$ of the signal voltage V is changed to a larger rise time $t_{r2}$, in the frequency characteristic of the signal voltage illustrated in FIG. 31B, a voltage component at a frequency ($f_{r2}$ of FIG. 31B) resulting from the rise time is decreased. In other words, it is indicated that a high frequency component of the voltage is decreased and thereby a high frequency component of unnecessary electromagnetic wave radiation can be decreased. On the other hand, as one example of the restriction item, an item in which "ON time is not allowed to be less than ¼ of a cycle T" is conceivable, and when $T_{ON2} < \frac{1}{4} \times T$ is satisfied when increasing the rise time $t_{r1}$ to the rise time $t_{r2}$, this method is not usable. Therefore, in the signal characteristic modification yes/no determination processing of step SF12_10, the signal characteristic is determined not to be modifiable.

[Countermeasure Component Addition Processing]

Figure 32:
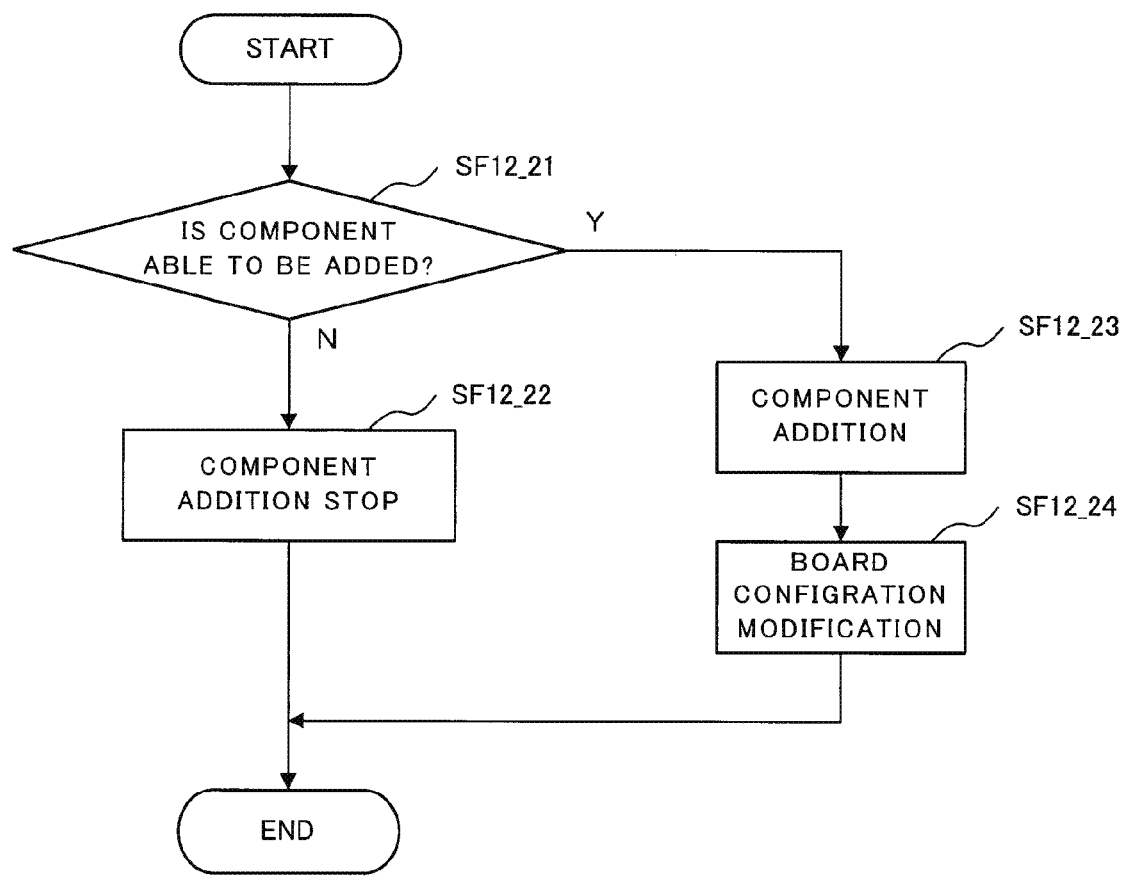
FIG. 32 is a flowchart illustrating a countermeasure component addition processing procedure.

Next, countermeasure component addition processing will be described with reference to FIG. 32 and FIG. 33. This countermeasure component addition processing is executed by the component addition unit 22. FIG. 32 is a flowchart illustrating a countermeasure component addition processing procedure. FIG. 33 illustrates a specific example of the countermeasure component addition processing.

Figure 33C:
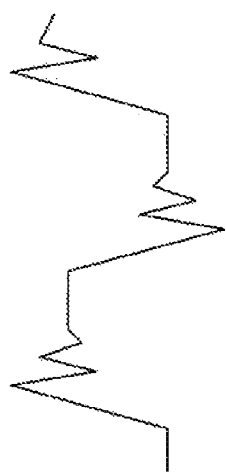
FIG. 33C is a chart schematically illustrating a voltage characteristic of a signal flowing through a wiring, illustrating a specific example of the countermeasure component addition processing.

FIG. 33 is a view as one example of the countermeasure component addition processing in which on the termination side of the wiring 83 (in the vicinity of an input termination of the reception side device 82), a resistance element 89 is added as a termination component. FIG. 33A is a partial top view of a board; FIG. 33B is an equivalent circuit model; and FIG. 33C schematically illustrates a voltage characteristic of a signal flowing through a wiring. The left side of FIG. 33 illustrates a chart prior to addition of a countermeasure component and the right side thereof illustrates a chart where a countermeasure component is added.

Step SF12_21: Initially, the component addition unit 22 determines whether a countermeasure component can be added in accordance with a modification guideline and a restriction item.

When a countermeasure component is difficult to add, the processing moves to step SF12_22, and in a possible case, the processing moves to step SF12_23.

Step SF12_22:

When a countermeasure component is difficult to add, the countermeasure component addition processing stops and the processing ends with adding no countermeasure component. When the impedance Z0 of the wiring 83 is 75[Ω], a resistance element 89 of 75[Ω] is most effectively added. However, when an item in which, for example, "a component of at least 10 yen/piece is not allowed to be added is specified in the restriction item, at a price of at least 10 yen/piece for the resistance element 89 to be added, a countermeasure using the resistance element 89 is determined not to be taken, and then the processing ends.

Step SF12_23:

On the other hand, when a countermeasure component is determined to be able to be added, a countermeasure component is added. When, for example, the resistance element 89 is added to the wiring 83 (refer to FIG. 33A), in an equivalent circuit model, an impedance Zterm of the resistance element 89 is added between the wiring 83 and the reception side device 82 (refer to FIG. 33B). FIG. 33B illustrates an impedance of the resistance element 83 as Z0, an input capacitance of the reception side device 82 as Cin, and an impedance of the resistance element 89 as Zterm. At that time, when the termination of the wiring 83 is an open end, a voltage characteristic on the reception side of the wiring 83 may have a disturbed waveform including a high frequency component as illustrated in the left figure of FIG. 33C. In contrast, when the resistance element 89 having the impedance Zterm close to the impedance Z0 of the wiring 83 is added on the termination side, as illustrated in the right figure of FIG. 33C, the voltage characteristic on the reception side has a waveform including no high frequency component. Therefore, the high frequency component of the signal voltage is suppressed and thereby a high frequency component of unnecessary electromagnetic wave radiation can be decreased.

Step SF12_24:

Then, the board configuration is modified in association with countermeasure component addition. In FIG. 33, the resistance element 89 has been added to the wiring 83 in the vicinity of the reception side device 82. At that time, a modification such as placement of a connection pad and the like is necessary so that the resistance element 89 is connectable to the termination side of the wiring 83.

[Cable Structure Modification Processing]

Figure 34:
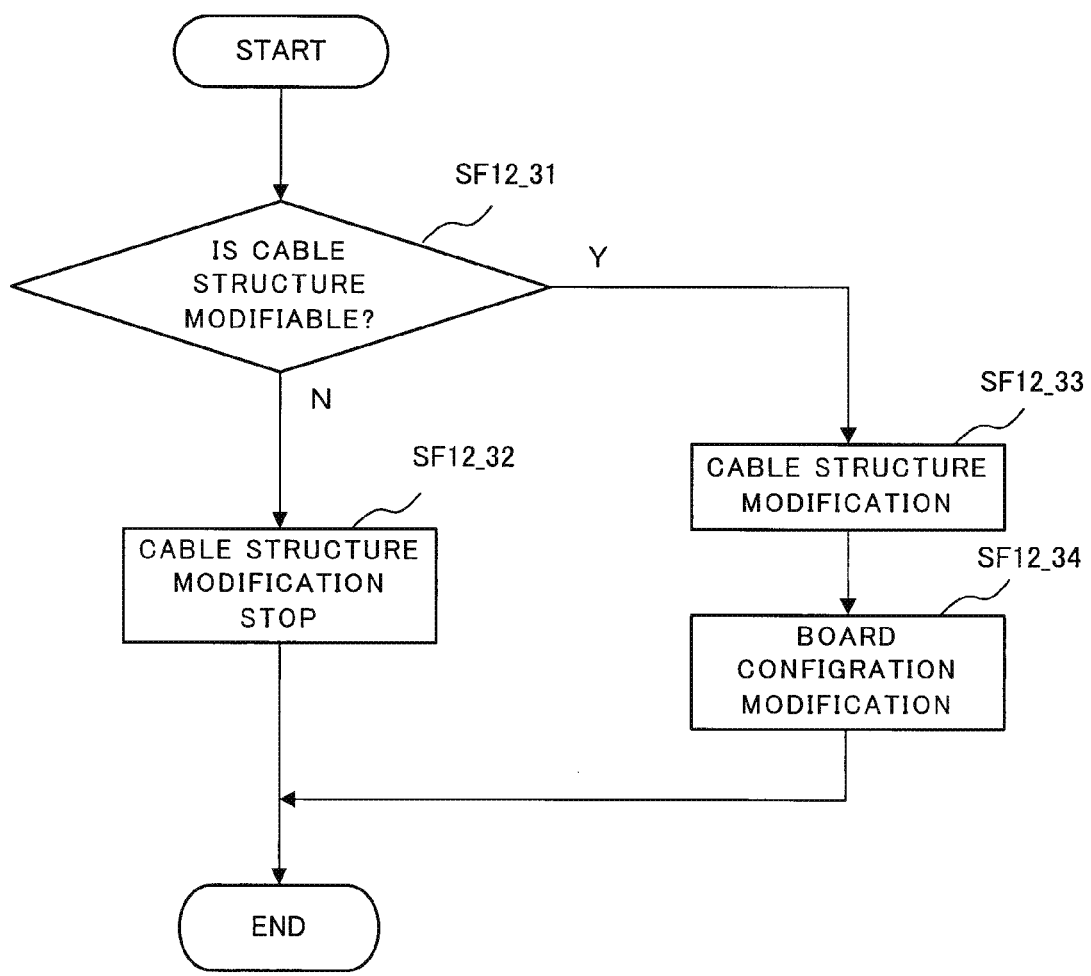
FIG. 34 is a flowchart illustrating cable structure modification processing.

Next, cable structure modification processing will be described. This cable structure modification processing is executed by the cable modification unit 23. FIG. 34 is a flowchart illustrating the cable structure modification processing. Further, FIG. 35 is a view illustrating a specific example of the cable structure modification processing. FIG. 35A is a partial top view of a board when modifying a cable length, and FIG. 35B is a chart illustrating a radiation electric field characteristic with respect to a frequency at that time.

Step SF12_31:

Unnecessary electromagnetic wave radiation generated from the cable 85 tends to increase at a certain frequency (e.g., a frequency where the cable length corresponds to ¼ of a wavelength) since the cable 85 acts as an antenna. Therefore, the cable modification unit 23 determines whether a cable configuration is modifiable. This determination is a determination whether a restriction item tolerates a cable structure based on a modification guideline. When the cable structure is determined not to be modifiable, the processing moves to step SF12_32, and when being determined to be modifiable, the processing moves to step SF12_33.

Step SF12_32:

When the cable structure is determined not to be modifiable, the cable structure modification processing ends. For example, a case in which a restriction item is specified as an item in which "the cable length is not allowed to be at least 2 m" is considered. At that time, when a frequency where the cable length is increased to correspond to ¼ of the wavelength is decreased, the cable length may become at least 2 m. In such a case, it is difficult to perform a modification for increasing the cable length. Of course, a configuration modification is performable within the restriction item.

When the cable structure has not been modifiable, a message about this fact is preferably output.

Step SF12_33:

On the other hand, when the cable structure is determined to be modifiable, cable structure modification processing is executed. The cable 85 illustrated in FIG. 35A is modified so as to have long cable length as seen in the cable 90 illustrated in FIG. 35B. Thereby, as illustrated in FIG. 35B, the radiation electric field characteristic is changed from a maximum value $E_{MAX1}$ at a frequency fc1 (a frequency where the length of the cable 85 corresponds to a ¼ wavelength) to a maximum value $E_{MAX2}$ at a frequency fc2 (a frequency where the length of the cable 90 corresponds to a ¼ wavelength). In the frequencies at that time, a relation of fc1>fc2 is established and also a relation of $E_{MAX1}>E_{MAX2}$ is established. In other words, the cable length is increased and thereby the maximum value of the radiation electric field characteristic is shifted to a lower frequency (fc1→fc2) side.

Step SF12_34:

Then, board configuration modification processing for reflecting a result obtained by modifying the cable structure in the board configuration is executed and the cable structure modification processing ends. As the modification of the board configuration in this case, there can be exemplified a modification to the connector 84 such that a connection is made possible even when the cable becomes long.

Step SF13: (Additionally Modified EMI Characteristic Derivation Processing)

Figure 36:
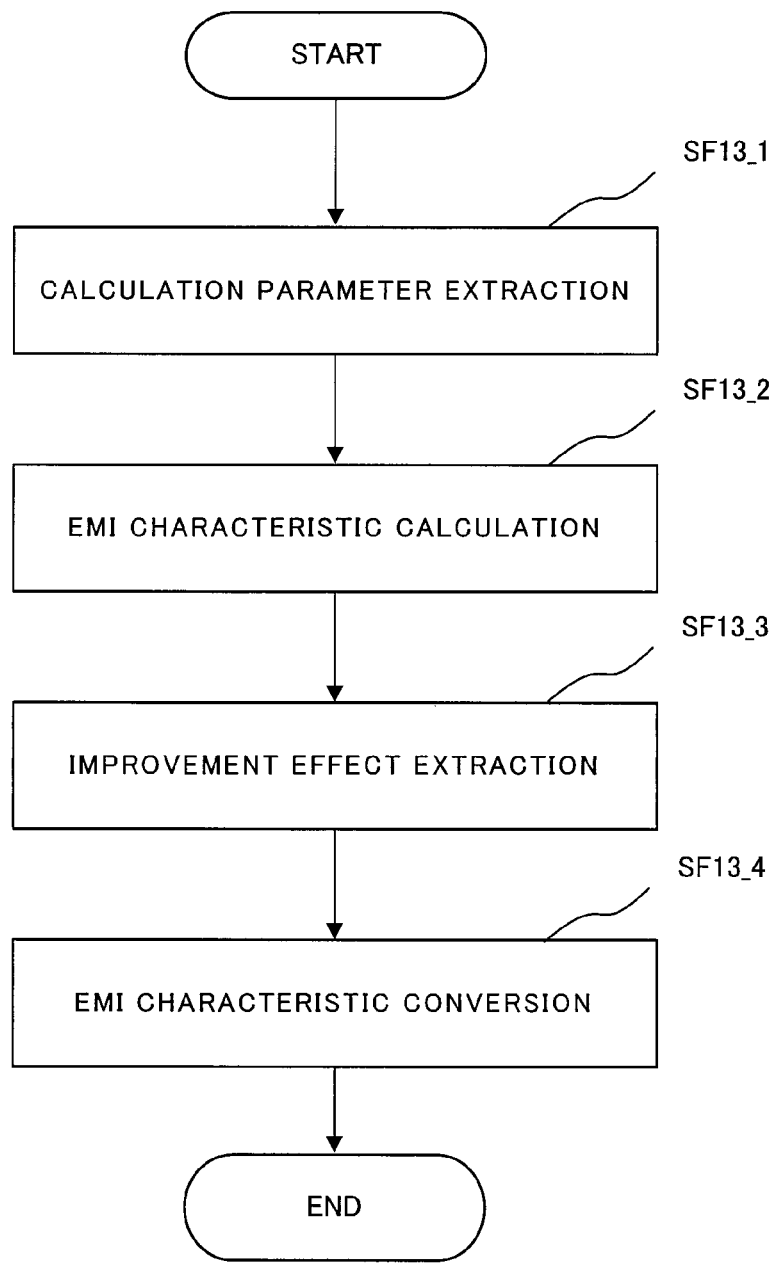
FIG. 36 is a flowchart illustrating an additionally modified EMI characteristic derivation procedure.

Description will be continued by returning to FIG. 26. When the additional modification execution processing ends, the additional modification unit 16B outputs additionally modified design information to the EMI characteristic derivation unit 2B. Then, the EMI characteristic derivation unit 2B derives an additionally modified EMI characteristic based on the additionally modified design information. This derivation procedure of the additionally modified EMI characteristic is described below with reference to FIG. 36. FIG. 36 is a flowchart illustrating an additionally modified EMI characteristic derivation procedure.

Step SF13_1:

The EMI characteristic derivation unit 2B extracts calculation parameters based on the additionally modified design information. At that time, the modified content of the board configuration modified in the modification unit 15B is not reflected. In other words, the calculation parameters are extracted based on only the additionally modified design information.

Step SF13_2:

Then, using the calculation parameters, an EMI characteristic is derived in accordance with a closed-form maximum radiation estimation method. As described above, the EMI characteristic is a characteristic calculated using parameters which characterize a configuration of a board additionally modified for the basic design information.

Step SF13_3:

After calculating the EMI characteristic, the EMI characteristic calculation unit 11 calculates an improvement effect of the EMI characteristic via wiring internal layering, from the EMI characteristic and the basic EMI characteristic.

Step SF13_4:

Then, the EMI characteristic calculation unit 11 executes EMI characteristic conversion processing. This EMI characteristic conversion processing determines an additionally modified EMI characteristic using a method in which the improvement amount of the EMI characteristic derived from the additionally modified design information is subtracted from the modified EMI characteristic, or the like.

The above makes it possible to acquire an EMI characteristic (added EMI characteristic) in which effects of modification processing and additional modification processing are incorporated. Thereafter, the processing moves to step SF9 and a determination whether the EMI tolerance condition is satisfied is performed. Then, until the EMI tolerance condition is satisfied, the above procedures are repeated.

The present exemplary embodiment is not limited to the above configuration. For example, a board design device 200G as illustrated in FIG. 37 is employable.

Figure 37:
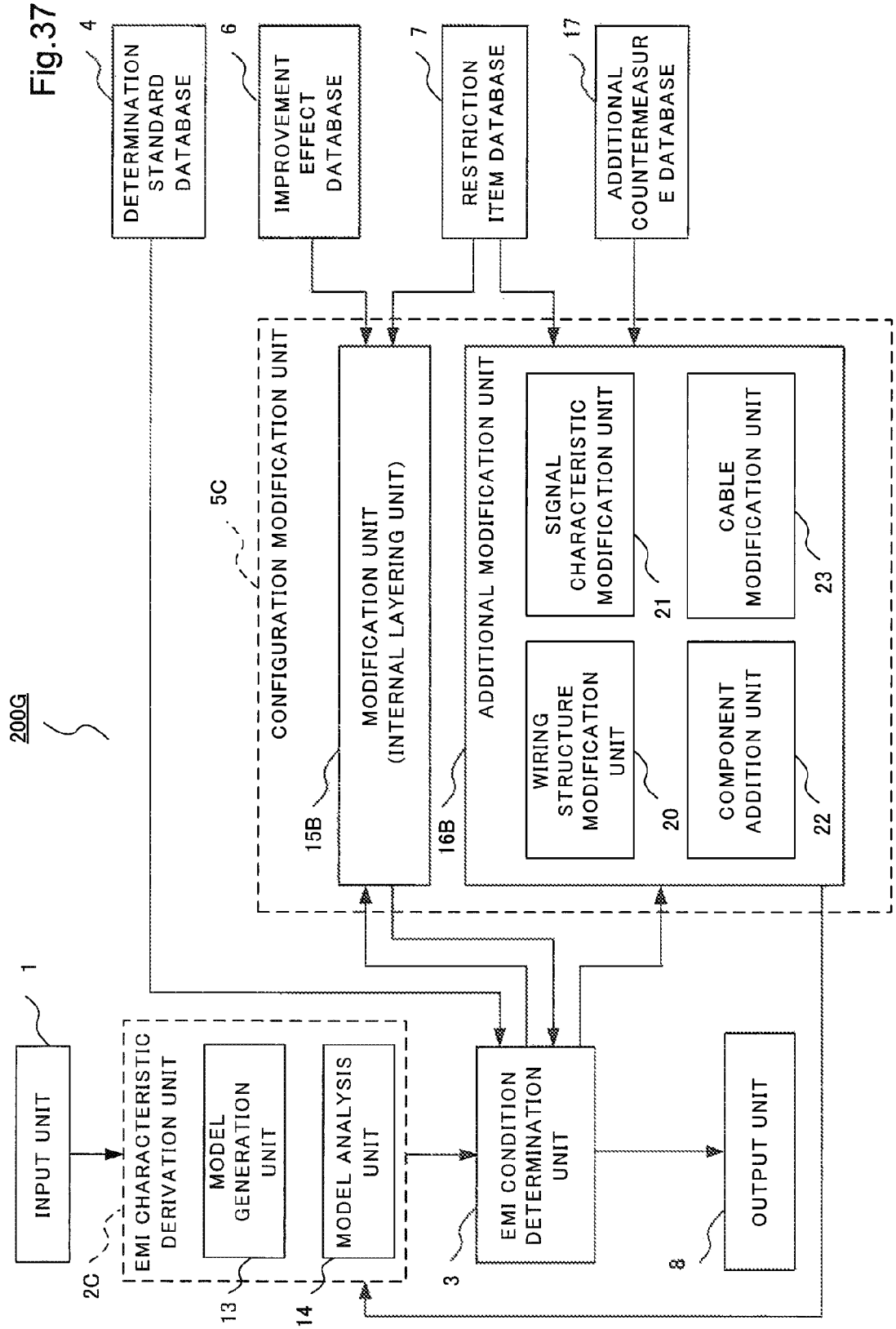
FIG. 37 is a block diagram of another board design device according to the fifth exemplary embodiment.

The board design device 200G illustrated in FIG. 37 differs from the board design device 200F illustrated in FIG. 22 in the configuration of the EMI characteristic derivation unit. In other words, the EMI characteristic derivation unit 2C of the board design device 200G includes the model generation unit 13 and the model analysis unit 14, while the EMI characteristic derivation unit 2B of the board design device 200F previously described includes the parameter extraction unit 10 and the EMI characteristic calculation unit 11. The operation of the EMI characteristic derivation unit 2C has been described in the fourth exemplary embodiment.

Thereby, while an effect is achieved by the EMI characteristic derivation unit 2C, the above effect of the configuration modification unit can be produced.

Figure 38:
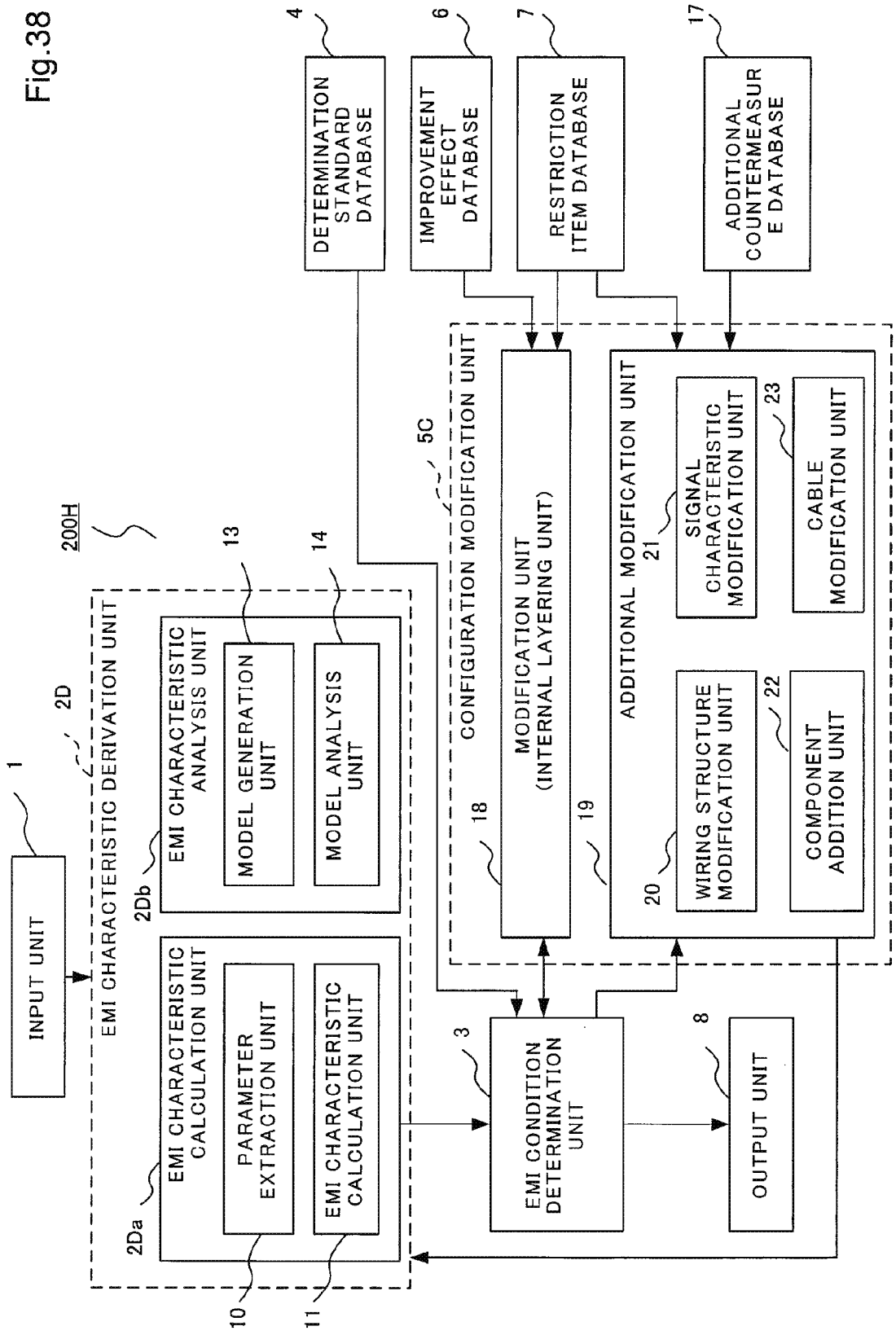
FIG. 38 is a block diagram of further another board design device according to the fifth exemplary embodiment.

Further, as another configuration, a board design device 200H as illustrated in FIG. 38 is employable. The board design device 200H has a configuration in which the board design device 200F illustrated in FIG. 22 and the board design device 200G illustrated in FIG. 37 are added together.

In other words, an EMI characteristic derivation unit 2D in the board design device 200H includes the EMI characteristic derivation unit 2B in the board design device 200F as an EMI characteristic calculation unit 2Da and also includes the EMI characteristic derivation unit 2C in the board design device 200G as an EMI characteristic analysis unit 2Db.

In this case, for EMI characteristic derivation, which one of the EMI characteristic calculation unit 2Da and the EMI characteristic analysis unit 2Db is used for the derivation is automatically determinable from configuration information of a board. Of course, any one of the units can also be selectively indicated.

Therefore, the board design device 200H can produce operational effects of the board design device 200F and the board design device 200G.

As described above, the configuration modification unit is divided into a modification unit and an additional modification unit, and also these units are operated using algorithms independent of each other. Therefore, priority and different processing methods are applicable to processing contents of the modification unit and the additional modification unit. Therefore, a configuration modification with a high degree of freedom can be performed. In other words, a board is efficiently designed.

Further, even when a content of an additionally modified board configuration is not directly reflectable in design information, selection of a processing method in additional board modification processing makes it possible to derive an additionally modified EMI characteristic. Therefore, the board configuration is modified efficiently, appropriately, and inexpensively.

Further, a degree of the configuration modification of the board can be gradually increased and therefore, over-margin design is also preventable.

Sixth Exemplary Embodiment

Figure 39:
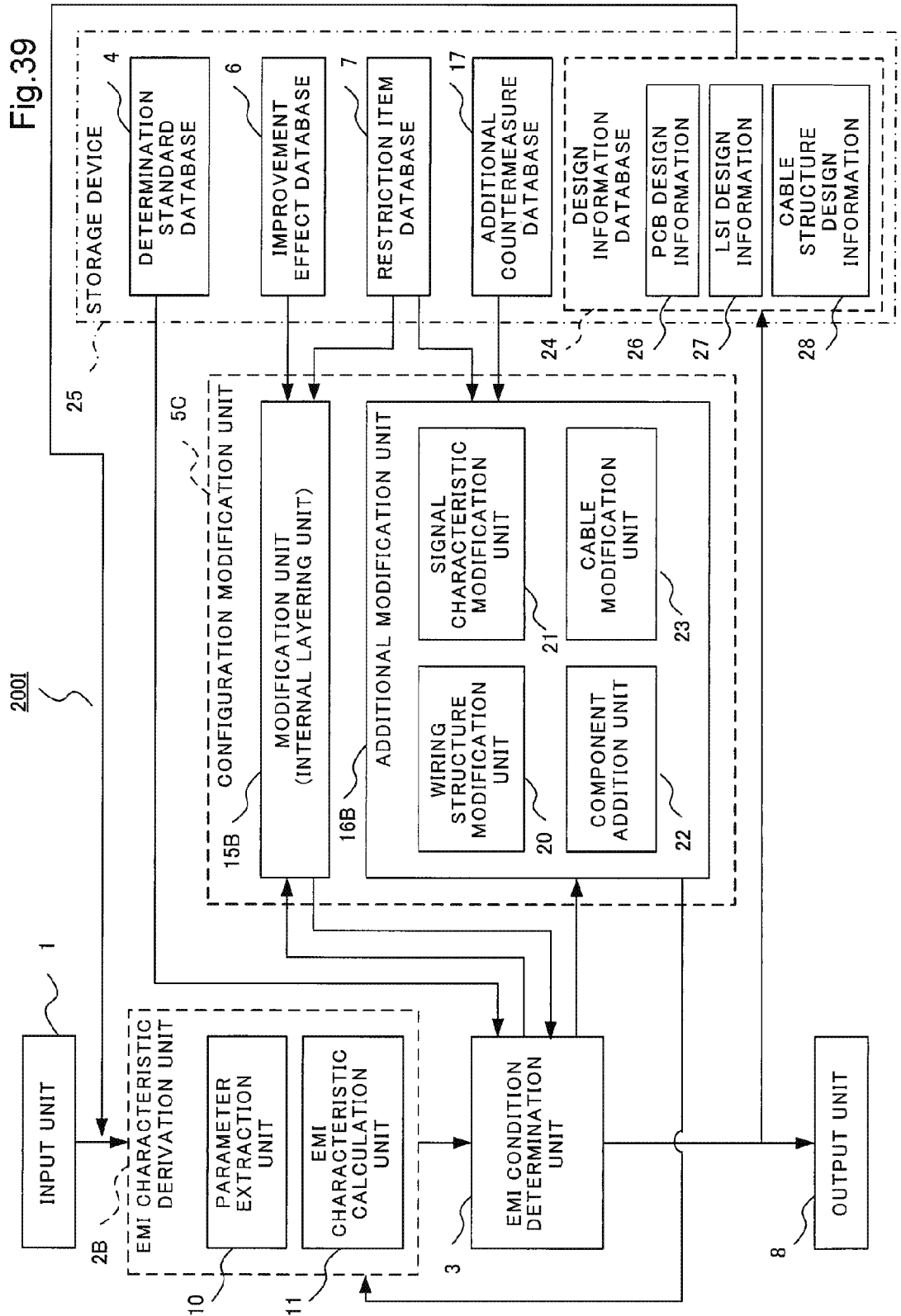
FIG. 39 is a block diagram of a board design device according to a sixth exemplary embodiment of the present invention.

Next, a sixth exemplary embodiment of the present invention will be described. Description of the same configuration as in the respective exemplary embodiments will be omitted using the same reference sign, as appropriate. FIG. 39 is a block diagram of a board design device 200I according to the present exemplary embodiment.

The board design device 200I is different from the board design device 200F according to the fifth exemplary embodiment illustrated in FIG. 22 in a respect in which a storage device 25 including the determination standard database 4, the improvement effect database 6, the restriction item database 7, and the additional countermeasure database 17 are additionally provided. Further, the storage device 25 includes a design information database 24 storing a board design information unit 26, an LSI design information unit 27, and a cable structure design information unit 28.

The board design information unit 26 stores circuit board design information regarding a layout and a sectional configuration of a board, types and configurations of components to be mounted, a connection location of a cable, and a terminal configuration. Further, the LSI design information unit 27 stores LSI design information regarding a signal waveform of an LSI, input/output impedances of a signal buffer, and a connection terminal configuration. Further, the cable structure design information unit 28 stores cable structure design information regarding a configuration and a material of a cable. Hereinafter, the circuit board design information, the LSI design information, and the cable structure design information are collectively described as supplementary design information.

The supplementary design information is output to the EMI characteristic derivation unit 2B, as necessary. At that time, basic design information is unnecessary in some cases. Further, the supplementary design information may also be information complementing the basic design information.

The EMI characteristic derivation unit 2B treats input information as basic design information in any one of the cases and derives a basic EMI characteristic based on the basic design information. Various types of information stored in the design information database 24 are automatically extracted from an EMI characteristic (a basic EMI characteristic, a modified EMI characteristic, or an additionally modified EMI characteristic) and design information (basic design information, modified design information, or additionally modified design information) which satisfy an EMI tolerance condition output from the EMI condition determination unit 3 to the output unit 8.

As the extracted information, there is cited information for deriving an EMI characteristic by calculation or the like, including, for example, as illustrated in FIG. 3, a plane of a board and a size of a wiring represented as two-dimensional CAD data, a connection location of a component and characteristic information thereof, and connection information of a cable. Further, there is also extracted information of a layer structure of a board as illustrated in FIG. 4, specifically, information of layer structures in a surface conductive layer, a dielectric layer, and an internal conductive layer and information of electrical characteristics such as electrical conductivity, relative permittivity, and the like for each layer. It is unnecessary to extract minute connection information including a via hole, a lead-out wiring, a connection pad, and the like which is not directly involved in derivation of an EMI characteristic.

Further, regarding mounted components, data such as electrical characteristics and the like is extracted. Regarding a capacitor and a resistance element which each are, for example, the mounted component 34 in FIG. 3, a capacitance value of the capacitor and a resistance value of the resistance element are cited.

Further, in the LSI design information, for example, as information of the transmission side LSI 31 of FIG. 3, a signal voltage waveform in an output buffer causing current to flow through a wiring and configuration information of the output buffer are cited, and as information of the reception side LSI 32, configuration information of an input buffer is cited.

Further, in the cable structure design information, information including a length of a cable, connection information of a terminal of the opposite side of a board, and the like can be exemplified, but information of a specific three-dimensional configuration, a material, and the like may not be included.

Figure 40:
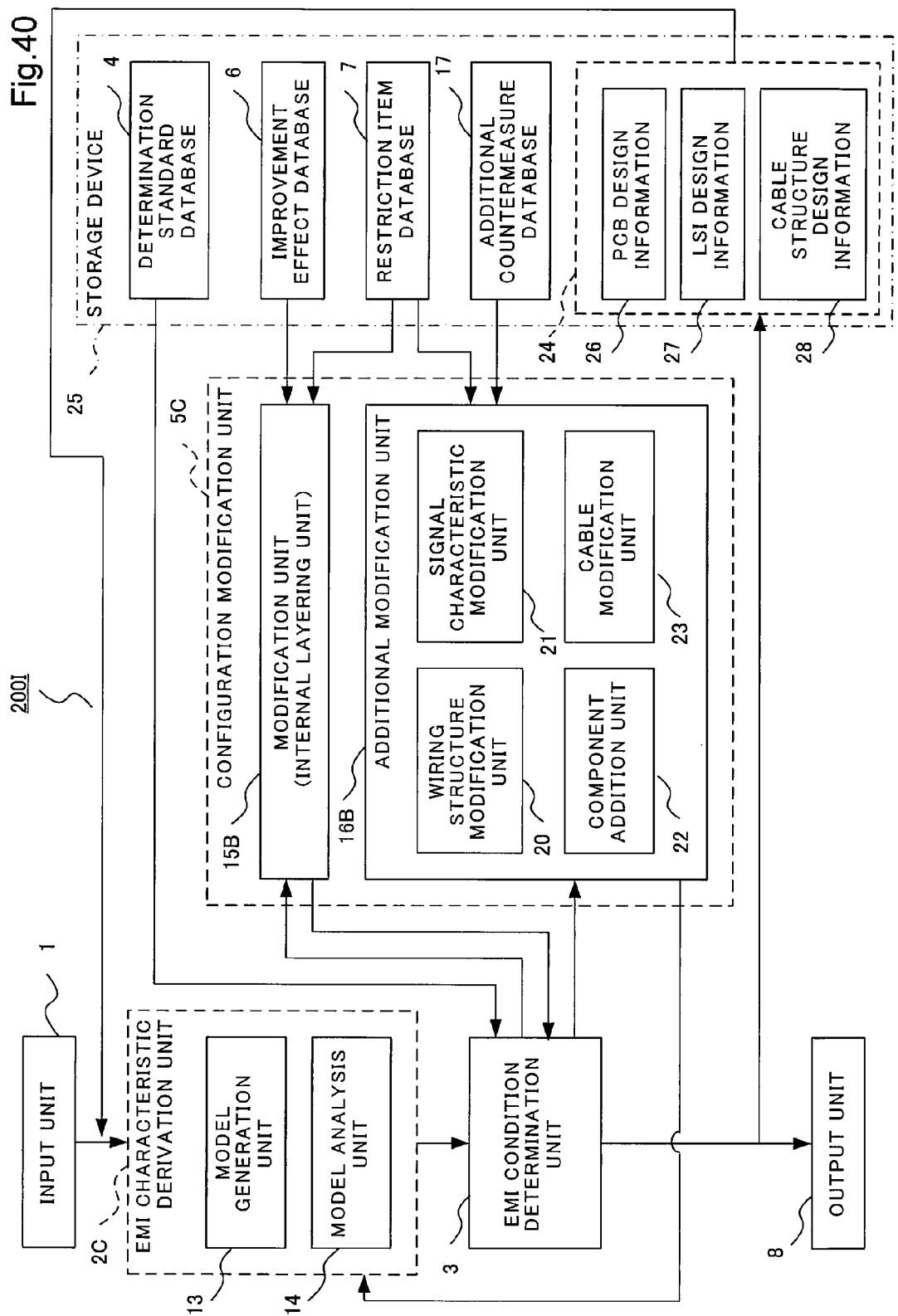
FIG. 40 is a block diagram of a board design device having another configuration according to the sixth exemplary embodiment.
Figure 41:
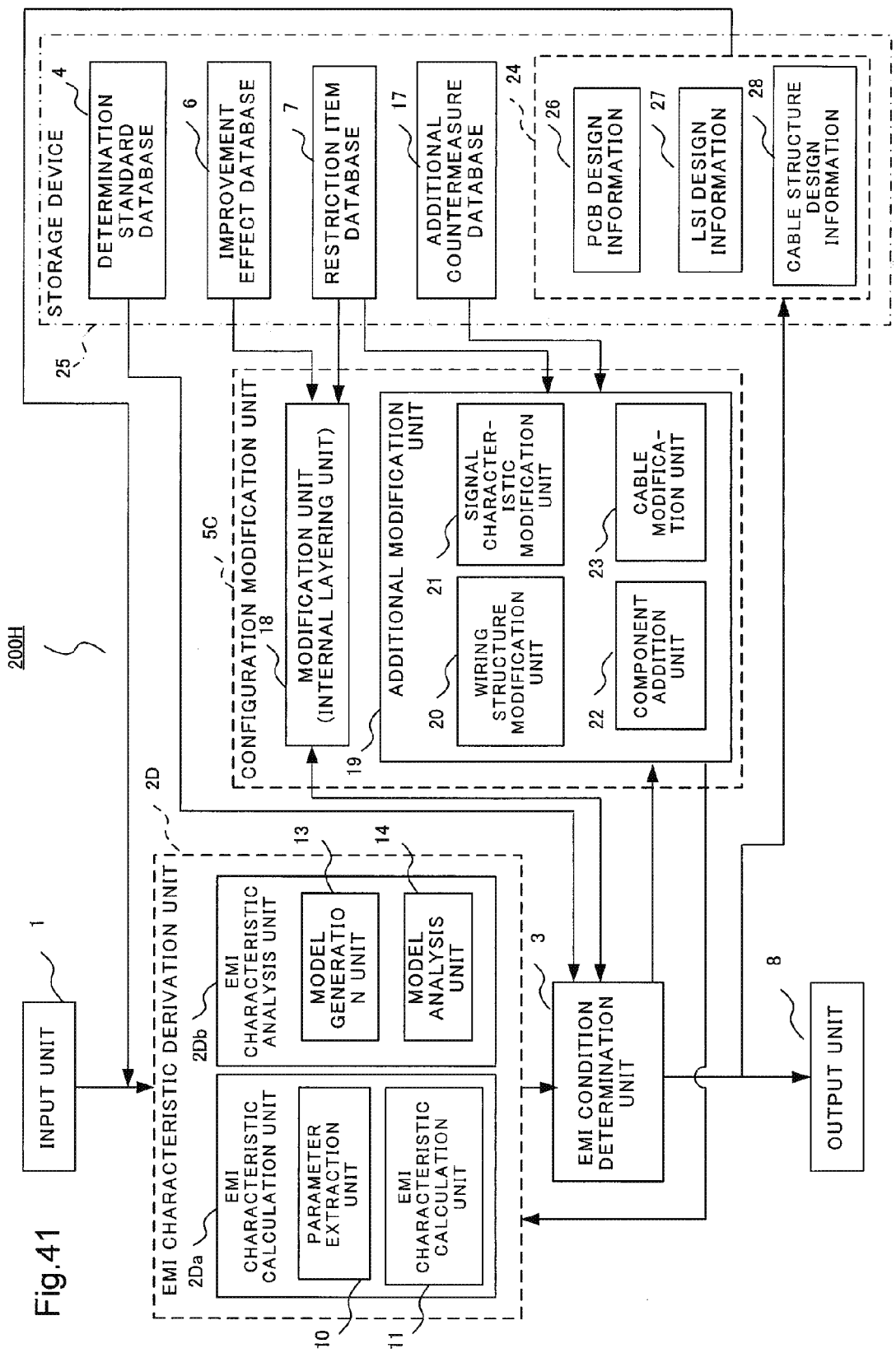
FIG. 41 is a block diagram of a board design device having further another configuration according to the sixth exemplary embodiment.

The present exemplary embodiment is not limited to the configuration illustrated in FIG. 39. A configuration, for example, as seen in the board design device 200I illustrated in FIG. 40 or the board design device 200H illustrated in FIG. 41 is employable. The board design device 200I illustrated in FIG. 40 includes the EMI characteristic derivation unit 2C including the model generation unit 13 and the model analysis unit 14 for EMI characteristic derivation. The operational effect of the EMI characteristic derivation unit 2C has been described in the third exemplary embodiment. The board design device 200H illustrated in FIG. 41 includes the EMI characteristic derivation unit 2D including the EMI characteristic calculation unit 2Da and the EMI characteristic analysis unit 2Db.

The EMI characteristic calculation unit 2Da corresponds to the EMI characteristic derivation unit 2B described in the second exemplary embodiment and includes the parameter extraction unit 10 and the EMI characteristic calculation unit 11. Further, the EMI characteristic analysis unit 2Db corresponds to the EMI characteristic derivation unit 2C described in the third exemplary embodiment and includes the model generation unit 13 and the model analysis unit 14.

In any one of the board design devices, a board is subjected to a configuration modification so as to have an EMI characteristic finally satisfying an EMI tolerance condition and output to the output unit. Therefore, the same effect as in the board design device 200I is produced.

From the above description, even when the board design device is operated, for example, for a design modification performed on the user side, there is produced an advantage in which a design information amount to be input is reduced, and also a combination with a result of an EMI characteristic output makes it possible to accumulate empirical values, resulting in that board design with high reliability is easily performed.

Seventh Exemplary Embodiment

Next, a specific example will be described as a seventh exemplary embodiment. In this exemplary embodiment, using the board design device 200I described in the sixth exemplary embodiment, a board configuration is modified to suppress EMI radiated from a cable.

Figure 42A:
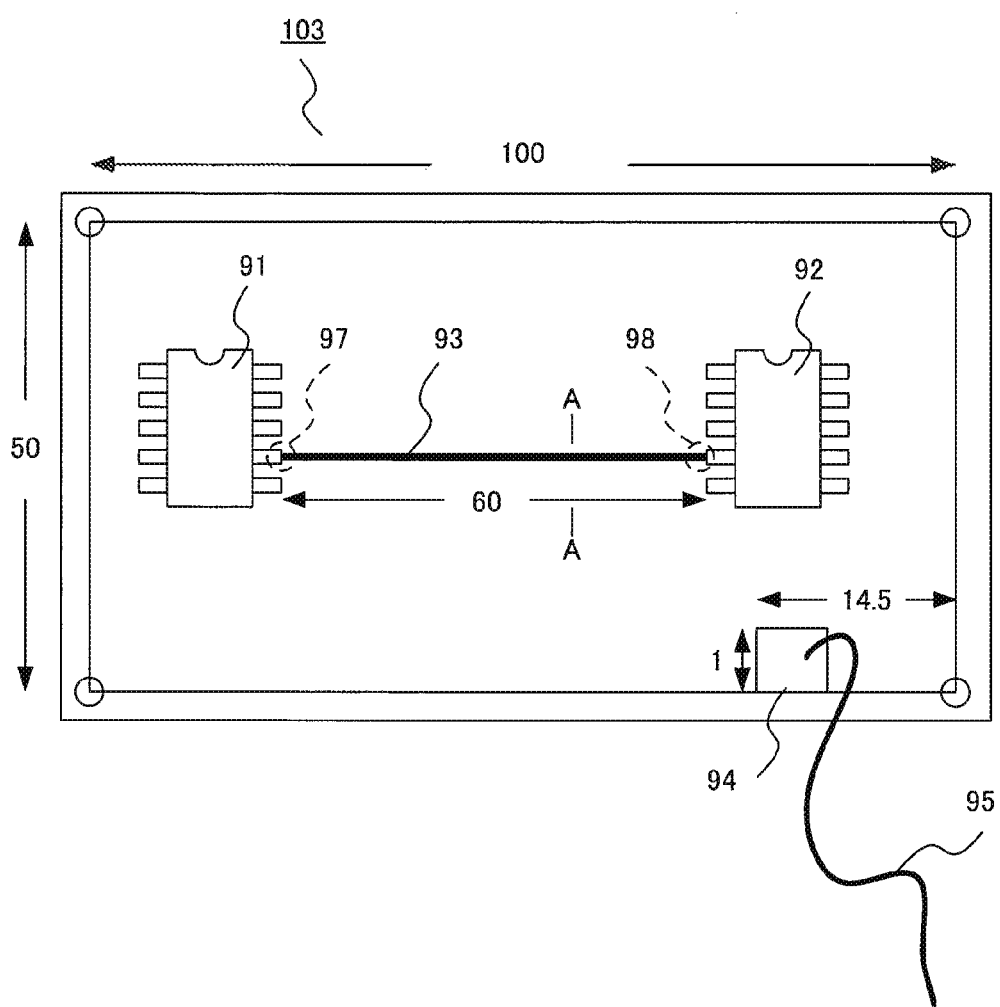
FIG. 42A is a plan view of a board applied to describe a seventh exemplary embodiment.
Figure 42B:
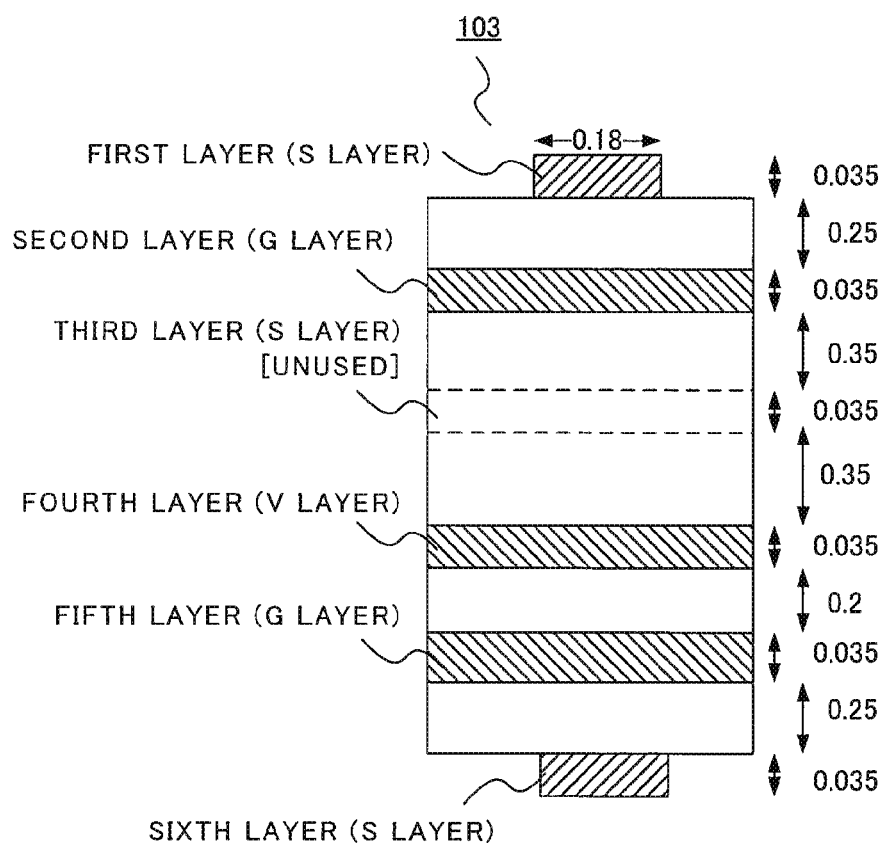
FIG. 42B is an A-A sectional view in FIG. 42A.

A board 103 as illustrated in FIG. 42 is considered. FIG. 42A illustrates a plan view of the board 103, and FIG. 42B illustrates an A-A sectional view in FIG. 42A. A size of the board 103 is 100 [mm] long×50 [mm] wide, and on this board face, a wiring 93 of 60 [mm] long×0.18 [mm] wide is formed in a central location of the board. At that time, a width center line of the wiring 93 is formed so as to coincide with a width center line of the board. The wiring 93 is connected with a transmission side LSI 91 and a reception side LSI 92.

Further, a cable connector 94 for connecting a cable 95 is disposed on the lower right side of the board 103, and a connection point of the cable 95 and the board 103 lies at a location 14.5 [mm] left and 1 [mm] above from the lower right corner.

The board 103 has a six-layer structure including a first layer to a sixth layer as illustrated in FIG. 42B. The first layer is a wiring formed on a surface of the board and the sixth layer is a wiring formed on a rear side of the board. When a layer where a signal line is disposed is described as an S layer; a layer where a GND wiring is disposed is described as a G layer; and a layer where a power supply wiring is disposed is described as a V layer, the first layer to the sixth layer are designated as the S layer, the G layer, the S layer, the V layer, the G layer, and the S layer, respectively. Between the respective layers, a layer of a dielectric body (relative permittivity $\in_r=4.2$) is disposed.

All of the transmission side LSI 91, the reception side LSI 92, and a wiring of the first layer are disposed on the upper face of the board 103. Further, the transmission side LSI 91 and the reception side LSI 92 are connected to the G layer and the V layer through a via. Further, the cable connector 94 is also disposed in the first layer and connected to the G layer through a via.

The G layers of the second layer and the fifth layer and the V layer of the fourth layer have a solid plane configuration, and a plane size and a board size are the same. Further, the S layer of the third layer is unused at this stage. The S layer of the sixth layer is actually connected with a capacitor and others for normally operating an LSI. However, in the present exemplary embodiment, the illustration of the capacitor and others is omitted due to no direct relation to calculation of an EMI characteristic.

The board 103 having such a configuration is subjected to a configuration modification so that an EMI characteristic satisfies an EMI tolerance condition.

The storage device 25 illustrated in FIG. 39 stores the board design information unit 26 regarding the board 103 illustrated in FIG. 42, the LSI design information unit 27, and the cable structure design information unit 28. A respect in which the determination standard database 4 stores an EMI tolerance condition; the improvement effect database 6 stores a modification guideline and an improvement effect; the additional countermeasure database 17 stores an additional modification guideline and an additional improvement effect; and the restriction item database 7 stores a restriction item is as described in the sixth exemplary embodiment.

It is assumed that the EMI characteristic calculation unit 11 calculates an EMI characteristic in accordance with a closed-form maximum radiation estimation method. Information used at that time includes all information necessary to calculate an EMI characteristic including not only information of the board structure illustrated in FIG. 42 but also information including a signal voltage characteristic and an output impedance Zout=75[Ω] in a transmitting end parameter 97 of a signal wiring as illustrated in FIG. 43A, an input capacitance Cin=10 [pF] of a receiving end parameter 98 of the signal wiring, and grounding of an opposite end of the board to the earth (ground) with a cable length $l_c=1$ [m].

Figure 43A:
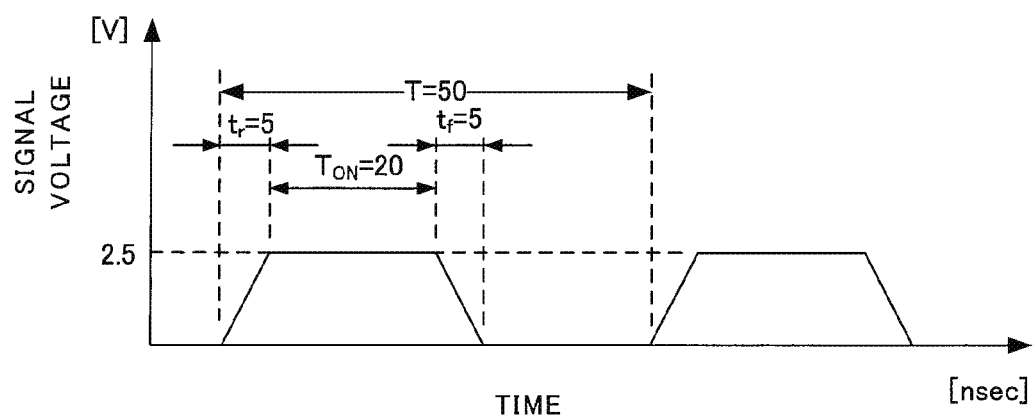
FIG. 43A illustrates an electrical characteristic of current flowing through a wiring, exemplarily illustrating an electrical characteristic and an EMI characteristic.

FIG. 43A illustrates a pulse waveform having signal voltage characteristics as an amplitude=2.5 [V], a rise time $t_r$=a fall time $t_f$=5 [ns], ON time $T_{ON}$=20 [ns], and an operational frequency $F_{clock}=1/T=20$ [MHz] at a cycle T of 50 [ns].

Under such assumptions, basic design information is input from the input unit 1. This basic design information is input to the EMI characteristic derivation unit 2B.

It is assumed that at that time, in the input unit 1, a key operation is performed to input supplementary design information from the storage device 25 to the EMI characteristic derivation unit 2B. Thereby, the supplementary design information is output from the storage device 25 to the EMI characteristic derivation unit 2B.

The parameter extraction unit 10 of the EMI characteristic derivation unit 2B treats the input basic design information and supplementary design information collectively as basic design information and extracts parameters necessary for EMI characteristic derivation from this basic design information. At that time, unnecessary information such as a via and others in the EMI characteristic calculation unit 11 is not extracted.

Then, using the extracted parameters, the EMI characteristic calculation unit 11 derives a basic EMI characteristic. At that time, as the basic EMI characteristic, a maximum value characteristic of EMI radiated from the cable 95 illustrated in FIG. 42 is calculated.

Figure 43B:
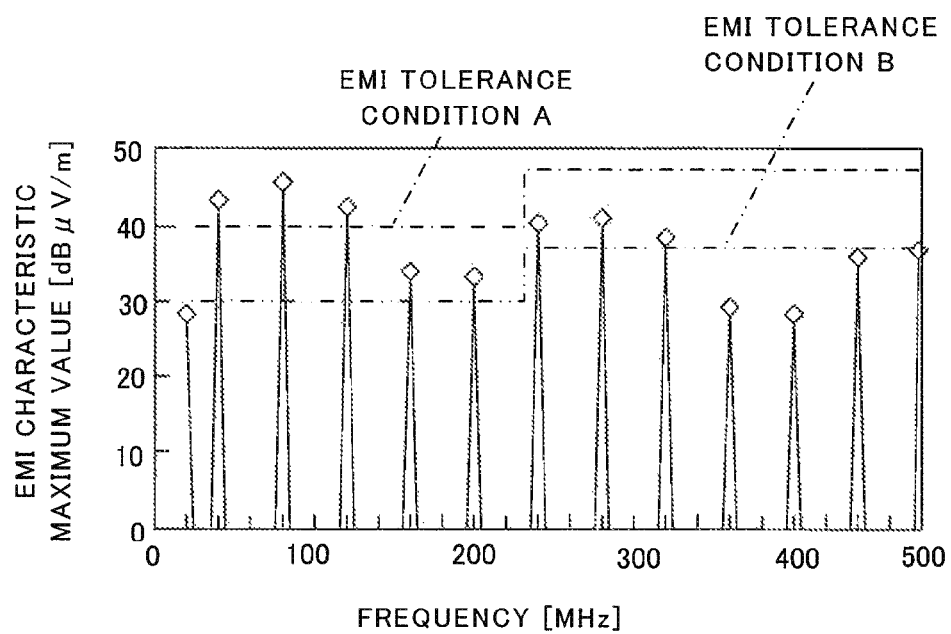
FIG. 43B is a chart illustrating maximum values of an EMI characteristic.

When a signal having the signal voltage characteristics illustrated in FIG. 43A flows through a wiring, an unnecessary electromagnetic field as illustrated in FIG. 43B is radiated from the cable 95. In FIG. 43B, an EMI characteristic up to a high frequency of 500 [MHz] is considered. An intensity of the EMI characteristic indicates a large value at a frequency of an odd-order harmonic of the operational frequency $F_{clock}$ and becomes very small at a frequency of an even-order harmonic thereof.

The derived basic EMI characteristic is output to the EMI condition determination unit 3 and the EMI condition determination unit 3 determines whether the basic EMI characteristic satisfies an EMI tolerance condition acquired from the determination standard database 4.

As the EMI tolerance condition, FIG. 43B illustrates two examples which are an EMI tolerance condition A and an EMI tolerance condition B. In the EMI tolerance condition A, the level of radiation is at most 40 [dBµV/m] at a frequency f≤230 [MHz] and the level of radiation is at most 47 [dBµV/m] at a frequency f>230 [MHz]. Further, in the EMI tolerance condition B, the level of radiation is at most 40 [dBµV/m] at a frequency f≤230 [MHz] and the level of radiation is at most 47 [dBµV/m] at a frequency f>230 [MHz]. In the following description, it is assumed that the EMI tolerance condition A is read from the determination standard database 4.

Referring to FIG. 43B, the derived basic EMI characteristic (an EMI characteristic is used as a general expression in FIG. 43B) indicates a value higher than the tolerance condition A in the vicinity of 100 MHz and therefore, is determined not to satisfy the EMI tolerance condition. Then, the EMI condition determination unit 3 outputs the basic design information, the basic EMI characteristic, and the EMI tolerance condition to the modification unit 15B of the configuration modification unit 5C.

When receiving the basic design information, the basic EMI characteristic, and the EMI tolerance condition, the modification unit 15B reads a modification guideline and an improvement effect from the improvement effect database 6 and also reads a restriction item from the restriction item database 7.

Thereafter, the modification unit 15B determines whether an internal layering rate of the wiring can be increased based on the modification guideline and the improvement effect.

In the board 103 of FIG. 42, the S layer used when wiring internal layering is the third layer and this third layer is unused. Therefore, the internal layering rate can be increased from 0%. It is assumed that as the modification guideline in such a case, a guideline in which "a wiring is relocated to the third layer and rates thereof are 25%, 50%, and 75%" is indicated. On the other hand, it is assumed that as the restriction item, an item in which "a wiring can be newly formed in the third layer and in view of component mounting area, the internal layering rate can be increased up to 75% from the center of the wiring" is specified. Then, the modification unit 15B selects an internal layering rate up to the range (75%) specified by the restriction item.

Figure 44A:
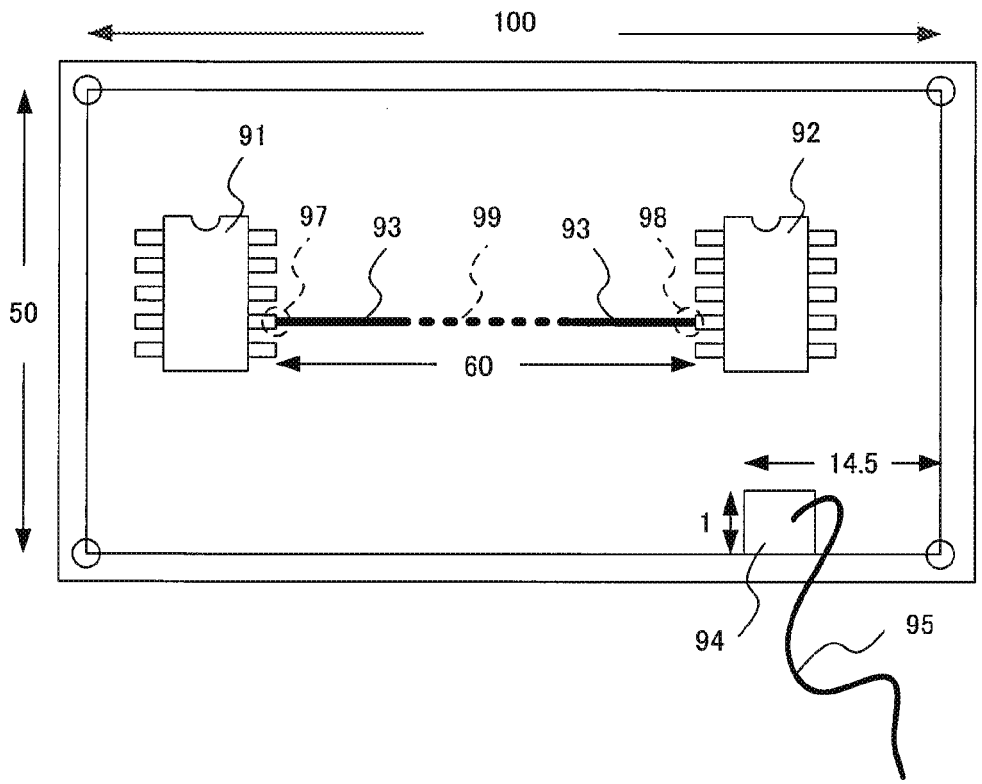
FIG. 44A is a top view of a board illustrating internal layering of a wiring.
Figure 44B:
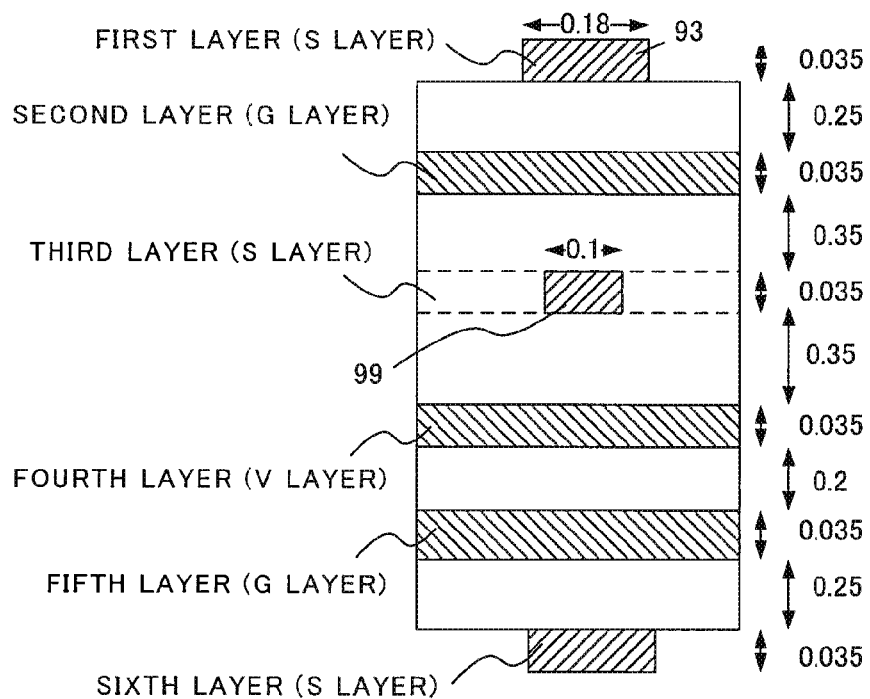
FIG. 44B is an A-A arrow sectional view in FIG. 44A.

FIG. 44A exemplarily illustrates a case where a part of the wiring 93 is relocated to the third layer and this is designated as an interlayer wiring 93. The interlayer wiring 93 is sandwiched by the GND wirings of the second layer and the fifth layer as illustrated in FIG. 44B. Thereby, coupling of the interlayer wiring 93 and the cable 95 is blocked and then reduced.

The impedance is changed by modifying a part of the wiring 93 to the interlayer wiring 99 and therefore, a wiring width of the interlayer wiring 99 is modified to 0.1 [mm] to allow the impedance Z0 to be the same.

Then, a necessary EMI reduction amount is calculated. The necessary EMI reduction amount is calculated by comparing an EMI characteristic maximum value of FIG. 43B and the EMI tolerance condition A. In other words, a value of the EMI tolerance condition A is subtracted from a value of an EMI characteristic maximum value for each frequency, and a plus portion is calculated as the necessary EMI reduction amount.

In the case of FIG. 43B, the necessary EMI reduction amount is 3.37 [dB] at a frequency of 60 [MHz], 5.09 [dB] at a frequency of 100 [MHz], and 2.51 [dB] at a frequency of 140 [MHz].

Then, the modification unit 15B acquires an improvement effect from the improvement effect database and extracts a maximum EMI reduction amount when maximally improving the wiring internal layering rate.

Figure 45:
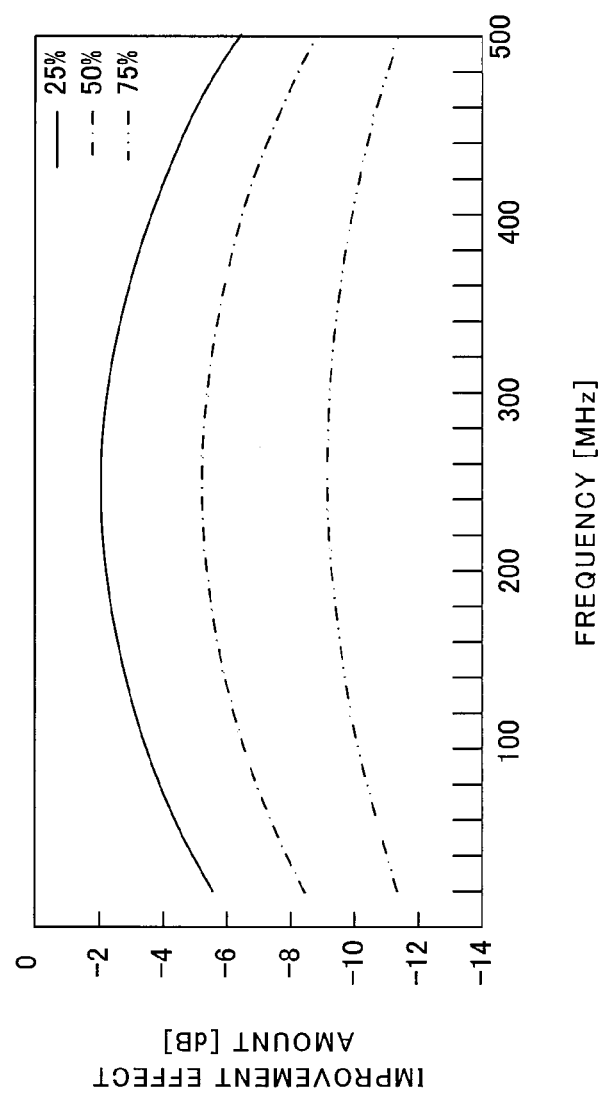
FIG. 45 is a graph illustrating improvement effects when changing a wiring internal layering rate.

As this improvement effect, EMI reduction effects in wiring internal layering rates, as illustrated in FIG. 45, are illustrated in the same board size, a wiring of the same impedance, wiring width, and wiring length, and the same cable location. At that time, when those having exactly the same conditions are unavailable, those having close conditions are selectable, but it is unnecessary to supplementarily note that making the library of this improvement effect satisfactory is a factor for determining a more accurate characteristic.

FIG. 45 is a graph illustrating improvement effects when changing the wiring internal layering rate to 25%, 50% and 75%, compared with an improvement effect produced at a wiring internal layering rate of 0%, in a range of a frequency up to 500 [MHz]. At that time, the graph of FIG. 45 illustrates the reduction effects using negative values. In other words, FIG. 43B indicates values calculated by the relation: a reduction effect=an EMI characteristic maximum value–the EMI tolerance condition A. When, for example, the wiring internal layering rate is 30%, derivation is performable via interpolation or the like.

For these improvement effects, data based on actual measurements or data derived by electromagnetic field analysis are usable by being organized under improvement conditions.

When the restriction item tolerates the wiring internal layering rate up to 75%, the maximum EMI reduction amount is 10.61 [dB] at a frequency of 60 [MHz], 10.05 [dB] at a frequency of 100 [MHz], and 9.60 [dB] at a frequency of 140 [MHz] from the graph of a two-dot chain line in FIG. 45.

Then, a comparison determination is performed whether the maximum EMI reduction amount is at least the necessary EMI reduction amount. In the above example, at every frequency, the maximum EMI reduction amount is larger and therefore, a necessary board modification amount is derived. In other words, for the necessary board modification amount, internal layering of the wiring 93 illustrated in FIG. 42 is performed at 75% according to the previous modification guideline and restriction item. In response to this necessary board modification amount, 75% of the wiring 93 of FIG. 42 is modified to the wiring 99.

Then, a modified EMI characteristic is derived. When the EMI characteristic maximum value illustrated in FIG. 43B and the EMI reduction amount obtained for 75% internal layering illustrated in FIG. 45 are calculated, the modified EMI characteristic is derived as an EMI characteristic for "internal layering 75%" illustrated in FIG. 46. The EMI characteristic for "75% internal layering" is understood to have a lower value than the EMI tolerance condition A at every frequency, compared with "no internal layering" (an EMI characteristic maximum value derived in EMI characteristic calculation processing).

The modified EMI characteristic is output from the modification unit 15B to the EMI condition determination unit 3 and then the EMI condition determination unit 3 determines whether the modified EMI characteristic satisfies the EMI tolerance condition A.

According to FIG. 46, the modified EMI characteristic for 75% internal layering of the wiring satisfies the EMI tolerance condition A at every frequency. Therefore, the EMI condition determination unit 3 outputs the modified EMI characteristic, the modified design information (including internal layering information), the basic design information, the basic EMI characteristic, and the EMI tolerance condition to the output unit 8.

At that time, board design information, LSI design information, and cable structure design information are extracted from these pieces of information and stored in the design information database 24 of the storage device 25. Only the increase of the internal layering rate was performed here and therefore, information to be modified is only the board design information. Of course, when this board configuration is made, information indicating that EMI characteristics as illustrated in FIG. 46 are output may be stored.

When the previous restriction item is a different one which has a content in which "an internal layering rate of a wiring can be increased up to 25%," the modified EMI characteristic becomes a characteristic of "internal layering 25%" illustrated in FIG. 46. At that time, the EMI characteristic maximum value is larger than the EM tolerance condition A at a frequency of 100 [MHz] and therefore, the modified EMI characteristic does not satisfy the EMI tolerance condition.

In this case, the maximum EMI reduction amount is not at least the necessary EMI reduction amount and therefore, maximum board modification amount derivation processing is executed. However, in this example, since the wiring internal layering rate is 25% also with respect to the maximum board modification amount, a finally derived modified EMI characteristic is unchanged.

In the above description, a case where the EMI tolerance condition A is applied has been described, and a case where the EMI tolerance condition B is applied is as follows. At that time, overlapping description will be omitted.

The EMI condition determination unit 3 determines whether the basic EMI characteristic satisfies the EMI tolerance condition B. As illustrated in FIG. 43B, in this case, the EMI tolerance condition is not satisfied at many frequencies. Therefore, the EMI condition determination unit 3 outputs the basic design information, the basic EMI characteristic, and the EMI tolerance condition B to the modification unit 15B.

The modification unit 15B determines whether the internal layering rate of the wiring can be increased based on a modification guideline and a restriction item. On the basis of this determination, as described above, a determination that the internal layering rate is possible up to 75% is performed.

The modification unit 15B calculates a necessary EMI reduction amount. This necessary EMI reduction amount is also calculated from a difference between a basic EMI characteristic maximum value and the EMI tolerance condition B. From FIG. 43B, the necessary EMI reduction amount is 13.37 [dB] at a frequency of 60 [MHz], 15.09 [dB] at a frequency of 100 [MHz], 12.51 [dB] at a frequency of 140 [MHz], 3.32 [dB] at a frequency of 180 [MHz], 2.44 [dB] at a frequency of 220 [MHz], 2.91 [dB] at a frequency of 260 [MHz], 3.88 [dB] at a frequency of 300 [MHz], and 1.18 [dB] at a frequency of 340 [MHz].

Then, a maximum EMI reduction amount is extracted. Also in this case, it is assumed that the restriction item enables the wiring internal layering rate to be up to 75%. At that time, from FIG. 45, the maximum EMI reduction amount is 10.61 [dB] at a frequency of 60 [MHz], 10.05 [dB] at a frequency of 100 [MHz], 9.60 [dB] at a frequency of 140 [MHz], 9.29 [dB] at a frequency of 180 [MHz], 9.10 [dB] at a frequency of 220 [MHz], 9.04 [dB] at a frequency of 260 [MHz], 9.10 [dB] at a frequency of 300 [MHz], and 9.30 [dB] at a frequency of 340 [MHz].

Then, a determination is performed whether the maximum EMI reduction amount is at least the necessary EMI reduction amount. In the above case, the necessary EMI reduction amount is larger at a frequency of 60 [MHz], a frequency of 100 [MHz], and a frequency of 140 [MHz]. Therefore, the maximum EMI reduction amount is not at least the necessary EMI reduction amount. Then, the modification unit 15B derives a maximum board modification amount.

According to the above modification guideline and restriction item, the maximum board modification amount is internal layering of 75% of the wiring 93 of FIG. 42. Then, the wiring 93 of FIG. 42 is modified to the wiring 99 of an internal layering rate of 75% as illustrated in FIG. 44.

Then, a modified EMI characteristic is derived and a determination is performed whether this modified EMI characteristic satisfies the EMI tolerance condition B. As described also earlier, the maximum EMI reduction amount is smaller than the necessary EMI reduction amount and therefore, the EMI characteristic for "75% internal layering" has a higher value than the tolerance condition B in a frequency range of 60 to 100 [MHz]. In other words, the modified EMI characteristic is determined not to satisfy the EMI tolerance condition B.

The EMI condition determination unit 3 outputs the basic design information, the basic EMI characteristic, the modified design information, the modified EMI characteristic, and the EMI tolerance condition B to the additional modification unit 16B.

The additional modification unit 16B acquires an additional modification guideline and an additional improvement effect from the additional countermeasure database 17. It is assumed that the additional modification guideline has a content issuing an instruction for component addition meaning that "one resistance element of 25[Ω] or 50[Ω] is added between a receiving end vicinity of a wiring and a GND layer." Further, it is assumed that a restriction item regarding the component addition has a content in which "only a component of at most 10 yen/piece is allowed to be used."

Figure 47A:
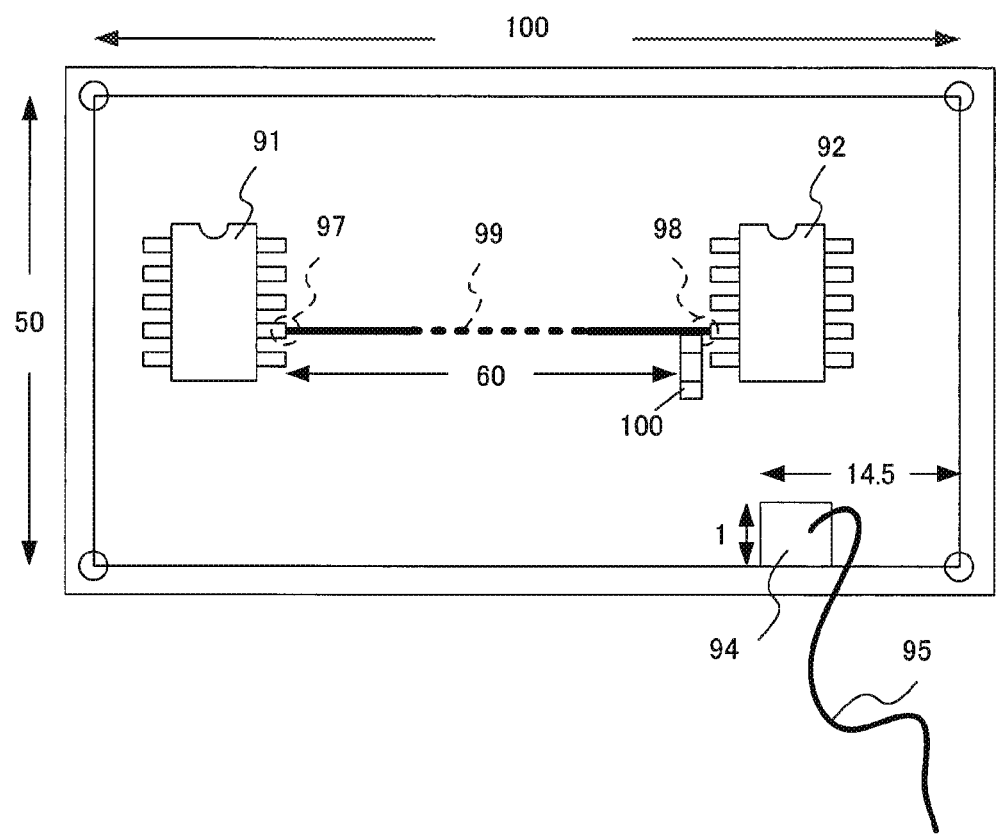
FIG. 47A is a plan view of a board illustrating a configuration when internal-layering of a wiring in a board corresponding to FIG. 42A.
Figure 47B:
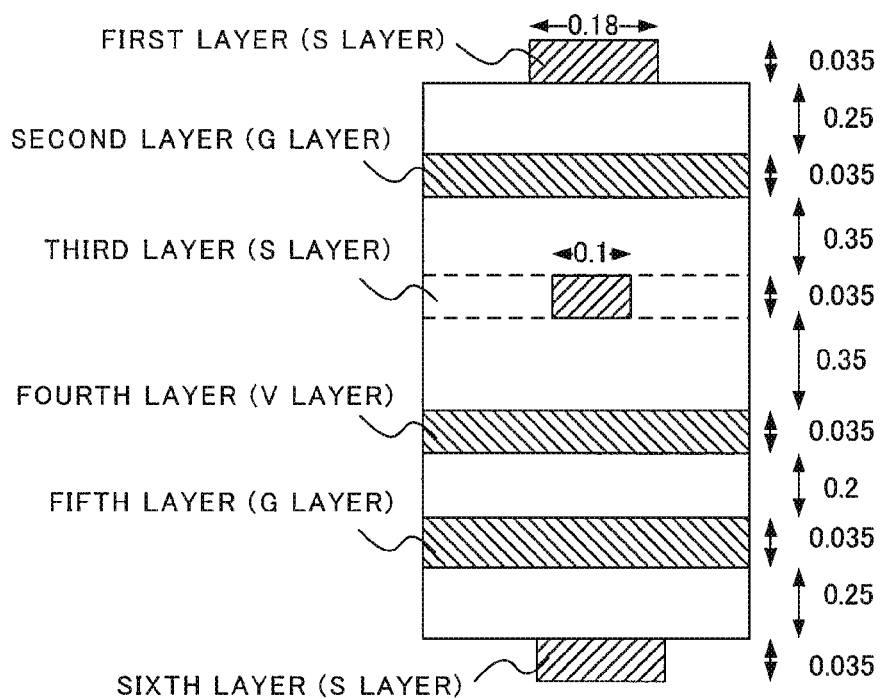
FIG. 47B is an A-A sectional view in FIG. 47A.

The additional modification unit 16B determines component addition from the specified content of the additional modification guideline and causes the component addition unit 22 to execute processing. The restriction item is that "only a component of at most 10 yen/piece is allowed to be used," but when a resistance element of 25[Ω] has a price of at least 10 yen/piece and a resistance element of 50[Ω] has a price of at most 10 yen/piece, as the additional component, the resistance element of 50[Ω] is selected and then added to a vicinity of the reception side LSI 92 as illustrated in FIG. 47A.

Then, board configuration modification processing is executed and a configuration modification such as addition of a connection pad to the wiring and a connection via to the GND wiring and the like is performed so that the resistance element of 50[Ω] is connected to the board.

When such an additional modification ends, the modification information is output to the EMI characteristic derivation unit as additionally modified design information. The EMI characteristic derivation unit 2B derives an additionally modified EMI characteristic. The added EMI characteristic determined in such a manner is transmitted to the EMI condition determination unit 3 to determine whether the EMI tolerance condition B is satisfied.

FIG. 48 illustrates derived additionally modified EMI characteristics. As illustrated in FIG. 48, an added EMI characteristic of "only internal layering 75%" (a characteristic when performing only wiring internal layering) has a larger value than the EMI tolerance condition B at a frequency of 60 to 140 [MHz] as described also earlier, but an added EMI characteristic of "internal layering 75%+addition of a 50[Ω] resistance element" (a characteristic when combining wiring internal layering and component addition) has a smaller value than the EMI tolerance condition B in all the frequency range.

The added EMI characteristic determined in such a manner is transmitted to the EMI condition determination unit 3 to determine whether the EMI tolerance condition B is satisfied.

As illustrated in FIG. 48, when the wiring is subjected to 75% internal layering and a resistance element of 50[Ω] is added, the EMI characteristic satisfies the tolerance condition B and therefore, the determination standard is satisfied. The processing moves to result output processing and then this result is written into the basic design information, the LSI design information, and the cable structure design information stored on the storage device 25.

Only the increase of an internal layering rate of the wiring and the addition of a resistance element of 50[Ω] were performed here and therefore, information to be modified is only the board design information.

According to the present invention, applications can be made for an intended purpose in which in a board connected with a cable and mounted with an LSI, an EMI characteristic is derived without extra calculation cost in each design stage.

Further, a design modification of a board is easily and efficiently performed by modifying a board configuration and a mounted component so that generated EMI satisfies a preset restriction item.

A part or all of the exemplary embodiments can be described as the following supplementary notes but are not limited to the following.

<Supplementary Note 1>

A board design device used for designing a circuit board, the device including:

an EMI characteristic derivation unit which derives an EMI characteristic radiated from a cable based on design information of the circuit board connected with the cable;

a determination standard database which stores an EMI tolerance condition which is a tolerance condition for the EMI characteristic;

an EMI condition determination unit which determines whether the EMI characteristic satisfies the EMI tolerance condition;

an improvement effect database which stores a modification guideline to modify a configuration of the circuit board necessary to satisfy the EMI tolerance condition when the EMI characteristic does not satisfy the EMI tolerance condition and an improvement effect corresponding to the modification guideline;

a restriction item database which stores a restriction item applied when the configuration modification of the board is performed; and a configuration modification unit which performs the configuration modification of the board in accordance with the modification guideline and the restriction item.

<Supplementary Note 2>

The board design device according to Supplementary Note 1, wherein the EMI characteristic derivation unit extracts parameters necessary to derive the EMI characteristic from the design information and calculates the EMI characteristic using the parameters.

<Supplementary Note 3>

The board design device according to Supplementary Note 1, wherein the EMI characteristic derivation unit creates an analysis model of the circuit board from the design information when the EMI characteristic is derived from the design information by electromagnetic field analysis and derives the EMI characteristic by applying the electromagnetic field analysis to the analysis model.

<Supplementary Note 4>

The board design device according to Supplementary Note 1, wherein the EMI characteristic derivation unit includes: any one or both of an EMI characteristic calculation unit which extracts parameters necessary to derive the EMI characteristic from the design information and calculates the EMI characteristic using the parameters; and an EMI characteristic analysis unit which creates an electromagnetic field analysis model of the circuit board to derive the EMI characteristic from the design information and derives the EMI characteristic by applying electromagnetic field analysis to the analysis model.

<Supplementary Note 5>

The board design device according to any one of Supplementary Notes 1 to 4, wherein the configuration modification unit includes a modification unit which determines design information after configuration modification as modified design information by performing a configuration modification of the circuit board in accordance with the modification guideline in a range allowed by the restriction item when the EMI condition determination unit determines that the EMI characteristic does not satisfy the EMI tolerance condition, derives an EMI characteristic after modification as a modified EMI characteristic using the modified design information, and outputs the modified EMI characteristic and the modified design information to the EMI condition determination unit.

<Supplementary Note 6>

The board design device according to Supplementary Note 5, wherein the modification unit modifies an internal layering rate of a wiring in the circuit board.

<Supplementary Note 7>

The board design device according to Supplementary Note 5 or 6, wherein the configuration modification unit further includes:

an additional countermeasure database which acquires an additional modification guideline and an additional improvement effect when the EMI condition determination unit determines that the modified EMI characteristic does not satisfy the EMI tolerance condition; and an additional modification unit which determines additionally modified design information by additionally modifying the configuration of the circuit board in accordance with the additional modification guideline acquired from the additional countermeasure database in the range allowed by the restriction item and outputs the additionally modified design information to the EMI characteristic derivation unit.

<Supplementary Note 8>

The board design device according to Supplementary Note 7, wherein the additional modification unit modifies the configuration of the circuit board using a method different from the method of the modification unit, outputs information regarding a board configuration after additional modification as the additionally modified design information to the EMI characteristic derivation unit, and causes the EMI characteristic derivation unit to derive an EMI characteristic based on the additionally modified design information as an additionally modified EMI characteristic.

<Supplementary Note 9>

The board design device according to Supplementary Note 8, wherein the additional modification unit includes:

a wiring structure modification unit which modifies a wiring configuration of the wiring disposed in the circuit board;

a signal characteristic modification unit which modifies a characteristic of a signal source of the circuit board;

a component addition unit which adds a countermeasure component to the circuit board; and a cable modification unit which modifies a configuration of the cable connected to the circuit board.

<Supplementary Note 10>

The board design device according to any one of Supplementary Notes 7 to 9, further including a storage device which stores at least one of the determination standard database, the improvement effect database, the restriction item database, or the additional countermeasure database, wherein the storage device stores a design information database including circuit board design information which stores configuration information of the circuit board, semiconductor integrated circuit design information which stores internal design information of a semiconductor integrated circuit mounted on the circuit board, and cable structure design information which stores information of a cable connected to the circuit board and outputs the circuit board design information, the semiconductor integrated circuit design information, and the cable structure design information stored in the design information database as supplementary design information to the EMI characteristic derivation unit.

<Supplementary Note 11>

The board design device according to Supplementary Note 10, wherein when determining that any one EMI characteristic of the EMI characteristic, the modified EMI characteristic, and the additionally modified EMI characteristic satisfies the EMI tolerance condition, the EMI condition determination unit outputs the EMI characteristic to the output unit together with corresponding information among the design information, the modified design information, and the additionally modified design information as derivation bases for the EMI characteristics, extracts at least one of the circuit board design information, the semiconductor integrated circuit design information, or the cable structure design information from the information, and stores the extracted information in the design information database.

<Supplementary Note 12>

A board design method used for designing a circuit board including:

an EMI characteristic derivation procedure for deriving an EMI characteristic radiated from a cable based on design information of the circuit board connected with the cable;

an EMI condition determination procedure for determining whether the EMI characteristic satisfies an EMI tolerance condition by acquiring the EMI tolerance condition which is a tolerance condition for the EMI characteristic from a determination standard database; and a configuration modification procedure for modifying a configuration of the board in accordance with a modification guideline and a restriction item by acquiring the modification guideline to modify the configuration of the circuit board necessary to satisfy the EMI tolerance condition from an improvement effect database when the EMI characteristic does not satisfy the EMI tolerance condition and an improvement effect corresponding to the modification guideline and by acquiring the restriction item applied when the configuration modification of the circuit board is performed from a restriction item database.

<Supplementary Note 13>

The board design method according to Supplementary Note 12, wherein the EMI characteristic derivation procedure includes:

a procedure for extracting parameters necessary to derive the EMI characteristic from the design information; and a procedure for calculating the EMI characteristic using the extracted parameters.

<Supplementary Note 14>

The board design method according to Supplementary Note 12, wherein the EMI characteristic derivation procedure further includes:

a procedure for creating an electromagnetic field analysis model of the circuit board to derive the EMI characteristic from the design information; and a procedure for deriving the EMI characteristic by applying electromagnetic field analysis to the created analysis model.

<Supplementary Note 15>

The board design method according to Supplementary Note 12, wherein the EMI characteristic derivation procedure further includes:

an EMI characteristic calculation procedure for calculating the EMI characteristic using parameters by extracting the parameters necessary to derive the EMI characteristic from the design information; and an EMI characteristic analysis procedure for deriving the EMI characteristic by applying electromagnetic field analysis to an electromagnetic field analysis model by creating the analysis model of the circuit board to derive the EMI characteristic from the design information.

<Supplementary Note 16>

The board design method according to any one of Supplementary Notes 12 to 15, wherein the configuration modification procedure includes a modification procedure for determining design information after configuration modification as modified design information by performing a configuration modification of the circuit board in accordance with the modification guideline in a range allowed by the restriction item when the EMI condition determination procedure determines that the EMI characteristic does not satisfy the EMI tolerance condition, for deriving an EMI characteristic after modification as a modified EMI characteristic using the modified design information, and for outputting the modified EMI characteristic and the modified design information.

<Supplementary Note 17>

The board design method according to Supplementary Note 16, wherein the modification procedure modifies an internal layering rate of a wiring in the circuit board.

<Supplementary Note 18>

The board design method according to Supplementary Note 16 or 17, wherein the configuration modification procedure further includes an additional modification procedure including:

a procedure for acquiring an additional modification guideline and an additional improvement effect from an additional countermeasure database when the EMI condition determination procedure determines that the modified EMI characteristic does not satisfy the EMI tolerance condition;

a procedure for determining additionally modified design information by additionally modifying the configuration of the circuit board in accordance with the additional modification guideline in the range allowed by the restriction item; and a procedure for causing the EMI characteristic derivation procedure to derive the added EMI characteristic using the additionally modified design information.

<Supplementary Note 19>

The board design method according to Supplementary Note 18, wherein the additional modification procedure includes a procedure for modifying the configuration of the circuit board using a method different form the modification procedure and for designating information regarding a board configuration after additional modification as the additionally modified design information.

<Supplementary Note 20>

The board design method according to Supplementary Note 19, wherein the additional modification procedure further includes:

a wiring structure modification procedure for modifying a wiring configuration of a wiring disposed in the circuit board;

a signal characteristic modification procedure for modifying a characteristic of a signal source of the circuit board;

a procedure article addition procedure for adding a countermeasure procedure article to the circuit board; and a cable modification procedure for modifying a configuration of the cable connected to the circuit board.

<Supplementary Note 21>

The board design method according to any one of Supplementary Notes 18 to 20, further including:

a circuit board design information storage procedure for storing configuration information of the circuit board;

a semiconductor integrated circuit design information storage procedure for storing internal design information of a semiconductor integrated circuit mounted on the circuit board; and a cable structure design information storage procedure for storing information of a cable connected to the circuit board.

Having described the present invention by reference to the exemplary embodiments (and the examples), the present invention is not limited to the exemplary embodiments (and the examples). Various modifications understandable to those skilled in the art to the constitution and details of the present invention can be made within the scope of the present invention.

This application claims priority based on Japanese Patent Application No. 2012-214179, filed on Sep. 27, 2012, the entire disclosure of which is incorporated by reference herein.

REFERENCE SIGNS LIST 2A to 2D EMI characteristic derivation unit
2Da EMI characteristic calculation unit
2Db EMI characteristic analysis unit
3 EMI condition determination unit
4 Determination standard database
5A Configuration modification unit
5B Configuration modification unit
5C Configuration modification unit
6 Improvement effect database
7 Restriction item database
8 Output unit
10 Parameter extraction unit
11 EMI characteristic calculation unit
13 Model generation unit
14 Model analysis unit
15B Modification unit (internal layering unit)
15A Modification unit
16A, 16B Additional modification unit
17 Additional countermeasure database
20 Wiring structure modification unit
21 Signal characteristic modification unit
22 Component addition unit
23 Cable modification unit
24 Design information database
25 Storage device
26 Circuit board design information unit
27 LSI design information unit
27 Cable structure design information unit
200A to 200I Board design device

What is claimed is:

1. A board design device used for designing a circuit board, the device comprising:

an EMI (electromagnetic interference) characteristic derivation unit which derives an EMI characteristic radiated from a cable based on design information of the circuit board connected with the cable;

a determination standard database which stores an EMI tolerance condition that is a tolerance condition for the EMI characteristic;

an EMI condition determination unit which determines whether the EMI characteristic satisfies the EMI tolerance condition;

an improvement effect database which stores a modification guideline to modify a configuration of the circuit board necessary to satisfy the EMI tolerance condition when the EMI characteristic does not satisfy the EMI tolerance condition and an improvement effect corresponding to the modification guideline;

a restriction item database which stores a restriction item applied when the configuration modification of the circuit board is performed; and a configuration modification unit which performs the configuration modification of the circuit board in accordance with the modification guideline and the restriction item, wherein the circuit board is fabricated from the design information thereof as modified in accordance with the configuration modification.

2. The board design device according to claim 1, wherein the EMI characteristic derivation unit extracts parameters necessary to derive the EMI characteristic from the design information and calculates the EMI characteristic using the parameters.

3. The board design device according to claim 1, wherein the EMI characteristic derivation unit creates an electromagnetic field analysis model of the circuit board from the design information when the EMI characteristic is derived from the design information by electromagnetic field analysis and derives the EMI characteristic by applying the electromagnetic field analysis to the electromagnetic field analysis model.

4. The board design device according to claim 1, wherein the EMI characteristic derivation unit comprises: at least one of an EMI characteristic calculation unit which extracts parameters necessary to derive the EMI characteristic from the design information and calculates the EMI characteristic using the parameters; or an EMI characteristic analysis unit which creates an electromagnetic field analysis model of the circuit board to derive the EMI characteristic from the design information and derives the EMI characteristic by applying electromagnetic field analysis to the electromagnetic field analysis model.

5. The board design device according to claim 1, wherein the configuration modification unit comprises a modification unit which determines design information after configuration modification as modified design information by performing a configuration modification of the circuit board in accordance with the modification guideline in a range allowed by the restriction item when the EMI condition determination unit determines that the EMI characteristic does not satisfy the EMI tolerance condition, derives an EMI characteristic after modification as a modified EMI characteristic using the modified design information, and outputs the modified EMI characteristic and the modified design information to the EMI condition determination unit.

6. The board design device according to claim 5, wherein the modification unit modifies an internal layering rate of a wiring in the circuit board.

7. The board design device according to claim 5, wherein the configuration modification unit further comprises:

an additional countermeasure database which acquires an additional modification guideline and an additional improvement effect when the EMI condition determination unit determines that the modified EMI characteristic does not satisfy the EMI tolerance condition; and an additional modification unit which determines additionally modified design information by additionally modifying the configuration of the circuit board in accordance with the additional modification guideline acquired from the additional countermeasure database in the range allowed by the restriction item and outputs the additionally modified design information to the EMI characteristic derivation unit.

8. The board design device according to claim 7, wherein the additional modification unit modifies the configuration of the circuit board using a method different from the method of the modification unit, outputs information regarding a board configuration after additional modification as the additionally modified design information to the EMI characteristic derivation unit, and causes the EMI characteristic derivation unit to derive an EMI characteristic based on the additionally modified design information as an additionally modified EMI characteristic.

9. The board design device according to claim 8, wherein the additional modification unit comprises:

a wiring structure modification unit which modifies a wiring configuration of the wiring disposed in the circuit board;

a signal characteristic modification unit which modifies a characteristic of a signal source of the circuit board;

a component addition unit which adds a countermeasure component to the circuit board; and a cable modification unit which modifies a configuration of the cable connected to the circuit board.

10. The board design device according to claim 7, further comprising a storage device which stores at least one of the determination standard database, the improvement effect database, the restriction item database, or the additional countermeasure database, wherein the storage device stores a design information database including circuit board design information which stores configuration information of the circuit board, semiconductor integrated circuit design information which stores internal design information of a semiconductor integrated circuit mounted on the circuit board, and cable structure design information which stores information of a cable connected to the circuit board and outputs the circuit board design information, the semiconductor integrated circuit design information, and the cable structure design information stored in the design information database as supplementary design information to the EMI characteristic derivation unit.

11. The board design device according to claim 10, wherein when determining that any one EMI characteristic of the EMI characteristic, the modified EMI characteristic, and the additionally modified EMI characteristic satisfies the EMI tolerance condition, the EMI condition determination unit outputs the EMI characteristic to the output unit together with corresponding information among the design information, the modified design information, and the additionally modified design information as derivation bases for the EMI characteristics, extracts at least one of the circuit board design information, the semiconductor integrated circuit design information, or the cable structure design information from the information, and stores the extracted information in the design information database.

12. A board design method used for designing a circuit board, the method comprising:

deriving an EMI (electromagnetic interference) characteristic radiated from a cable based on design information of the circuit board connected with the cable;

determining whether the EMI characteristic satisfies an EMI tolerance condition by acquiring the EMI tolerance condition which is a tolerance condition for the EMI characteristic from a determination standard database; and modifying a configuration of the circuit board in accordance with a modification guideline and a restriction item by acquiring the modification guideline to modify the configuration of the circuit board necessary to satisfy the EMI tolerance condition from an improvement effect database when the EMI characteristic does not satisfy the EMI tolerance condition and an improvement effect corresponding to the modification guideline and by acquiring the restriction item applied when the configuration modification of the circuit board is performed from a restriction item database, wherein the circuit board is fabricated from the design information thereof as modified in accordance with the configuration modification.

13. The board design method according to claim 12, further comprising:

extracting parameters necessary to derive an EMI characteristic from the design information when deriving the EMI characteristic radiated from the cable; and calculating the EMI characteristic using the extracted parameters.

14. The board design method according to claim 12, further comprising:

creating an electromagnetic field analysis model of the circuit board to derive an EMI characteristic from the design information when deriving the EMI characteristic radiated from the cable; and deriving the EMI characteristic by applying electromagnetic field analysis to the created electromagnetic field analysis model.

15. The board design method according to claim 12, further comprising:

calculating an EMI characteristic using parameters by extracting the parameters necessary to derive the EMI characteristic from the design information when deriving the EMI characteristic radiated from the cable; and deriving the EMI characteristic by applying electromagnetic field analysis to an electromagnetic field analysis model by creating the electromagnetic field analysis model of the circuit board to derive the EMI characteristic from the design information.

16. The board design method according to claim 12, further comprising: determining design information after configuration modification as modified design information by performing a configuration modification of the circuit board in accordance with the modification guideline in a range allowed by the restriction item when it is determined that the EMI characteristic does not satisfy the EMI tolerance condition in the step of determining whether the EMI characteristic satisfies the EMI tolerance condition; deriving an EMI characteristic after modification as a modified EMI characteristic using the modified design information; and outputting the modified EMI characteristic and the modified design information.

17. The board design method according to claim 16, further comprising modifying an internal layering rate of a wiring in the circuit board when deriving the EMI characteristic after modification as a modified EMI characteristic using the modified design information.

18. The board design method according to claim 16, further comprising:

acquiring an additional modification guideline and an additional improvement effect from an additional countermeasure database when the modified EMI characteristic is determined not to satisfy the EMI tolerance condition, upon performing the configuration modification of the board in accordance with the modification guideline and the restriction item;

determining additionally modified design information by additionally modifying the configuration of the circuit board in accordance with the additional modification guideline in the range allowed by the restriction item; and deriving an added EMI characteristic using the additionally modified design information.

19. The board design method according to claim 18, further comprising:

modifying the configuration of the circuit board and designating information regarding a board configuration after additional modification as the additionally modified design information.

20. The board design method according to claim 19, further comprising:

modifying a wiring configuration of a wiring disposed in the circuit board;

modifying a characteristic of a signal source of the circuit board; adding a countermeasure component to the circuit board; and modifying a configuration of the cable connected to the circuit board.

* * * * *